US007335611B2

(12) United States Patent
Ramaswamy et al.

(10) Patent No.: US 7,335,611 B2
(45) Date of Patent: Feb. 26, 2008

(54) COPPER CONDUCTOR ANNEALING PROCESS EMPLOYING HIGH SPEED OPTICAL ANNEALING WITH A LOW TEMPERATURE-DEPOSITED OPTICAL ABSORBER LAYER

(75) Inventors: Kartik Ramaswamy, San Jose, CA (US); Hiroji Hanawa, Sunnyvale, CA (US); Biagio Gallo, Los Gatos, CA (US); Kenneth S. Collins, San Jose, CA (US); Kai Ma, Mountain View, CA (US); Vijay Parihar, Fremont, CA (US); Dean Jennings, Beverly, MA (US); Abhilash J. Mayur, Salinas, CA (US); Amir Al-Bayati, San Jose, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 359 days.

(21) Appl. No.: 11/199,572

(22) Filed: Aug. 8, 2005

(65) Prior Publication Data

US 2007/0032095 A1  Feb. 8, 2007

(51) Int. Cl.
*H01L 21/4763* (2006.01)
*H01L 21/00* (2006.01)
(52) U.S. Cl. ............... 438/795; 438/627; 257/E21.021
(58) Field of Classification Search ..................... None
See application file for complete search history.

(56) References Cited

U.S. PATENT DOCUMENTS 2,344,138 A    3/1944  Drummond  .................. 117/107

(Continued)

FOREIGN PATENT DOCUMENTS

EP    0 546 852 A1    6/1993

(Continued)

OTHER PUBLICATIONS

Callegari, A., et al., "DUV Stability of Carbon Films for Attenuated Phase Shift Mask Applications", Proceedings of the SPIE, Feb. 1998, vol. 3334, pp. 406-411, Virginia, U.S.A.

(Continued)

*Primary Examiner*—Scott B. Geyer
*Assistant Examiner*—Seahvosh Nikmanesh
(74) *Attorney, Agent, or Firm*—Law Office of Robert M. Wallace

(57) ABSTRACT

A method of forming a conductor in a thin film structure on a semiconductor substrate includes forming high aspect ratio openings in a base layer having vertical side walls, depositing a dielectric barrier layer comprising a dielectric compound of a barrier metal on the surfaces of the high aspect ratio openings including the vertical side walls, depositing a metal barrier layer comprising the barrier metal on the first barrier layer, depositing a main conductor species seed layer on the metal barrier layer and depositing a main conductor layer. The method further includes annealing the main conductor layer by (a) directing light from an array of continuous wave lasers into a line of light extending at least partially across the thin film structure, and (b) translating the line of light relative to the thin film structure in a direction transverse to the line of light. The method of Claim 1 further comprising, prior to the annealing step, depositing an amorphous carbon optical absorber layer on the main conductor layer. The step of depositing an amorphous carbon optical absorber layer includes introducing a carbon-containing process gas into a reactor chamber containing the substrate in a process zone of the reactor, applying RF source power to an external reentrant conduit of the reactor to generate a reentrant toroidal RF plasma current passing through the process zone and applying a bias voltage to the substrate.

20 Claims, 31 Drawing Sheets

U.S. PATENT DOCUMENTS

| | | | |
|---|---|---|---|
| 3,109,100 A | 10/1963 | Gecewicz | 250/219 |
| 3,576,685 A | 4/1971 | Swann et al. | 148/187 |
| 3,907,616 A | 9/1975 | Wiemer | 148/188 |
| 4,116,791 A | 9/1978 | Zega | 204/192 |
| 4,382,099 A | 5/1983 | Legge et al. | 427/34 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,584,026 A | 4/1986 | Wu et al. | 148/1.5 |
| 4,698,104 A | 10/1987 | Barker et al. | |
| 4,764,394 A | 8/1988 | Conrad | 427/38 |
| 4,778,561 A | 10/1988 | Ghanbari | 156/643 |
| 4,867,859 A | 9/1989 | Harada et al. | 304/298 |
| 4,871,421 A | 10/1989 | Ogle et al. | 156/643 |
| 4,892,753 A | 1/1990 | Weng et al. | 427/38 |
| 4,912,065 A | 3/1990 | Mizuno et al. | |
| 4,937,205 A | 6/1990 | Nakayama et al. | |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,270,250 A | 12/1993 | Murai et al. | |
| 5,277,751 A | 1/1994 | Ogle | 156/643 |
| 5,288,650 A | 2/1994 | Sandow | |
| 5,290,382 A | 3/1994 | Zarowin et al. | 156/345 |
| 5,290,731 A | 3/1994 | Sugano et al. | |
| 5,312,778 A | 5/1994 | Collins et al. | |
| 5,354,381 A | 10/1994 | Sheng | 118/723 |
| 5,423,945 A | 6/1995 | Marks et al. | 156/662.1 |
| 5,435,881 A | 7/1995 | Ogle | 156/345 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | |
| 5,520,209 A | 5/1996 | Goins et al. | 137/246 |
| 5,542,559 A | 8/1996 | Kawakami et al. | 216/67 |
| 5,561,072 A | 10/1996 | Saito | |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | |
| 5,646,050 A | 7/1997 | Li et al. | |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,723,367 A | 3/1998 | Wada et al. | |
| 5,770,982 A | 6/1998 | Moore | 333/32 |
| 5,888,413 A | 3/1999 | Okumura et al. | 216/68 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'Ko | 315/11.51 |
| 6,000,360 A | 12/1999 | Koshimuzu | 118/723 |
| 6,013,567 A | 1/2000 | Henley et al. | 438/515 |
| 6,020,592 A | 2/2000 | Liebert et al. | 250/492.21 |
| 6,041,735 A | 3/2000 | Murzin et al. | 118/723 |
| 6,050,218 A | 4/2000 | Chen et al. | 118/723 |
| 6,076,483 A | 6/2000 | Shintani et al. | 118/723 |
| 6,096,661 A | 8/2000 | Ngo et al. | 438/788 |
| 6,101,971 A | 8/2000 | Denholm et al. | 118/723 |
| 6,103,599 A | 8/2000 | Henley et al. | 438/459 |
| 6,103,624 A | 8/2000 | Nogami et al. | 438/687 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,182,604 B1 | 2/2001 | Goeckner et al. | 118/723 |
| 6,187,110 B1 | 2/2001 | Henley et al. | 148/33.2 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Donlan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Dolan et al. | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanwa et al. | 156/345 |
| 6,350,697 B1 | 2/2002 | Richardson et al. | 438/710 |
| 6,392,351 B1 | 5/2002 | Shun'Ko | 315/111.51 |
| 6,395,150 B1 | 5/2002 | Can Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,433,553 B1 | 8/2002 | Goeckner et al. | 324/464 |
| 6,453,842 B1 | 9/2002 | Hanawa et al. | 118/723 |
| 6,461,972 B1 | 10/2002 | Kabansky | 438/710 |
| 6,468,388 B1 | 10/2002 | Hanawa et al. | 156/345.48 |
| 6,475,888 B1 | 11/2002 | Sohn | 438/535 |
| 6,494,986 B1 | 12/2002 | Hanawa et al. | 156/345.35 |
| 6,511,899 B1 | 1/2003 | Henley et al. | 438/515 |
| 6,513,538 B2 | 2/2003 | Chung et al. | 134/1.2 |
| 6,514,838 B2 | 2/2003 | Chan | 438/513 |
| 6,528,391 B1 | 3/2003 | Henley et al. | 438/459 |
| 6,551,446 B1 | 4/2003 | Hanwa et al. | 156/345.48 |
| 6,559,408 B2 | 5/2003 | Smith et al. | 219/121.57 |
| 6,579,805 B1 | 6/2003 | Bar-Gadda | 438/710 |
| 6,582,999 B2 | 6/2003 | Henley et al. | 438/221 |
| 6,593,173 B1 | 7/2003 | Anc et al. | 438/149 |
| 6,664,187 B1 | 12/2003 | Ngo et al. | 438/687 |
| 6,679,981 B1 | 1/2004 | Pan et al. | 204/298.06 |
| 6,800,559 B2 | 10/2004 | Bar-Gadda | 438/710 |
| 6,811,448 B1 | 11/2004 | Paton et al. | 439/706 |
| 6,838,695 B2 | 1/2005 | Doris et al. | 257/55 |
| 6,841,341 B2 | 1/2005 | Fairbairn et al. | 430/323 |
| 7,097,779 B2 | 8/2006 | Mosden et al. | 216/37 |
| 7,109,087 B2 | 9/2006 | Autryve et al. | 438/308 |
| 7,115,993 B2 | 10/2006 | Wetzel et al. | 257/758 |
| 2001/0042827 A1 | 11/2001 | Fang et al. | |
| 2002/0047543 A1 | 4/2002 | Sugai et al. | 315/111.21 |
| 2003/0013260 A1 | 1/2003 | Gossman et al. | 438/301 |
| 2003/0013314 A1 | 1/2003 | Ying et al. | 438/302 |
| 2003/0085205 A1 | 5/2003 | Lai et al. | 219/121.43 |

| | | | | |
|---|---|---|---|---|
| 2003/0186524 A1 | 10/2003 | Ryo ............................ 438/597 |
| 2003/0196996 A1 | 10/2003 | Jennings et al. ....... 219/121.73 |
| 2004/0104481 A1 | 6/2004 | Ong ............................ 257/758 |
| 2004/0200417 A1 | 10/2004 | Hanawa et al. ............. 118/723 |
| 2004/0229050 A1 | 11/2004 | Li et al. ...................... 428/447 |
| 2004/0253839 A1 | 12/2004 | Shimizu et al. ............. 438/795 |
| 2005/0074956 A1 | 4/2005 | Autryve et al. ............. 438/530 |
| 2005/0167394 A1 | 8/2005 | Liu et al. ...................... 216/41 |
| 2006/0019039 A1 | 1/2006 | Hanawa et al. ............. 427/523 |
| 2006/0019477 A1 | 1/2006 | Hanawa et al. ............. 438/514 |
| 2006/0234458 A1 | 10/2006 | Jennings et al. ............ 438/308 |

FOREIGN PATENT DOCUMENTS

| | | |
|---|---|---|
| EP | 0 836 218 A2 | 4/1998 |
| EP | 0 964 074 A2 | 12/1999 |
| EP | 1 111 084 A1 | 6/2001 |
| EP | 1 158 071 A2 | 11/2001 |
| EP | 1154468 A2 | 11/2001 |
| EP | 1 191 121 A1 | 3/2002 |
| JP | 59-86214 | 5/1984 |
| JP | 59-218728 | 12/1984 |
| JP | 62-120041 | 6/1987 |
| JP | 070455542 | 2/1995 |
| JP | 63172158 A | 7/1998 |
| JP | 2000150908 | 5/2000 |
| WO | WO 99/00832 | 1/1999 |
| WO | WO 01/11650 A1 | 2/2001 |
| WO | WO 01/73769 A1 | 10/2001 |
| WO | WO 02/25694 A2 | 3/2002 |
| WO | WO 93/18201 | 9/2003 |
| WO | WO 03/090257 A1 | 10/2003 |
| WO | WO 2004008520 | 1/2004 |
| WO | WO 2005024922 | 3/2005 |
| WO | WO 2005/036627 A1 | 4/2005 |

OTHER PUBLICATIONS

Wei Liu, et al., "Generating Sub-30nm Poly-Silicon Gates Using PECVD Amorphous Carbon as Hardmask and Anti-Reflective Coating", 2003 SPIE Proceedings Aug. 3-8, 2003, Optical Microlithography, pp. 841-848.

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

Wolf, Stanley and Taubner, Richard, "Silicon Processing for the VLSI Era", 2000, Lattice Press, Viol. 1, pp. 303-308.

Zhang, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, filed Aug. 11, 2000, entitled, "Externally Excited Torroidal Plasma Source," By Hanwa, et al.

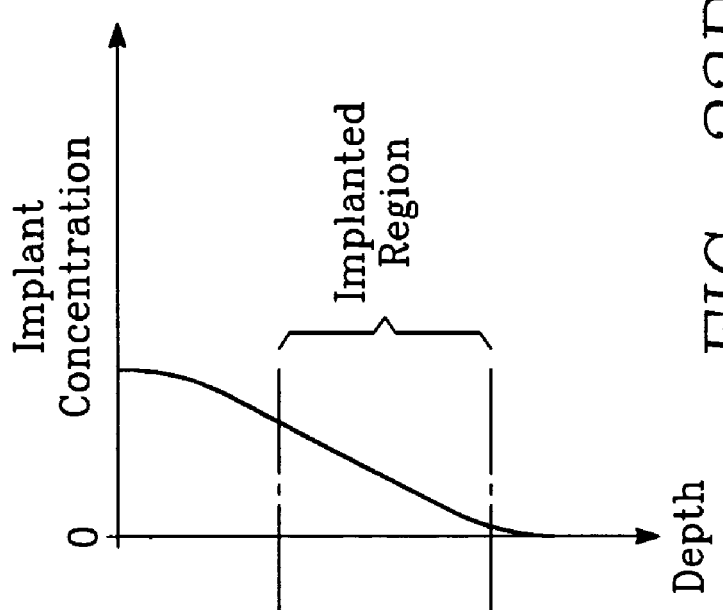
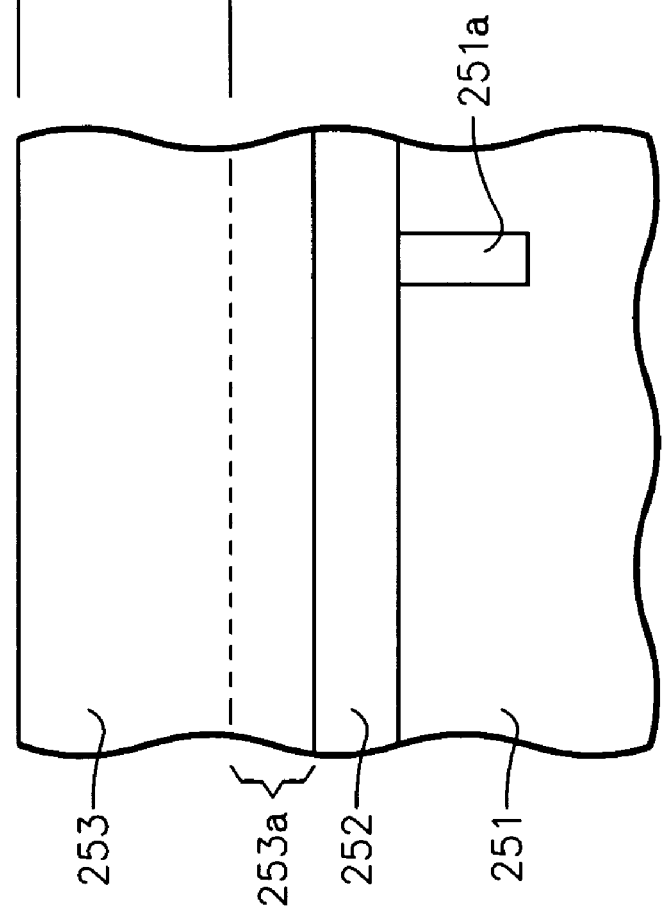
FIG. 23B
FIG. 23A

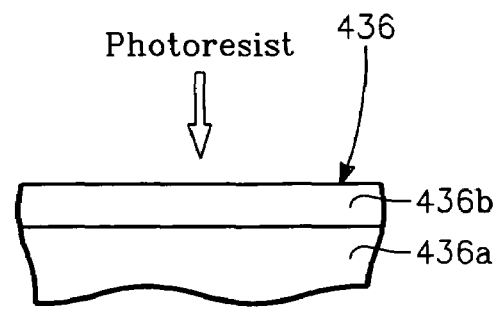
FIG. 39A
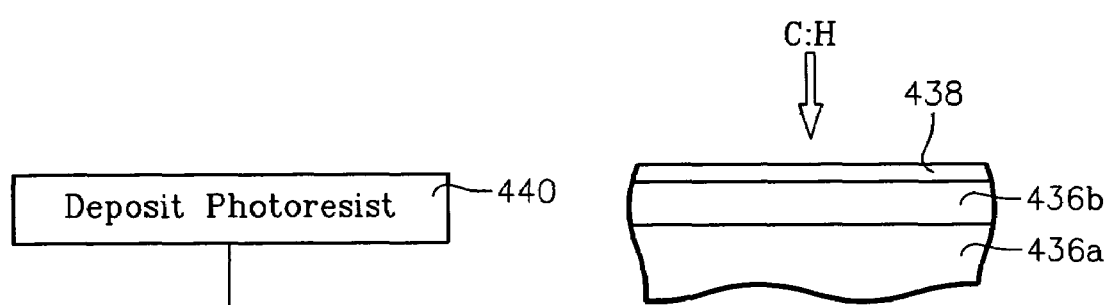
FIG. 39B
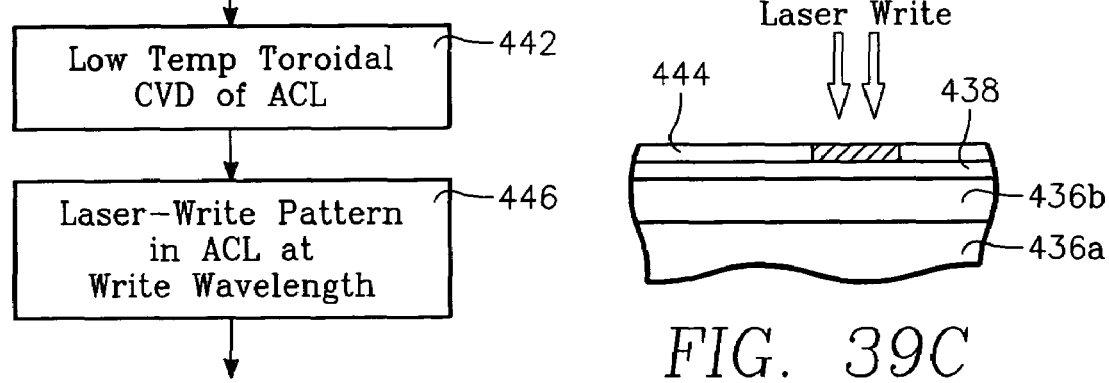
FIG. 38A
FIG. 39C

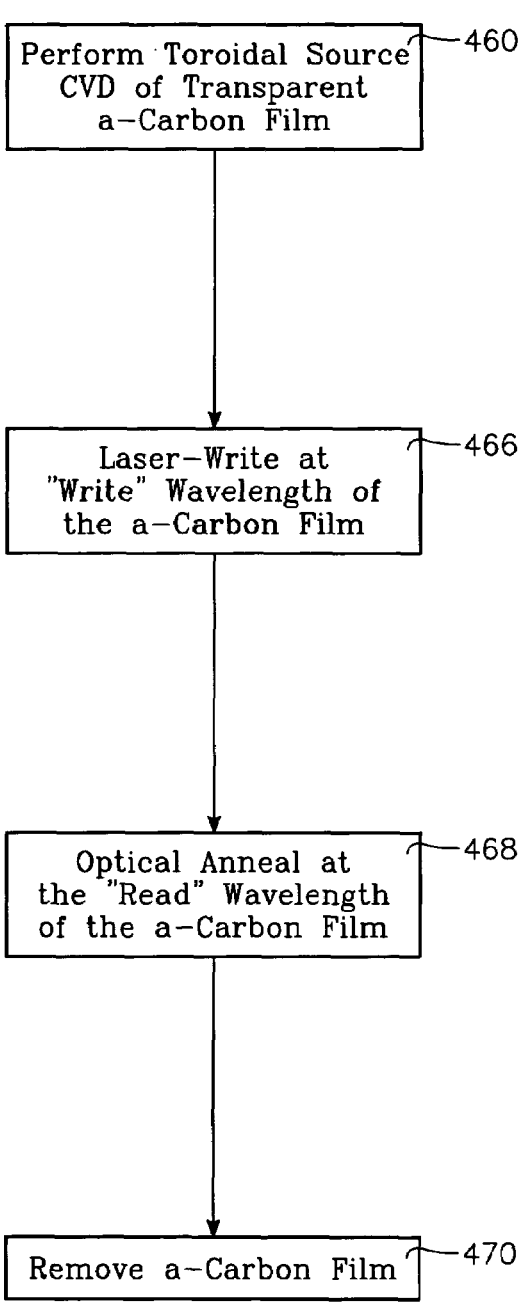
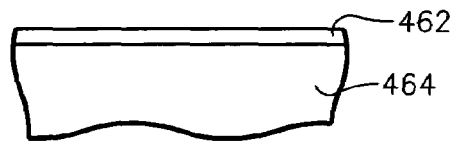
FIG. 41A
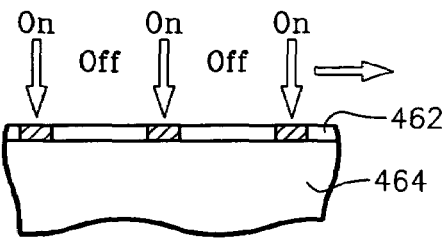
FIG. 41B
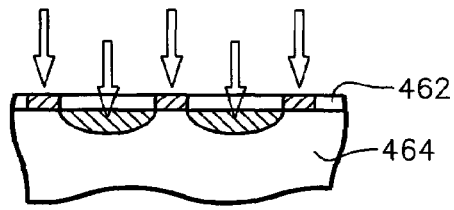
FIG. 41C
FIG. 40
FIG. 41D

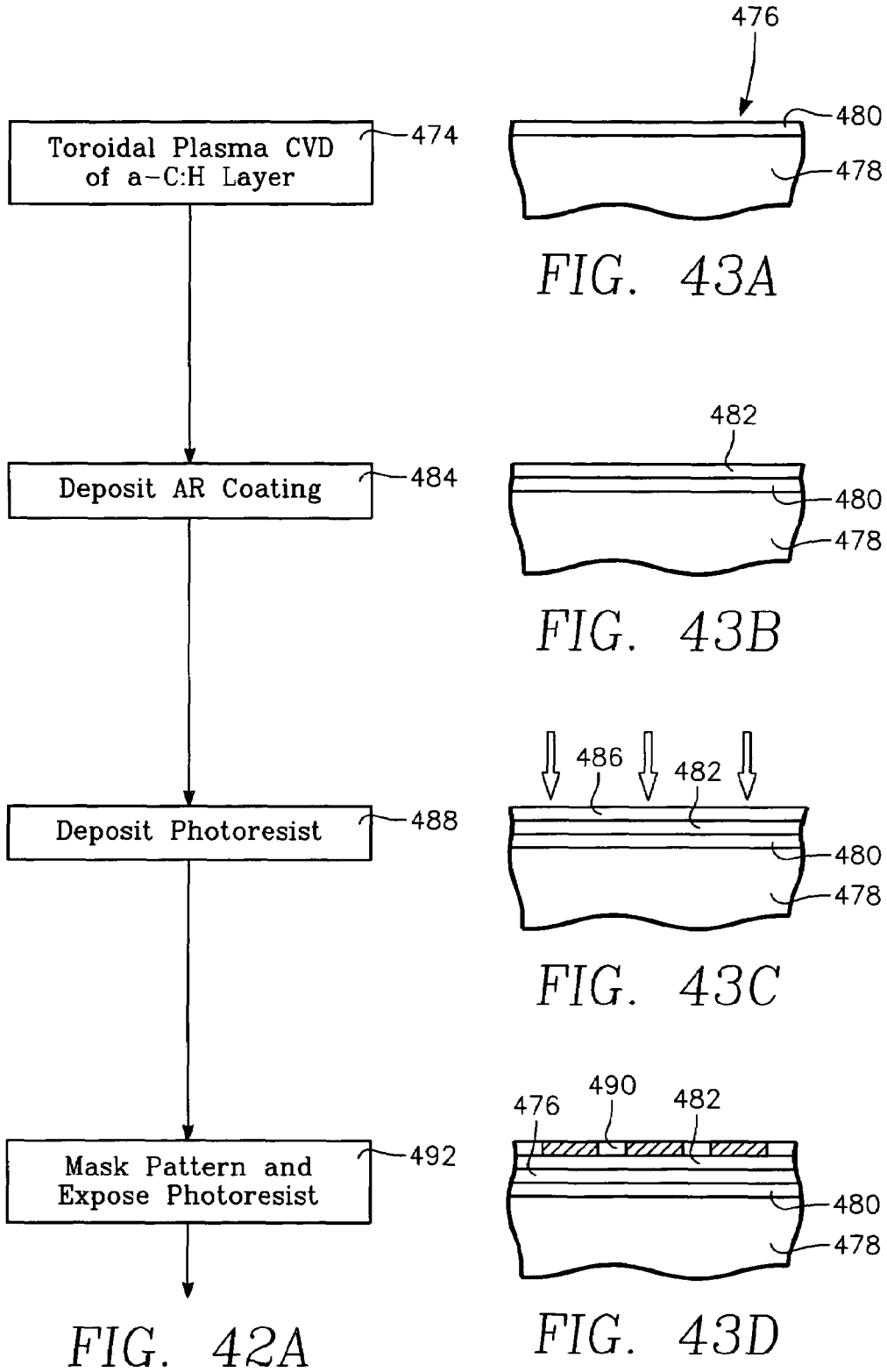

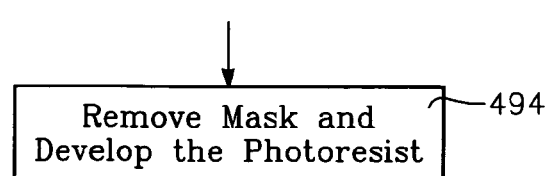
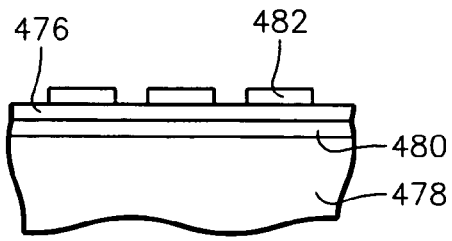
FIG. 43E
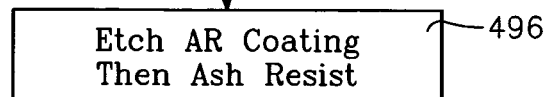
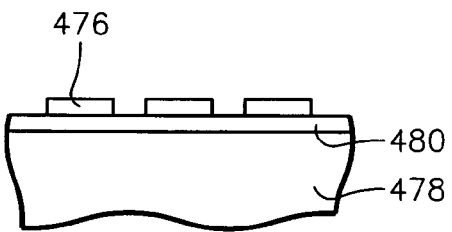
FIG. 43F
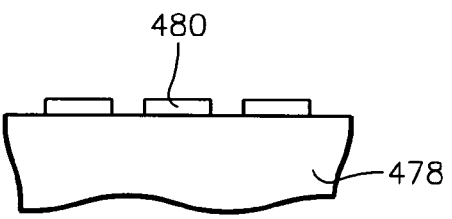
FIG. 43G
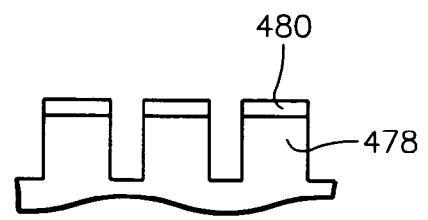
FIG. 42B
FIG. 43H

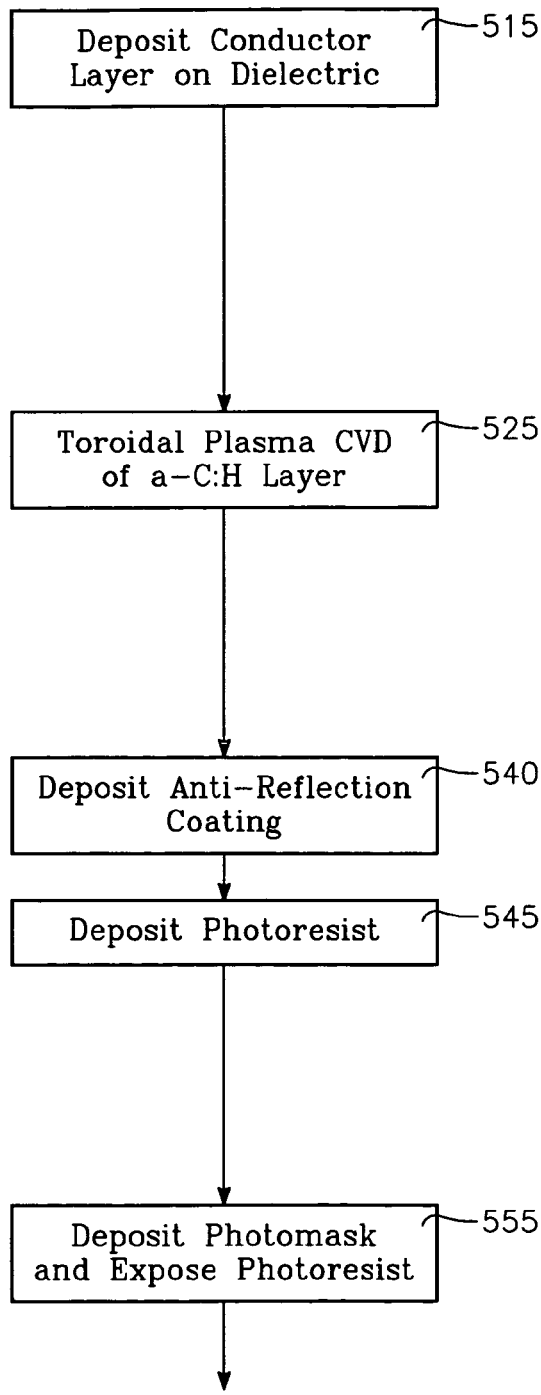
FIG. 45A
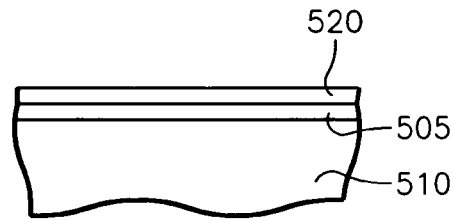
FIG. 45B
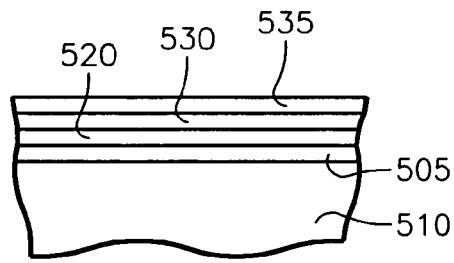
FIG. 45C
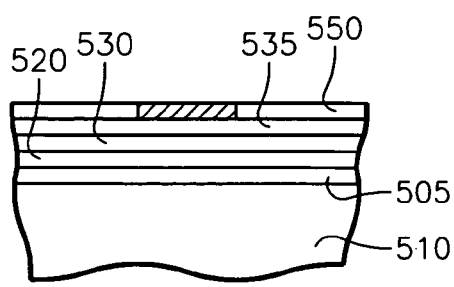
FIG. 45D
FIG. 44A

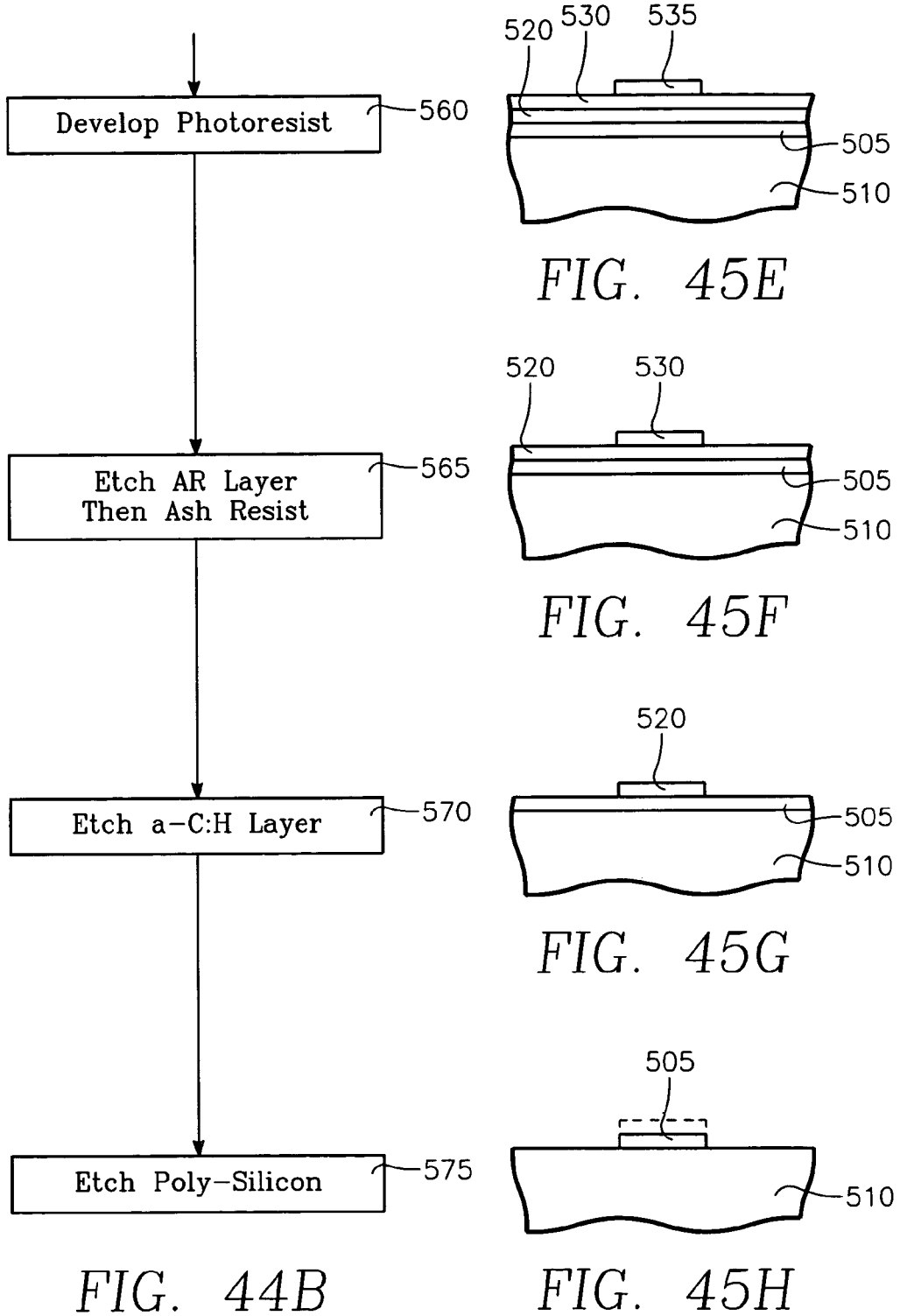

COPPER CONDUCTOR ANNEALING PROCESS EMPLOYING HIGH SPEED OPTICAL ANNEALING WITH A LOW TEMPERATURE-DEPOSITED OPTICAL ABSORBER LAYER

BACKGROUND OF THE INVENTION

High speed integrated circuits formed on a crystalline semiconductor wafer have ultra shallow semiconductor junctions formed by ion implanting dopant impurities into source and drain regions. The implanted dopant impurities are activated by a high temperature anneal step which causes a large proportion of the implanted atoms to become substitutional in the crystalline semiconductor lattice. Such a post-ion implantation anneal step are done by a rapid thermal process (RTP)-employing powerful lamps that heat the entire wafer volume to a very high temperature for a short time (e.g., a rate-of-rise of about 100-200 degrees C. per second and an initial rate-of-fall of 50-100 degrees C. per second). The heating duration must be short to avoid degrading the implanted junction definition by thermally induced diffusion of the dopant impurities from their implanted locations in the semiconductor wafer. This RTP approach is a great improvement over the older post-ion implant anneal technique of heating the wafer in a furnace for a long period of time. RTP using lamps is effective because the time response of the heat source (the lamp filament) is short in contrast to the furnace annealing step in which the heater response time is very slow. The high temperature, short duration heating of the RTP method favors the activation of implanted impurities while minimizing thermally induced diffusion.

An improved anneal is done by a flash lamp anneal process employing powerful flash lamps that heat the surface (only) of the entire wafer to a very high temperature for a very short time (e.g., a few milliseconds). The heating duration must be short to avoid degrading the implanted junction definition by thermally induced diffusion of the dopant impurities from their implanted locations in the semiconductor wafer. This flash approach is an improvement over the RTP approach, because the bulk of the wafer acts as a heat sink and permits rapid cooling of the hot wafer surface. High speed anneal using flashlamps is more effective because the heating is confined to the surface of the wafer, in contrast to the RTP annealing step in which the entire volume of the wafer is heated to approximately the same anneal temperature. The short duration at high temperature of the flash method minimizes thermally induced diffusion. However, it is difficult to achieve thermal uniformity over the entire wafer. Greater thermal non-uniformity within wafer creates significant amount of mechanical stress, resulting in wafer breakage and limits the highest operating temperature to approximately 1150° C. for anneal using flash lamps. The surface temperature during flashlamp annealing is determined by the intensity and pulse duration of flashlamps, which are difficult to control in a repeatable manner from one wafer to the next.

One problem with RTP is that as device size decreases to 65 nanometers (nm) and below, the minimal thermal diffusion caused by RTP or flash heating becomes significant relative to the device size, despite the short duration of the RTP or flash heating. Another problem is that the degree of activation of the implanted dopant impurities is limited by the maximum temperature of the RTP or flash process. Heating the entire wafer volume in the RTP process above the maximum temperature (e.g., 1100 degrees C.) can create mechanical stresses in the wafer that cause lattice defects and wafer breakage in extreme cases. Limiting the wafer temperature to a maximum level (e.g., 1100 degrees C.) prevents such breakage, but unfortunately limits the proportion of implanted (dopant) atoms that are activated (i.e., that become substitutional in the semiconductor crystalline lattice). Limiting the dopant activation limits sheet conductivity and limits device speed. This problem becomes more significant as device size is reduced below 65 nm (e.g., down to 45 nm).

In order to raise the level of dopant activation beyond that achieved by RTP or flash annealing, laser annealing has been introduced as a replacement for RTP. One type of laser that has been used is a C02 laser having an emission wavelength of 10.6 microns. This laser produces a narrow cylindrical beam, which must be raster-scanned across the entire wafer surface. In order to decrease the surface reflectivity at 10.6 microns, the beam is held at an acute angle relative to the wafer surface. Since the CO2 laser wavelength corresponds to a photon energy less than the bandgap of silicon, the silicon must be pre-heated to populate the conduction band with free carriers in order to facilitate the absorption of 10.6 micron photons through free carrier absorption. A fundamental problem is that the absorption at 10.6 microns is pattern-dependent because it is affected by the dopant impurities (which among other factors, determines the local free carrier concentration), so that the wafer surface is not heated uniformly. Also, conductive or metallic features on the wafer are highly reflective at the 10.6 micron laser wavelength, so that this process may not be useful in the presence of conductive thin film features.

The post-implant anneal step has been performed with short wavelength pulsed lasers (the short wavelength corresponding to a photon energy greater than the bandgap of silicon). While the surface heating is extremely rapid and shallow, such pulsed lasers bring the semiconductor crystal to its melting point, and therefore the heating must be restricted to an extremely shallow depth, which reduces the usefulness of this approach. Typically, the depth of the heated region does not extend below the depth of the ultra-shallow junctions (about 200 Angstroms).

The foregoing problems have been overcome by employing an array of diode lasers whose multiple parallel beams are focused along a narrow line (e.g., about 300 microns wide) having a length on the order of the wafer diameter or radius. The diode lasers have a wavelength of about 810 nm. This wavelength corresponds to a photon energy in excess of the bandgap energy of the semiconductor crystal (silicon), so that the laser energy excites electron transitions between the valence and conduction bands, which subsequently release the absorbed energy to the lattice and raises the lattice temperature. The narrow laser beam line is scanned transversely across the entire wafer surface (e.g., at a rate of about 300 mm/sec), so that each point on the wafer surface is exposed for a very short time (e.g., about 1 millisec). This type of annealing is disclosed in United States Patent Publication No. US 2003/0196996A1 (Oct. 23, 2003) by Dean C. Jennings et al. The wafer is scanned much more quickly by the wide thin beam line than by the pencil-like beam of a single laser spot, so that productivity is much greater, approaching that of RTP. But, unlike RTP, only a small portion of the wafer surface is heated, so that the stress is relieved in the remaining (bulk) portion of the wafer, allowing the peak temperature to be increased above the maximum RTP temperature (e.g., to about 1250-1300 degrees C). The entire wafer volume may also be preheated during the laser scanning anneal in order to improve the annealing characteristics. The maximum preheated temperature is dictated by the technology nodes, process requirements, compatibility with semiconductor materials, etc. As a result, dopant activation is much higher, so that sheet resistivity is lower and device speed is higher. Each region of the wafer surface reaches a temperature range of about 1250-1300 degrees C. for about 50 microsec. The depth of this region is about 10-20 microns. This extends well-below the ultra-shallow semiconductor junction depth of about 200 Angstroms.

The wafer surface must be heated above a minimum temperature (e.g., 1250 degrees C.) in order to achieve the desired degree of activation of the implanted (dopant) atoms. The elevated temperature is also required to anneal other lattice damage and defects caused by any preceeding implant or thermal steps, in order to improve the electrical characteristics of the junctions such as their electrical conductivity and leakage. The wafer surface must be kept below a maximum temperature (e.g., 1350 degrees C.) in order to avoid the melting temperature of the semiconductor crystal (e.g., crystalline or polycrystalline silicon). In order to uniformly heat the entire wafer surface within this desired temperature range, the optical absorption of the wafer surface must be uniform across the wafer, and the surface temperature in the illuminated portion of the wafer surface must be accurately monitored while the laser beam line is scanned across the wafer (to enable precise temperature control). This is accomplished by measuring the emission of light by the heated portion of the wafer surface (usually of a wavelength different from that of the laser light source), and the measurement must be uniformly accurate. As employed in this specification, the term "optical" is meant to refer to any wavelength of a light or electromagnetic radiation emitted from a light source (such as a laser) that is infrared or visible or ultraviolet or emitted from the heated wafer surface.

The problem is that the underlying thin film structures formed on the wafer surface present different optical absorption characteristics and different optical emissivities in different locations on the wafer surface. This makes it difficult if not impossible to attain uniform anneal temperatures across the wafer surface and uniformly accurate temperature measurements across the wafer surface. This problem can be solved by depositing a uniform optical absorption layer over the entire wafer surface that uniformly absorbs the laser radiation and then conducts the heat to the underlying semiconductor wafer. Such a film must withstand the stress of heating during the laser anneal step without damage or separation, and must be selectively removable after the laser anneal step with respect to underlayers and must not contaminate or damage the underlying semiconductor wafer or thin film features. Further, the absorber film must attain excellent step coverage (high degree of conformality) over the underlying thin film features. One advantage of such a film is that lateral heat conduction in the film can mask non-uniformities in the light beam. This approach has been attempted but has been plagued by problems. One type of absorber layer consists of alternating metal and dielectric layers that form an anti-reflective coating. The different layers in this type of absorber material tend to fuse together under the intense heat of the laser beam, and become difficult to remove following the laser anneal step or contaminate underlying layers with metal.

A better approach used in the present invention is to employ an absorber layer that can be deposited by plasma enhanced chemical vapor deposition (PECVD). As disclosed in U.S. patent application Ser. No. 10/679,189 filed Oct. 3, 2003 by Luc Van Autryve et al. entitled "Absorber Layer for DSA Processing" and assigned to the present assignee, the PECVD-deposited absorber layer may be amorphous carbon. One advantage of amorphous carbon is that it is readily and selectively (with respect to underlayers of other materials) removed by oxidation in a plasma process or a downstream oxidation process employing radicals, at a wafer temperature less than 400 C. Another advantage is that carbon is generally compatible with semiconductor plasma processes and therefore does not involve contamination, so long as excessive implantation does not occur. One problem is that the deposited layer is vulnerable to cracking or peeling under the high temperatures of the laser anneal step, unless the layer is deposited at a very high temperature (e.g., 550 degrees C.). (The tendency or resistance to such cracking, peeling or separation of the deposited layer from the underlying layer in response to high temperature or high temperature gradients is generally referred to in this specification as the thermal or thermal-mechanical properties of the deposited layer.) Also the thermal budget (time and temperature) associated with this PECVD deposition process caused dopants to form clusters which are difficult to dissolve with the subsequent laser anneal step, particularly for feature sizes below 65 nm (such as feature sizes of about 45 nm). Attempting to solve this problem by reducing the wafer temperature (e.g., to 400 degrees C.) during PECVD deposition of the absorber layer material creates two problems. First, the thermal properties of the deposited layer are such that it will fail (by cracking, peeling or separation from the wafer) during the laser annealing step. Secondly, the deposited layer that is produced is transparent or has insufficient optical absorption. Another problem encountered with this absorber layer is that it has poor step coverage. We have observed that the PECVD 550 degree absorber layer can have very large voids in the vicinity of pronounced steps in the underlying layer or thin film structures sizes below 65 nm.

We feel that failure of the absorber layer (e.g., by peeling or cracking) arises from a lack of high quality chemical bonds (between the underlying layer and the deposited material) capable of withstanding the stress of being rapidly heated to 1300 degrees C. during the laser anneal step. We feel that, in order to improve the thermal properties of the deposited layer, achieving such high quality bonds at low wafer temperature requires high ion energies during the PECVD process. Such high ion energies are not readily attainable in conventional PECVD reactors. We feel that poor step coverage by the absorber layer or amorphous carbon layer is the result of the inability of a conventional PECVD or HDPCVD reactor to provide an intermediate range of ionization (ion-to-radical ratio) with an adequate level of energetic ion bombardment. These inadequacies arise, in part, because such conventional PECVD and HDPCVD reactors cannot operate within a wide intermediate range of source power coupling (to generate plasma electrons), chamber pressure and wafer voltage. Indeed, the different types of conventional PECVD and HDPCVD reactors tend to operate at either very high or very low ranges of source power coupling (to generate plasma electrons), chamber pressure and wafer voltage. Conventional PECVD reactors employ capacitively-coupled RF source power at relatively high-pressure, resulting in a very low range of ionization (ion-to-radical ratio) with an inadequate level of energetic ion bombardment (and no separate control of voltage or energy). This is due to the inefficient source power coupling (to generate plasma electrons) and the damping of ion energies by collisions with neutrals at high pressure. Even if separate RF biasing of the wafer is added, the damping of ion energies by collisions with neutrals at high pressure limits the voltage and energy range to a low range. Conversely, conventional HDPCVD reactors typically employ inductively-coupled RF source power at very low pressure. This type of plasma source typically initiates the plasma capacitively, and then has a high power threshold to transition to inductively coupled power mode. Once the power coupled is above this threshold and the source is operating in an inductive mode, the source power coupling is highly efficient and the minimum possible plasma density and range of ionization (ion-to-radical ratio) is very high. The separate RF wafer bias is coupled to the relatively dense plasma, which presents a very low electrical impedance load. The resultant RF bias power required to produce energetic ion bombardment is very high (>>10 kW for >2 kV). High energies are not generally attainable due to practical RF delivery system limitations (RF generators, matching networks, and feed structures). Most of the bias power (e.g., ~80%) is dissipated as heat on the wafer. It is very difficult to remove the heat at low pressure at an adequate rate to maintain low wafer temperature (<400 deg. C. or lower). Finally, both capacitively-coupled PECVD and inductively-coupled HDPCVD reactors may have power coupling drift (with on-time) issues when used with carbon chemistry when depositing absorbing or semiconducting films (on RF windows or insulators). The need (fulfilled by the toroidal plasma CVD reactor and process described in detail below) is for a reactor capable of providing ionization ratios in a wide intermediate range together with an adequate level of energetic ion bombardment in all cases, through an ability to operate in a wide intermediate range of source power coupling and level, wafer voltage and chamber pressure. The toroidal plasma CVD reactor does not exhibit power coupling drift when used with carbon chemistry when depositing absorbing or semiconducting films. This is because the toroidal plasma CVD reactor is already conducting (metal), having only very thin, isolated DC breaks, which do not accumulate much deposition and are easily in-situ plasma cleaned.

One type of conventional PECVD reactor is a capacitively coupled plasma reactor having a pair of closely-spaced parallel plate electrodes across which RF plasma source power is applied. Such a capacitively coupled reactor typically is operated at high chamber pressure (2-10 Torr). High pressure and close-spacing (relative to electrode radius) are employed to maximize deposition rate on the wafer, and to minimize deposition outside the process region. The plasma source power couples to both electrons in the bulk plasma and to ions in the plasma sheaths. The voltage across the electrodes is typically relatively low (less than 1 KVpp at source power of several kW for 300 mm wafer) and the plasma sheath is very collisional, so that the ion energy is typically low. This type of reactor produces a very low ion-to-neutral population ratio and ion-to-radical ratio, so that the ion flux is low, which probably increases the ion energy level or wafer temperature required to obtain the requisite high quality bonds between the deposited and underlying materials. However, because of the low interelectrode voltage and the high loss of ion energy in the collisional sheath, it is very difficult to generate the ion energy distribution required for high quality bonds.

Another type of conventional PECVD reactor is an inductively coupled high plasma density CVD (HPDCVD) reactor in which RF source power is applied to an inductive antenna. The reactor must be operated at a low chamber pressure (e.g., 5-10 milliTorr) and high plasma source power level, because of the high minimum induced electric field required to maintain the inductively coupled plasma mode, which in turn produces a high plasma density. The degree of ionization (ratio of ion-to-neutral density) produced in this reactor is confined to a range of very high values (four or five orders of magnitude greater than that of the capacitive reactor discussed above), because a large amount of RF source power is required to sustain the inductively coupled mode and because the RF induced electric field couples directly to electrons in the bulk plasma. This contrasts with a capacitively coupled plasma in which the RF electric field less efficiently couples to electrons indirectly by displacement across the plasma sheath or through plasma sheath oscillations. As a result, plasma density and conductivity is very high, making it difficult to generate a high wafer voltage at practical bias power levels (since the wafer voltage is loaded down through the highly conductive plasma). As a result, high ion energies cannot be attained without applying excessive amounts of RF bias power to the wafer. This could overheat the wafer and perhaps destroy the ultra shallow junction definition in the underlying semiconductor crystal lattice (by thermal diffusion). Typically, for a 300 mm wafer, a wafer voltage of 1-2 kV peak-to-peak would require RF bias power of about 10 kWatts. Cooling the wafer to maintain ultra-shallow junction definition is difficult at high bias power, and even higher bias voltage (than 1-2 kV) and thus higher power is desired for best film properties. RF power delivery systems >10 kW are very expensive and have limited availability.

Another problem with the HDPCVD reactor is that a large non-conductive window must be provided in the chamber ceiling through which the plasma source power may be inductively coupled from the coil antenna. This prevents the use of a conductive showerhead directly overlying the wafer, which limits gas distribution uniformity at the wafer and RF bias ground reference uniformity over the wafer. Moreover, coupling of source power into the chamber may be effectively reduced or even blocked if the reactor is employed to deposit a non-insulating material on the wafer, since that same material will also accumulate on the dielectric window during processing, creating a conductive shield or semiconductive attenuator to the RF power. The temperature of a non-conductive surface, such as the dielectric window of the HDPCVD reactor, cannot be effectively controlled, so that deposition during processing and post-process cleaning of the reactor interior is more difficult. A related problem in both types of reactors is that plasma source power seeks a ground return from any available conductive surface in the chamber, so that process control is hampered by electrical changes due to deposition of by-products on the chamber surfaces. With both dielectric and metallic materials constituting the chamber surfaces, removal of deposited plasma by-products after processing may be difficult or may involve undue wear of chamber parts. This may be circumvented by employing disposable shields or process kits to prevent deposition on chamber surfaces. However, such disposable shields cannot provide good RF ground reference nor be thermally controlled with any precision.

In summary, the conventional reactors are either confined to a narrow low chamber pressure window (in the case of the HDPCVD reactor) or a narrow high chamber pressure window (in the case of the capacitively coupled reactor). Neither chamber can achieve a high ion energy, either because the sheath is highly collisional (in the capacitively coupled reactor) or because the plasma is highly conductive (in the HDPCVD reactor). Also, they are confined to either a narrow high degree-of-ionization regime (the HDPCVD reactor) or a narrow low degree-of-ionization regime (the capacitively coupled reactor). Moreover, both types of reactors are susceptible to wide deviations in performance whenever they are used for deposition of non-insulating materials, since the accumulation of non-insulating materials across electrode boundaries in a capacitively coupled reactor or on the dielectric window of an inductively coupled reactor will distort or inhibit the coupling of RF source power into the chamber. What is needed is a deposition process carried out at a very low temperature (e.g., room temperature up to several hundred degrees C.) for forming an optical absorber layer having such high quality bonds with the underlying layers (including the semiconductor lattice) that it is impervious to mechanical failure or separation during the laser annealing step. The process should have a wide source power window, a wide degree-of-ionization window in an intermediate range, a wide wafer voltage (bias power) window with wide ion energy window, and a wide wafer temperature window.

SUMMARY OF THE INVENTION

A method of forming a conductor in a thin film structure on a semiconductor substrate includes forming high aspect ratio openings in a base layer having vertical side walls, depositing a dielectric barrier layer comprising a dielectric compound of a barrier metal on the surfaces of the high aspect ratio openings including the vertical side walls, depositing a metal barrier layer comprising the barrier metal on the first barrier layer, depositing a main conductor species seed layer on the metal barrier layer and depositing a main conductor layer. The method further includes annealing the main conductor layer by (a) directing light from an array of continuous wave lasers into a line of light extending at least partially across the thin film structure, and (b) translating the line of light relative to the thin film structure in a direction transverse to the line of light. The method of claim 1 further comprising, prior to the annealing step, depositing an amorphous carbon optical absorber layer on the main conductor layer. The step of depositing an amorphous carbon optical absorber layer includes introducing a carbon-containing process gas into a reactor chamber containing the substrate in a process zone of the reactor, applying RF source power to an external reentrant conduit of the reactor to generate a reentrant toroidal RF plasma current passing through the process zone and applying a bias voltage to the substrate.

BRIEF DESCRIPTION OF THE DRAWINGS

FIG. 23A is a cross-sectional view of a thin film structure formed in the process of FIG. 21.

FIG. 23B is a graph of ion implanted species concentration as a function of depth in the thin film structure of FIG. 23A.

FIGS. 38A through 38B depict a process flow for forming an optically writable mask.

FIGS. 39A through 39G illustrate successive changes in the thin film structure during the process of FIGS. 38A through 38B.

FIG. 40 depicts a process flow for forming an optical mask for an optical anneal process such as rapid thermal annealing.

FIGS. 41A through 41D depict successive changes in the thin film structure during the process of FIG. 40.

FIGS. 42A through 42B depict a process flow for forming a hardmask for an etch process.

FIGS. 43A through 43H depict successive changes in the thin film structure during the process of FIGS. 42A through 42B.

FIGS. 44A through 44B depict a process flow for forming a hardmask over a polysilicon feature for an etch process.

FIGS. 45A through 45H depict successive changes in the thin film structure during the process of FIGS. 44A through 44B.

DETAILED DESCRIPTION OF THE INVENTION

Figure 1:
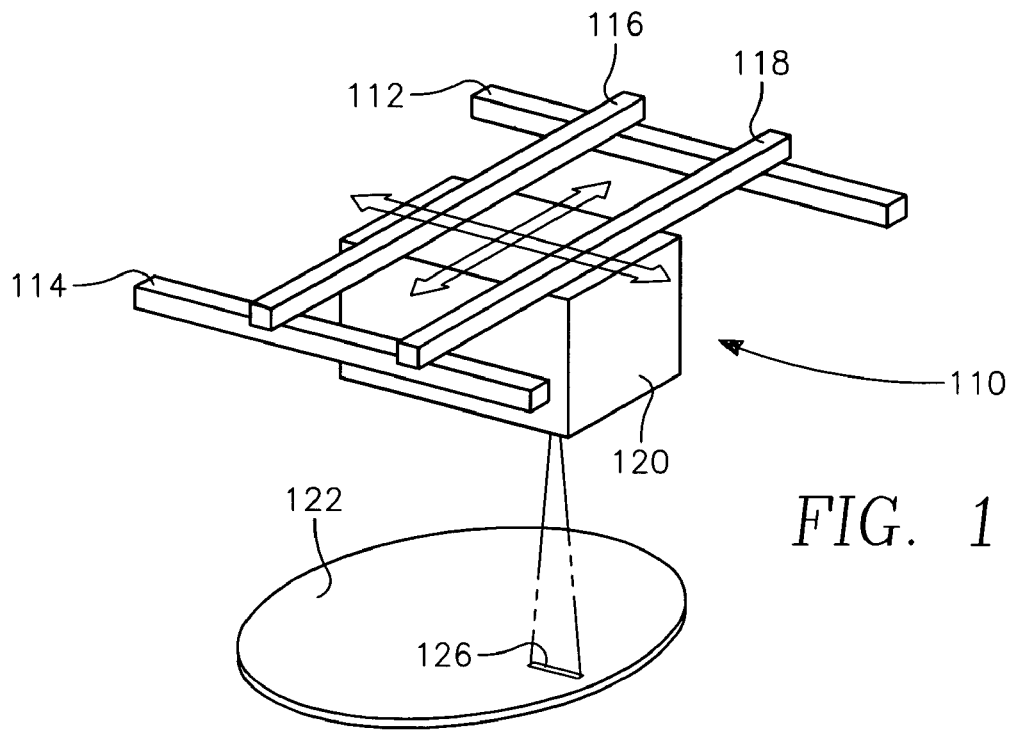
FIG. 1 illustrates a dynamic surface annealing apparatus.

Introduction:

All the problems mentioned above in the background discussion are solved by depositing the amorphous carbon optical absorber layer in a low temperature PECVD process employing a toroidal source plasma reactor. The toroidal source can be operated with a wide range of ion energy, unlike either the HDPCVD reactor or the capacitively coupled PECVD reactor. Thus, a moderate ion flux can be maintained along with a moderate (or high) ion energy, so that a high quality bond between the deposited layer and the underlying substrate or thin films is established without requiring elevated wafer temperatures. In fact, the wafer temperature may be as cool as room temperature (which minimizes any impact on the implanted ultra-shallow junctions such as recrystallization of an amorphous layer formed during the implant process, dopant cluster formation or thermal diffusion). As a result, the absorber layer formed by this process can withstand the laser beam exposure and extreme heating without separating from the wafer and without cracking. The wide bias power or bias voltage range over which the toroidal plasma source reactor may be operated enables the stress of the deposited layer to be selected within a very wide range, i.e., from tensile to compressive stress levels. The wide source power range over which toroidal plasma source reactor may be operated enables the conformality of the deposited layer to be precisely controlled, for example, to guarantee a high degree of conformality for excellent step coverage. The toroidal source plasma reactor may be operated over a much wider range of chamber pressure (e.g., 10-80 mT), so that ion density and plasma sheath collisionality may be controlled over a much wider range. Since a high ion density is not required, a high wafer voltage and high ion energy may be maintained with a relatively small amount of bias power (e.g., 7 kV wafer voltage with only 7 kW of bias power for a 300 mm wafer). The toroidal plasma source reactor does not require a dielectric window for coupling RF power from an inductive antenna into the chamber (and requires only a very thin dielectric "DC-break"), and therefore a conductive shower head may be placed at the ceiling. This feature provides the best uniformity of process gas distribution and a highly uniform low-impedance RF ground reference over the wafer. Because there is no requirement for a dielectric window for inductive coupling, virtually the entire chamber can be metal and therefore be thermally controlled to regulate deposition during processing and to expedite post-processing high temperature cleaning of the chamber surfaces. The toroidal plasma source generates a plasma with low potential and the toroidal plasma current requires no ground return through chamber surfaces, so the potential to cause a drift-current out of the process region is low and therefore there is little or no deposition on chamber surfaces outside of the processing zone. Another advantage of the lack of any need for a dielectric window in the toroidal plasma reactor is that the reactor may be employed to deposit non-insulating materials on the wafer without bad effects from accumulation of the non-insulating material on chamber interior surfaces.

The present invention concerns dynamic surface annealing of ultra-shallow junctions in a semiconductor wafer using an array of continuous wave (CW) diode lasers collimated and focused to a single knife-edge light beam. The knife-edge light beam is highly intense and is scanned across the wafer in a direction transverse to its length. The temperature is raised briefly (to nearly the melting point of silicon) in such a highly localized area about the beam, that its cooling is extremely rapid because of the small volume that is thus heated at any particular instant. This technology is described in United States Patent Application Publication No. US 2003/0196996 A1 by Dean C. Jennings et al., published Oct. 23, 2003 (hereinafter referred to as Publication A). At extremely small feature sizes (e.g., 45 nm), it is difficult to heat the wafer uniformly due to the presence of 3-dimensional topological features. These features may be comprised of different materials or have different optical properties. Such features render heat absorption non-uniform. They also render the surface emissivity non-uniform, so that it is impossible to monitor the surface temperature accurately.

These problems have been addressed in the past by depositing an optical absorber layer over the entire wafer (which is later removed). This absorber layer has a high imaginary component of the complex refractive index (the "k" value of the n+ik, where 'n' is the refractive index and 'k' is the extinction coefficient). A sufficiently thick absorber layer masks emissivity variations due to the underlying films on the wafer, as well as their dimensional topological features, promoting improved laser absorption and uniformity of the heat absorption across the wafer (as well as magnitude and uniformity of surface emissivity). The problem is that the optical absorber layer must withstand the near-melting point temperatures sustained during dynamic surface (laser) annealing, without peeling or separating from the underlying layers. In order to avoid such peeling or separation, a high quality bond between the absorber layer and the underlying wafer features is achieved by depositing the absorber layer at a high temperature. The high temperature also serves to provide good film structural, optical and electrical properties. The problem is that if the wafer temperature is sufficiently high to achieve a high quality absorber layer that is immune to cracking, peeling or separation, then the wafer temperature causes the undesirable effects of either recrystallizing a pre-existing amorphous silicon layer or causes the ultra-shallow junctions to diffuse and thereby become poorly defined, thereby degrading circuit features on the wafer. Lower temperature conventional CVD absorber layers also have significantly reduced "k" values, requiring much thicker films to achieve the same net absorption and immunity to underlayer absorption characteristics.

These problems are overcome in accordance with the invention by depositing the absorber layer in a low temperature chemical vapor deposition process using the toroidal plasma source low temperature CVD process of United States Patent Application Publication No. 2004/0200417 by Hiroji Hanawa et al., published Oct. 14, 2004 (hereinafter referred to as Publication B). This process employs a unique toroidal source plasma reactor that is described in detail in Publication B. The process is carried out at very low temperatures, such as under 300 degrees C. or even as low as room temperature. Thus, it has little or no bad effects (e.g., thermal diffusion or dopant migration, or re-crystallization) upon the ultra-shallow junction features already formed on the wafer. If the absorber layer is to be amorphous carbon, then a carbon-containing process gas is employed. In order to enhance absorption of heat from the laser beam in the absorber layer, the deposited amorphous carbon layer is rendered more opaque by doping it with an impurity such as boron, phosphorous, arsenic, silicon or germanium. This may be done by an ion implantation step using the toroidal source plasma immersion ion implantation (P3i) process also described in Publication B, or (alternatively) by incorporating boron into the process gas mixture during the CVD low temperature deposition process. Ion implantation of other impurities (such as nitrogen) into the deposited amorphous carbon absorber layer may be employed in order to adjust or control the dielectric constant or refractive index of the absorber layer, in order to obtain a high dielectric constant, for example. Alternatively, other impurities (such as nitrogen, hydrogen, oxygen, fluorine) may be incorporated by including them in the process gas mixture during the CVD low temperature deposition process.

The thermal properties, i.e., the immunity of the low temperature deposited absorber layer from peeling, cracking or separation during the dynamic surface laser annealing step, are enhanced by making the deposited layer a compressively stressed layer. This is accomplished by raising the RF plasma bias power or bias voltage to a relatively high level in the low temperature plasma CVD process, as described in Publication B. Excellent step coverage over all the 3-dimensional micro-circuit features previously formed on the wafer is obtained by depositing the absorber layer with relatively high conformality. This is accomplished by setting the plasma RF source power in the low temperature plasma CVD process to a relatively high level, as described in Publication B. The adhesion of the deposited film may be enhanced by pre-treating the wafer in a cleaning process to remove surface oxidation or other contamination. One pre-treatment process uses a hydrogen plasma generated by plasma source power or bias power. A bias voltage may be added to enhance the cleaning rate. It is believed that the hydrogen ions and/or radicals etch the thin oxide or contaminant film. Another pre-treatment process uses a nitrogen and/or oxygen plasma generated by plasma source power or bias power. A bias voltage may be added to enhance the cleaning rate. It is believed that the nitrogen and/or oxygen ions and/or radicals etch the thin organic contaminant film. This pre-treatment process may be followed by the hydrogen plasma pre-treatment process to remove oxidation. Another pre-treatment process uses an inert gas plasma such as helium, neon, argon or xenon to sputter clean the surface oxidation or contamination. Alternatively, a wet pre-treatment process may be used to clean the wafer surface (to enhance bonding) prior to depositing the film.

The absorber layer film optical properties may be tuned with process variables in order to have a high absorption or extinction coefficient or imaginary part of the complex refractive index at the wavelength of radiation of the laser light beam and the wavelength of the temperature measurement pyrometer. Such process variables may include impurity (e.g., nitrogen) concentration in the absorber layer, dopant (e.g., boron) concentration in the absorber layer, wafer temperature, process gas pressure, gas flow rates (of C-containing gas, impurity-containing-gas, dilution gas such as helium, hydrogen or argon), RF bias voltage or power, RF plasma source power, process time and layer thickness. Additional enhancement of the properties of the absorber layer may be obtained by grading the concentration of such impurities with depth in the layer. This may be accomplished by adjusting the implantation depth profile of impurities that are ion implanted by the P3i process referred to above, or by ramping the concentration of such impurities in the process gas or changing RF bias voltage or power or RF plasma source power or pressure during the low temperature CVD process described in Publication B. Additional enhancement of the properties of the absorber layer may be obtained by curing the wafer with deposited absorber layer. Curing may include thermal (time at temperature) or UV exposure or a combination. This may further increase or stabilize the absorption or extinction coefficient or imaginary part of the complex refractive index.

The same toroidal source plasma chamber of Publication B may be employed to perform both the absorber layer deposition using low temperature CVD process of Publication B as well as any P3i ion implantation processes (as described in Publication B) of impurities into the absorber layer, so that the wafer need not be transported between different chambers. Moreover, the process chamber of Publication A (that performs the laser beam dynamic surface anneal (DSA) process) is preferably integrated into the same tool or platform with the toroidal source plasma reactor of Publication B, so that the wafer can be coated with the absorber layer (e.g., of amorphous carbon), the absorber layer may be enhanced by P3i ion implantation of selected impurities and/or dopants, and the wafer then laser annealed using the DSA laser light source of Publication A, all in the same tool. This reduces risk of contamination of the wafer. Moreover the same toroidal plasma source chamber or a second (dedicated) toroidal source plasma chamber (of the same type described in Publication B) or a different type of plasma chamber may be integrated onto the same tool or platform for removing the absorber layer upon completion of the laser anneal DSA process.

A fully integrated process requires the following chambers which are used on a given wafer in the following order: a plasma immersion ion implantation (P3i) chamber for implanting dopants to form ultra-shallow junction (USJ) source/drain structures; a resist strip chamber for removing the USJ structure-defining or patterned photoresist; a wet clean chamber for post resist-strip cleaning; a toroidal source or P3i plasma reactor for performing the low temperature CVD process by which the amorphous carbon absorber layer is formed; a chamber containing the DSA multiple laser light source and scanning apparatus; a carbon-strip chamber for removing the absorber layer; and a wet clean chamber for post-strip cleaning of the wafer. At least two or more of the foregoing chambers may be integrated onto a common platform to reduce wafer handling, reduce contamination and increase productivity.

The absorber layer is preferably amorphous carbon, although other suitable materials may be chosen instead. The product of the film thickness and the absorption or extinction coefficient or imaginary part of the complex refractive index at the wavelength of radiation of the laser light beam of the absorber layer must be sufficient to deposit over all the 3-dimensional topological features or micro-circuit structures on the wafer such that the optical properties of the underlying materials are masked to the degree required by the absorber layer. The absorber layer optical properties are selected to maximize heat absorption from the laser beam. The absorber layer thermal or thermal-mechanical properties are selected to render the absorber layer immune from peeling, cracking or separation from the underlying wafer during DSA laser annealing despite the near-melting point temperatures of the process.

The absorber layer maximizes uniform absorption from the laser beam even in the presence of pronounced 3-dimensional surface topological features on the wafer. The absorber layer is a good heat conductor and therefore provides uniform heat distribution across the locally radiated area of the wafer. The uniform surface of the absorber layer renders the surface emissivity of the wafer uniform, so that accurate measurements of wafer temperature may be continuously made, for good process control.

The absorber layer as described above may also be advantageously used for more conventional annealing techniques, such as RTA (rapid thermal anneal) or "spike" anneal or flashlamp anneal, to improve the magnitude or uniformity of light absorption, and to reduce across wafer and wafer-to-wafer temperature variation. Such a layer may be used to mask the variation in the optical properties, including 3-D geometric effects, of underlayers. In this case, the absorber layer deposition/implantation is tuned for the desirable optical properties across the spectrum of wavelengths that the filament or arc/gas discharge light source produces. The heat absorber layer of the present invention may also be used in RTA annealing of semiconductor wafers having 3-dimensional micro-circuit topological features. In such a case, the absorber layer optical properties are adapted to the RTA light source. Such devices may include such highly reflective structures as silicon-on-insulator or polysilicon on dielectric structures.

Laser Thermal Flux Annealing Light Source:

The dynamic surface anneal light source referred to above uses CW diode lasers to produce very intense beams of light that strikes the wafer as a thin long line of radiation. The line is then scanned over the surface of the wafer in a direction perpendicular to the long dimension of the line beam. One embodiment of the light source is illustrated in the schematic orthographic representation of FIG. 1. A gantry structure 110 for two-dimensional scanning includes a pair of fixed parallel rails 112, 114. Two parallel gantry beams 116, 118 are fixed together a set distance apart and supported on the fixed rails 112, 114 and are controlled by an unillustrated motor and drive mechanism to slide on rollers, source, or ball bearings together along the fixed rails 112, 114. A beam source 120 is slidably supported on the gantry beams 116, 118, e.g. suspended below the beams 116, 118 and is controlled by unillustrated motors and drive mechanisms to slide along them. A silicon wafer 40 or other substrate is stationarily supported below the gantry structure 110. The beam source 120 includes laser light source and optics to produce a downwardly directed fan-shaped beam 124 that strikes the wafer 40 as a line beam 126 extending generally parallel to the fixed rails 112, 114, in what is conveniently called the slow direction. Although not illustrated here, the gantry structure further includes a Z-axis stage for moving the laser light source and optics in a direction generally parallel to the fan-shaped beam 124 to thereby controllably vary the distance between the beam source 120 and the wafer 40 and thus control the focusing of the line beam 126 on the wafer 40. Exemplary dimensions of the line beam 126 include a length of 1 cm and a width of 100 microns with an exemplary power density of 400 kW/cm$^2$. Alternatively, the beam source and associated optics may be stationary while the wafer is supported on a stage which scans it in two dimensions.

Figure 2:
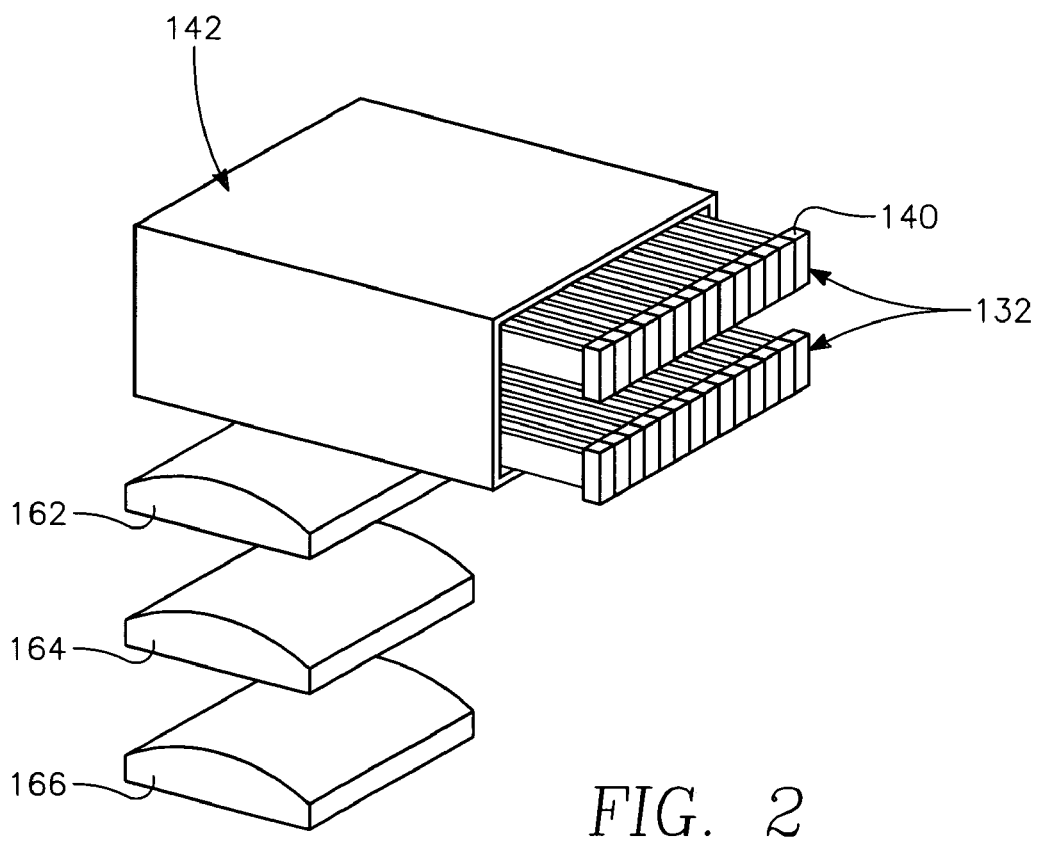
FIG. 2 is a top view of the optics of the apparatus of FIG. 1.
Figure 3:
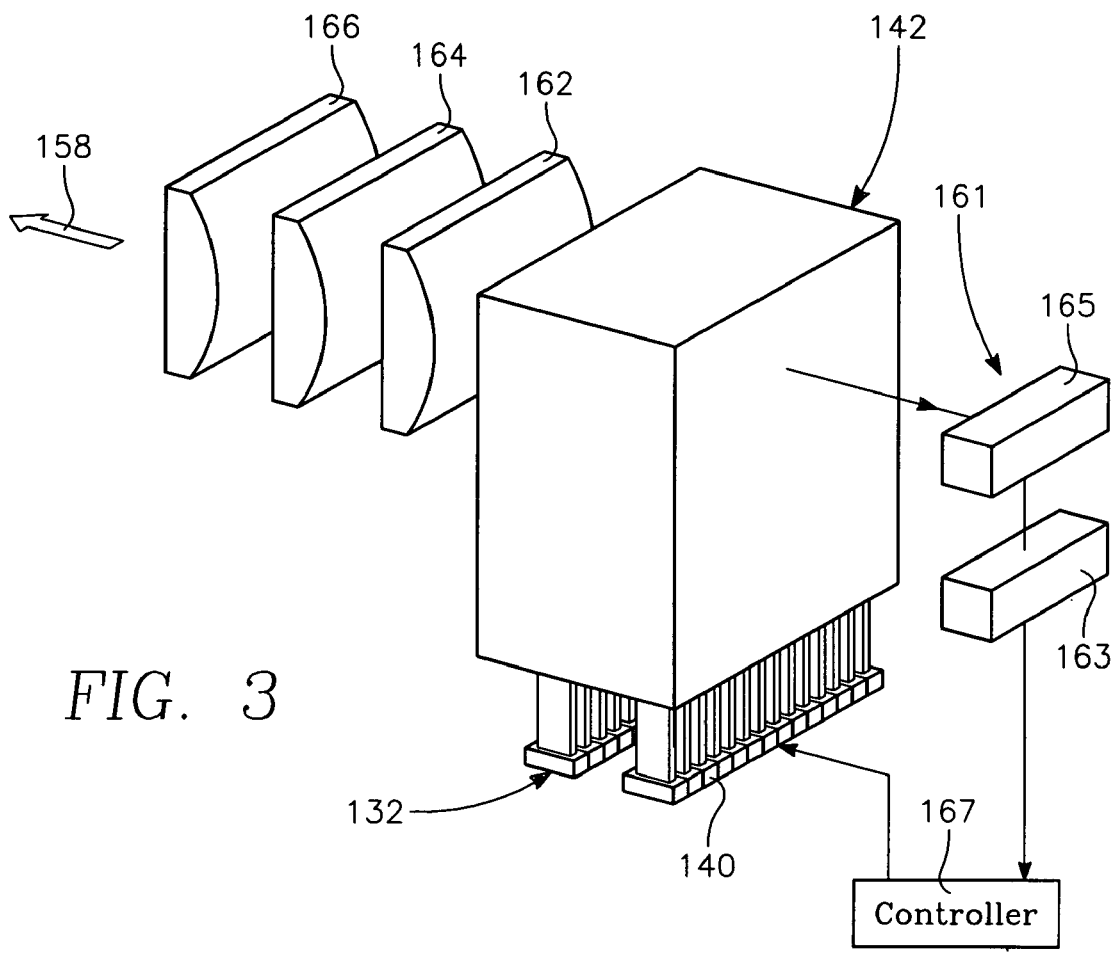
FIG. 3 is an elevational view corresponding to FIG. 2.
Figure 4:
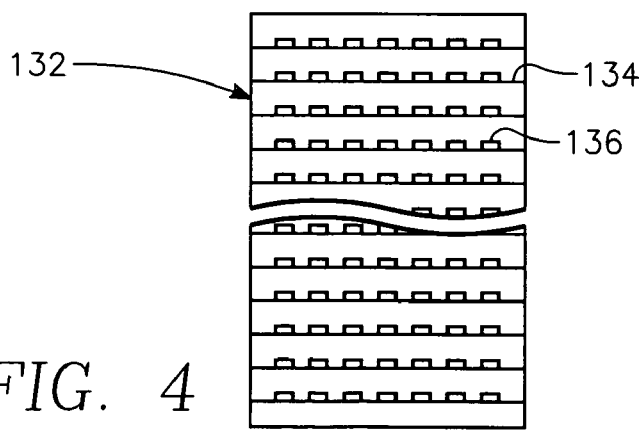
FIG. 4 is a broken sectional view of the laser array employed in the apparatus of FIG. 1.

In typical operation, the gantry beams 116, 118 are set at a particular position along the fixed rails 112, 114 and the beam source 120 is moved at a uniform speed along the gantry beams 116, 118 to scan the line beam 126 perpendicularly to its long dimension in a direction conveniently called the fast direction. The line beam 126 is thereby scanned from one side of the wafer 40 to the other to irradiate a 1 cm swath of the wafer 40. The line beam 126 is narrow enough and the scanning speed in the fast direction fast enough that a particular area of the wafer is only momentarily exposed to the optical radiation of the line beam 126 but the intensity at the peak of the line beam is enough to heat the surface region to very high temperatures. However, the deeper portions of the wafer 40 are not significantly heated and further act as a heat sink to quickly cool the surface region. Once the fast scan has been completed, the gantry beams 116, 118 are moved along the fixed rails 112, 114 to a new position such that the line beam 126 is moved along its long dimension extending along the slow axis. The fast scanning is then performed to irradiate a neighboring swath of the wafer 40. The alternating fast and slow scanning are repeated, perhaps in a serpentine path of the beam source 120, until the entire wafer 40 has been thermally processed. One example of optics beam source 120, orthographically illustrated in FIGS. 2 and 3, receives laser radiation at about 810 nm from two laser bar stacks 132, one of which is illustrated in end plan view in FIG. 4. Each laser bar stack 132 includes 14 parallel bars 134, generally corresponding to a vertical p-n junction in a GaAs semiconductor structure, extending laterally about 1 cm and separated by about 0.9 mm. Typically, water cooling layers are disposed between the bars 134. In each bar 134 are formed 49 emitters 136, each constituting a separate GaAs laser emitting respective beams having different divergence angles in orthogonal directions. The illustrated bars 134 are positioned with their long dimension extending over multiple emitters 136 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Figure 5:
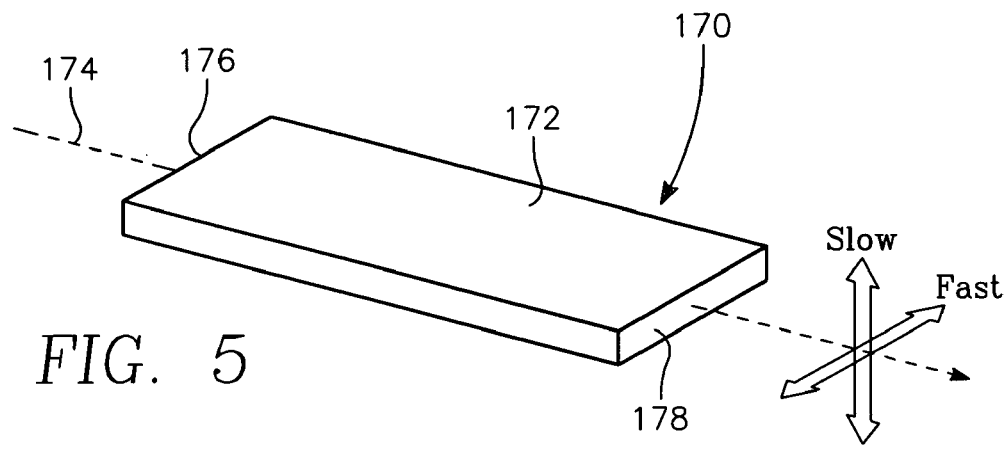
FIG. 5 is a perspective view of a homogenizing light pipe of the apparatus of FIG. 1.

Returning to FIGS. 2 and 3 two arrays of cylindrical lenslets 140 are positioned along the laser bars 134 to collimate the laser light in a narrow beam along the fast axis. They may be bonded with adhesive on the laser stacks 132 and aligned with the bars 134 to extend over the emitting areas 136. The two sets of beams from the two bar stacks 132 are input to conventional optics 142. The source beam 158 is then passed through a set of cylindrical lenses 162, 164, 166 to focus the source beam 158 along the slow axis before it enters a one-dimensional light pipe 170 with a finite convergence angle along the slow axis but being substantially collimated along the fast axis. The light pipe 170, more clearly illustrated in the orthographic view of FIG. 5 acts as a beam homogenizer to reduce the beam structure along the slow axis introduced by the multiple emitters 136 in the bar stack 132 spaced apart on the slow axis. The light pipe 170 may be implemented as a rectangular slab 172 of optical glass having a sufficiently high index of refraction to produce total internal reflection. It has a short dimension along the slow axis and a longer dimension along the fast axis. The slab 172 extends a substantial distance along an axis 174 of the source beam 158 converging along the slow axis on an input face 176 is internally reflected several times from the top and bottom surfaces of the slab 172, thereby removing much of the texturing along the slow axis and homogenizing the beam along the slow axis when it exits on an output face 178. The source beam 158, however, is well collimated along the fast axis and the slab is wide enough that the source beam 158 is not internally reflected on the side surfaces of the slab 172 but maintains its collimation along the fast axis. The light pipe 170 may be tapered along its axial direction to control the entrance and exit apertures and beam convergence and divergence. The one-dimensional light pipe can alternatively be implemented as two parallel reflective surfaces corresponding generally to the upper and lower faces of the slab 172 with the source beam passing between them.

Figure 6:
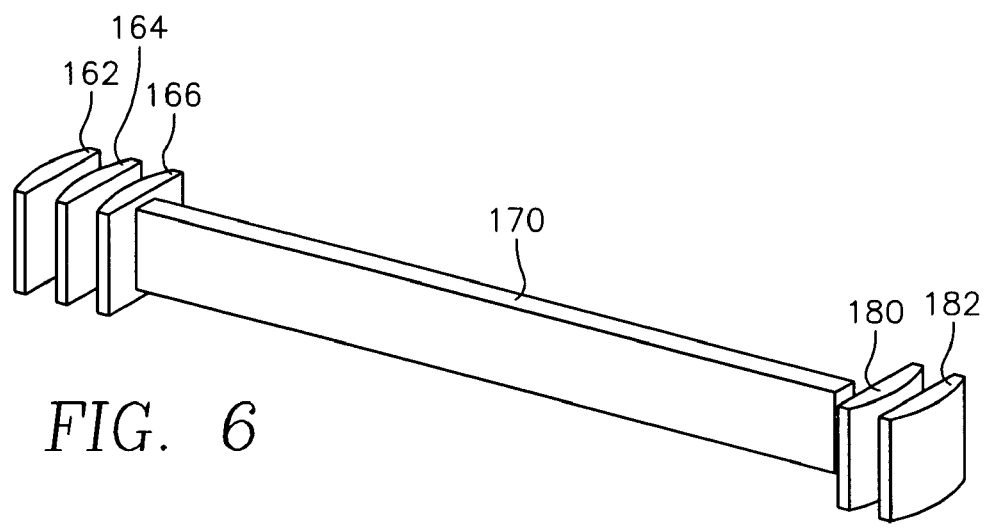
FIG. 6 is a perspective side view of the light pipe of FIG. 5 with collimating and focusing lenses.

The source beam output by the light pipe 170 is generally uniform. As further illustrated in the schematic view of FIG. 6, a further anamorphic lens set 180, 182 expands the output beam in the slow axis and includes a generally spherical lens to project the desired line beam 126 on the wafer 40. The anamorphic optics 180 shape the source beam in two dimensions to produce a narrow line beam of limited length. In the direction of the fast axis, the output optics have an infinite conjugate for the source at the output of the light pipe 170 (although systems may be designed with a finite source conjugate) and a finite conjugate at the image plane of the wafer 40 while, in the direction of the slow axis, the output optics has a finite conjugate at the source at the output of the light pipe 170 and a finite conjugate at the image plane. Further, in the direction of the slow axis, the radiation from the multiple laser diodes of the laser bars is homogenized, which is otherwise non-uniform. The ability of the light pipe 170 to homogenize strongly depends on the number of times the light is reflected traversing the light pipe 170. This number is determined by the length of the light pipe 170, the direction of the taper if any, the size of the entrance aperture 176 and the exit aperture 178 as well as the launch angle into the light pipe 170. Further anamorphic optics focus the source beam into the line beam of desired dimensions on the surface of the wafer 40.

Figure 7:
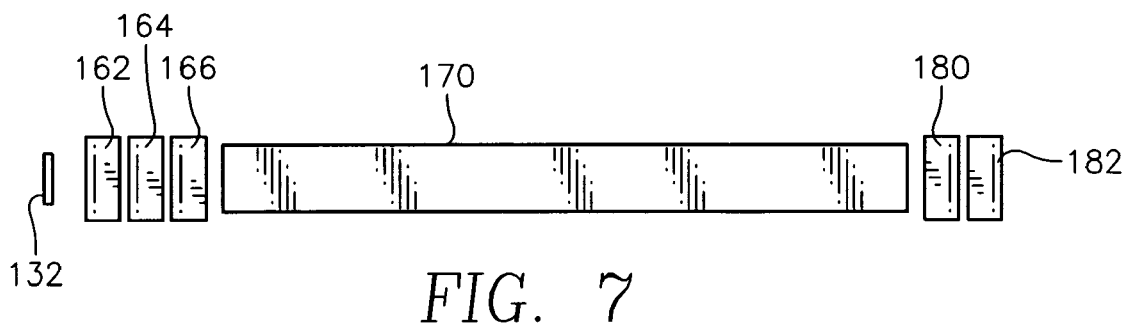
FIG. 7 is a side view corresponding to FIG. 6.
Figure 8:
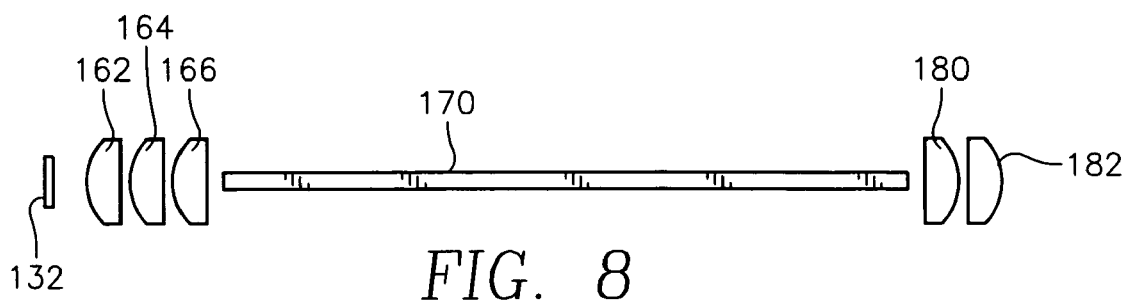
FIG. 8 is a top view corresponding to FIG. 6.

FIGS. 7 and 8 are perpendicularly arranged side views along the fast and slow axes respectively showing the light pipe 170 and some associated optics. In the direction of the fast axis, the beam from the lasers bars 132 is well collimated and not affected by the light pipe 170 or anamorphic optics. On the other hand, in the direction of the slow axis, the input anamorphic optics 162, 164, 166 condense and converge the beam into the input end of the light pipe 170. The beam exits the light pipe 170 with substantially uniform intensity along the slow axis but with a substantial divergence. The output anamorphic optics 180, 182 expand and collimate the output beam along the slow axis.

In order to regulate or control the peak wafer temperature, the temperature of the illuminated portion of the wafer 40 is constantly monitored by a pyrometry system. The pyrometry system uses the same optics used to focus the laser source light on the wafer to direct thermal radiation emitted from the illuminated area of the wafer 40 in the neighborhood of the line beam 126 in the reverse direction to a pyrometer 161 schematically shown in FIG. 3. The pyrometer 161 includes an optical detector 163, such as a photodiode, and an optical filter 165 blocking the wavelength of the laser light source (e.g., 810 nm). The pyrometer filter 165 preferably is a narrow passband filter centered at a region of the Plankian blackbody radiation curve which is quickly changing at the temperature of interest. For example, the pyrometer passband may be centered at 950 nm, in which case the detector 163 is a silicon photodiode. The optics are generally reciprocal and thus in the reverse direction detect only a small area of the wafer 40 on or very near to the line beam 126, and optically expands that image to a much larger area. The output of the detector 163 is used by a controller 167 to control the power to the laser array 132. A filter (not shown) may be placed in front of the laser array 132 to block any emission it may have at the pyrometer wavelength (e.g., 950 nm).

The features of the present invention described below may be employed with other laser types: CO2 gas-lasers; Neodymium YAG lasers (neodymium: yttrium-aluminum-garnet) which may optionally be frequency-doubled; Excimer lasers (a rare-gas halide or rare-gas metal vapor laser emitting in the ultraviolet (126 to 558 nm) that operates on electronic transitions of molecules, up to that point diatomic, whose ground state is essentially repulsive) with excitation by E-beam or electric discharge; diode lasers (light-emitting diode designed to use stimulated emission to form a coherent light output).

Figure 9:
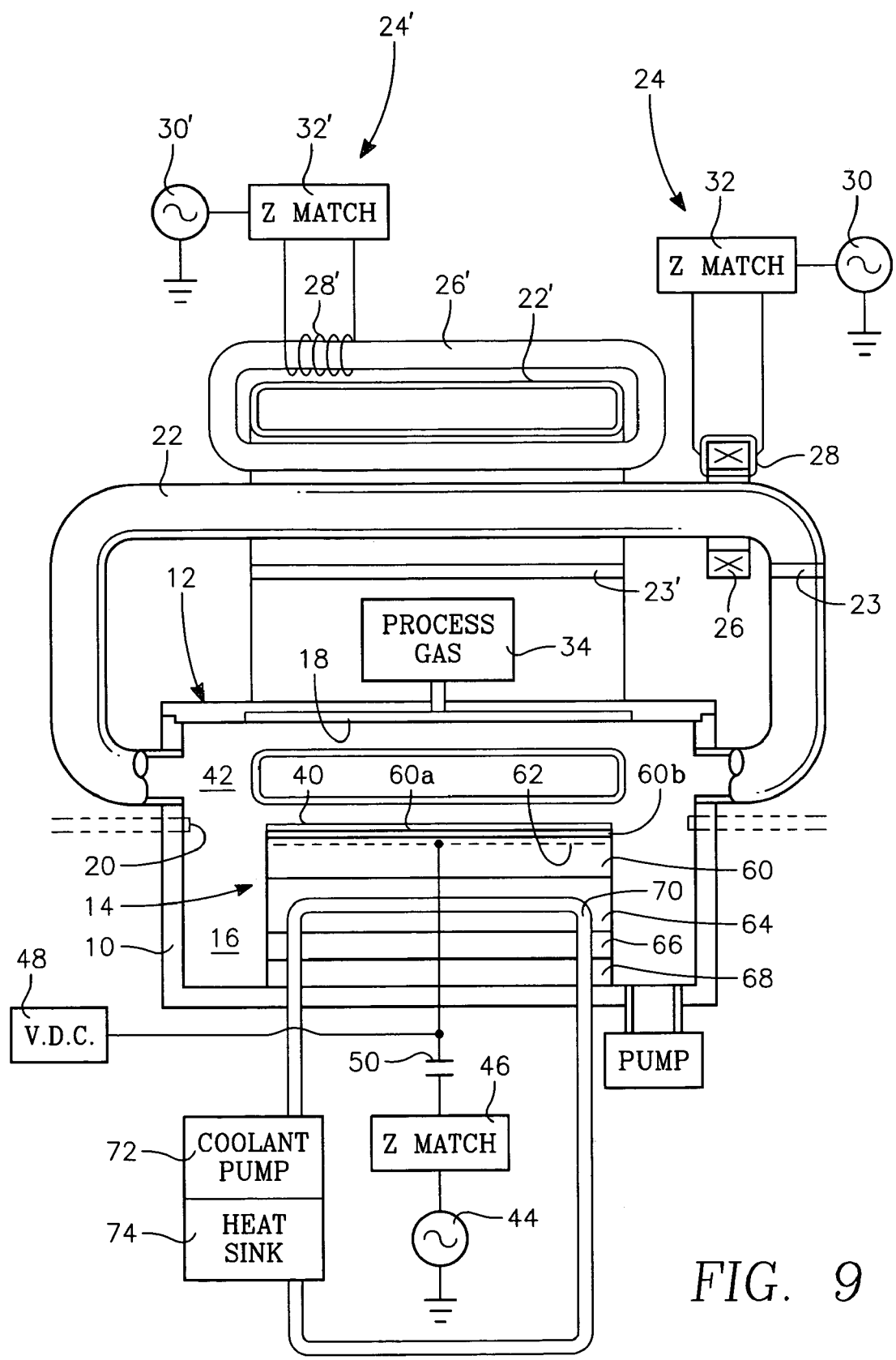
FIG. 9 depicts a toroidal source plasma reactor employed in carrying out a low temperature CVD process.

Low Temperature CVD Process of the Toroidal Source Plasma Reactor:

FIG. 9 depicts a toroidal source plasma reactor with which a low temperature CVD process is carried out. The plasma reactor has a cylindrical side wall 10, a ceiling 12 and a wafer contact-cooling electrostatic chuck 14. A pumping annulus 16 is defined between the chuck 14 and the sidewall 10. Process gases are introduced through a gas distribution plate 18 (or "showerhead") forming a large portion of the ceiling 12. Optionally, process gases may also be introduced through side injection nozzles 20 or by other means. The reactor of FIG. 9 has a reentrant RF toroidal plasma source consisting of an external reentrant tube 22 coupled to the interior of the reactor through opposite sides of the sidewall 10 (or, through openings in the ceiling 12 not shown in FIG. 1). An insulating ring 23 provides a D.C. break along the reentrant tube 22. The toroidal plasma source further includes an RF power applicator 24 that may include a magnetically permeable toroidal core 26 surrounding an annular portion of the reentrant tube 22, a conductive coil 28 wound around a portion of the core 26 and an RF plasma source power generator 30 coupled to the conductive coil through an optional impedance match circuit 32. A second external reentrant tube 22' transverse to the first tube 22 is coupled to the interior of the reactor through opposite sides of the sidewall 10 (or, through openings in the ceiling 12 not shown in FIG. 1). An insulating ring 23' provides a D.C. break along the second reentrant tube 22'. A second RF power applicator 24' includes a magnetically permeable toroidal core 26' surrounding an annular portion of the reentrant tube 22', a conductive coil 28' wound around a portion of the core 26' and an RF plasma source power generator 30' coupled to the conductive coil through an optional impedance match circuit 32'. A process gas supply 34 is coupled to the gas distribution plate 18 (or to the gas injectors 20). A semiconductor wafer or workpiece 40 is placed on top of the chuck 14. A processing region 42 is defined between the wafer 40 and the ceiling 12 (including the gas distribution plate 18). A toroidal plasma current oscillates at the frequency of the RF plasma source power generator 30 along a closed toroidal path extending through the reentrant tube 22 and the processing region 42.

RF bias power or voltage is applied to the chuck 14 by an RF bias power generator 44 through an impedance match circuit 46. A D.C. chucking voltage is applied to the chuck 14 from a chucking voltage source 48 isolated from the RF bias power generator 44 by an isolation capacitor 50. The RF power delivered to the wafer 40 from the RF bias power generator 44 can heat the wafer 40 to temperatures beyond 400 degrees C., depending upon the level and duration of the applied RF plasma bias power from the generator 44 if no wafer cooling is employed. It is believed that about 80% or more of the RF power from the bias power generator 44 is dissipated as heat in the wafer 40. The wafer support pedestal 14 is an electrostatic chuck having an insulative or semi-insulative top layer or puck 60. A metal (molybdenum, for example) wire mesh or metal layer 62 inside of the puck 60 forms a cathode (or electrode) to which the D.C. chucking voltage and RF bias voltage is applied. The puck 60 is supported on a metal layer 64 that rests on a highly insulative layer 66. A metal base layer 68 may be connected to ground. The wafer 40 is electrostatically held on the chuck 14 by applying a D.C. voltage from the chucking voltage source 48 to the electrode 62. This induces an opposite (attractive) image charge in the bottom surface of the wafer 40. The effective gap between the two opposing charge layers is so minimal as a result of the upward charge migration in the semi-insulator layer 60 that the attractive force between the chuck and the wafer 40 is very large for a relatively small applied chucking voltage. The puck semi-insulator layer 60 therefore is formed of a material having a desired charge mobility, so that the material is not a perfect insulator. RF bias power or voltage from the RF bias power generator 44 may be applied to the electrode 62 or, alternatively, to the metal layer 64 for RF coupling through the semi-insulative puck layer 60. Heat is removed from the puck 60 by cooling the metal layer 64. For this reason, internal coolant passages 70 are provided within the metal layer 64 coupled to a coolant pump 72 and heat sink or cooling source 74. Heat sink 74 may optionally be a heat exchanger which can also furnish heat, if desired, to metal layer 64. A very high heat transfer coefficient between the wafer 40 and the puck 60 is realized by maintaining a very high chucking force. The force can be enhanced by providing a polished surface 60a.

A low-temperature chemical vapor deposition process preferably employs an electrostatic wafer chuck that both serves to couple RF bias power or voltage to the wafer and removes (or provides) heat to maintain the wafer temperature at the desired level or below a threshold. More preferably, the electrostatic chuck is the type described immediately above with reference to FIG. 9 and in greater detail in U.S. patent application Ser. No. 10/929,104 filed Aug. 26, 2004 by Douglas A. Buchberger, Jr., et al. and entitled GASLESS HIGH VOLTAGE HIGH CONTACT FORCE WAFER CONTACT-COOLING ELECTROSTATIC CHUCK. The use of the aforementioned electrostatic chuck (with its high heat transfer coefficient) permits operating of the source power at a higher level (i.e., 5 kW per toroidal source) and bias power at a higher level (i.e., 10 kW) while maintaining wafer temperature under 200 degrees C., or even under 100 degrees C., if desired. In addition, the chamber pressure is maintained in a range between about 5 and 200 mtorr that is sufficiently low to avoid a defective (e.g., flaky) CVD layer without requiring high wafer temperature. The low chamber pressure avoids excessive ion recombination that would otherwise depress plasma ion density and/or ion energy below that required to deposit a high quality film without heating the workpiece. The maintenance of a moderate plasma ion density in the process region obviates the need for any heating of the wafer, so that a high quality CVD film can be deposited at very low temperature (less than 100 degrees C.), unlike the PECVD reactor. The fact that the plasma density is not very high and the plasma source power level need not be high permits a wide operating range of bias voltage, without requiring excessive bias power levels, unlike the HDPCVD reactor.

The fact that the CVD reaction can be carried out in the toroidal source reactor at a low source power level, if desired, implies a large window in which source power can be varied, from the minimum level up to a maximum level (e.g., about 5 kW per toroidal source ). This window is sufficiently large to vary the conformality of the CVD deposited layer between non-conformal (0.1 conformality ratio) and conformal (>0.5 conformality ratio). At the same time, the stress level of the CVD deposited layer may be varied by varying the plasma bias power or voltage applied to the wafer between a low level for tensile stress in the deposited layer (e.g., 500 Watts) and a high level for compressive stress in the deposited layer (e.g., 3 kWatts or higher). As a result, the conformality and stress of each plasma CVD deposited layer are independently adjusted by adjusting the source and bias power levels, respectively, to different layers which are either conformal or non-conformal and having either tensile or compressive stress. Non-conformal films are useful for deep trench filling and for creating removable layers over photoresist. Conformal layers are useful for etch stop layers and passivation layers. Layers with compressive stress enhance carrier mobility in underlying or adjacent P-channel MOSFETs, while layers with tensile stress enhance carrier mobility in underlying or adjacent N-channel MOSFETs. The low minimum plasma source power of the toroidal source plasma reactor of FIG. 9 and the highly controllable plasma ion density that the reactor provides as source power is increased follows from the unique reactor structure of the toroidal source plasma reactor. Plasma source power is applied via a power applicator to a reentrant external conduit through which the toroidal RF plasma current circulates (oscillates), so that the source power density is very low. This feature makes plasma ion density at the wafer surface highly controllable and not subject to excessive increases with plasma source power, in contrast to the HDPCVD plasma reactor (when the transition to inductive coupling occurs). Moreover, the highly efficient coupling of the RF source power applicator to the process gases within the external reentrant conduit makes the minimum plasma source power for plasma ignition much smaller than a conventional reactor (such as the HDPCVD reactor). The low temperature CVD process solves the problem of providing a plasma CVD process for 65 nm or 45 nm or smaller devices (for example) where the device temperature cannot exceed 400 degrees C. for any significant amount of time without destroying the device structure. It also permits plasma CVD deposition over photoresist layers without disrupting or destroying the underlying photoresist. This possibility opens up an entirely new class of processes described below that are particularly suited for nm-sized design rules and can be carried out without disturbing photoresist masking on the device.

Post-CVD ion implantation processes can be carried out in the same toroidal source reactor that was used to perform the low temperature CVD process. The post CVD ion implantation processes include processes for enhancing adhesion between an amorphous or polycrystalline CVD deposited layer and its base layer, for raising the proportion of a species in the CVD layer beyond a stochiometric proportion, for implanting into the CVD layer a species not compatible with plasma CVD processes, or for implanting into the CVD layer a species that alters a particular material quality of the layer, such as dielectric constant or stress.

The low temperature plasma CVD process is useful for CVD formation of silicon films, silicon nitride films, silicon-hydrogen films, silicon-nitrogen-hydrogen films, and versions of the foregoing films further containing oxygen or fluorine. The films exhibit excellent quality and excellent thermal properties, being free of cracking, peeling, flaking, etc., despite the very low temperature at which the CVD process is carried out. For application to CMOS devices, passivation layers are deposited over P- and N-channel devices with compressive and tensile stresses, respectively, using high non-conformality to enable selective etching and photoresist masking and removal, and etch stop layers with zero (neutral) stress can be deposited over all devices with high conformality. Low temperature plasma CVD process is also useful for CVD formation of carbon films.

Figure 10:
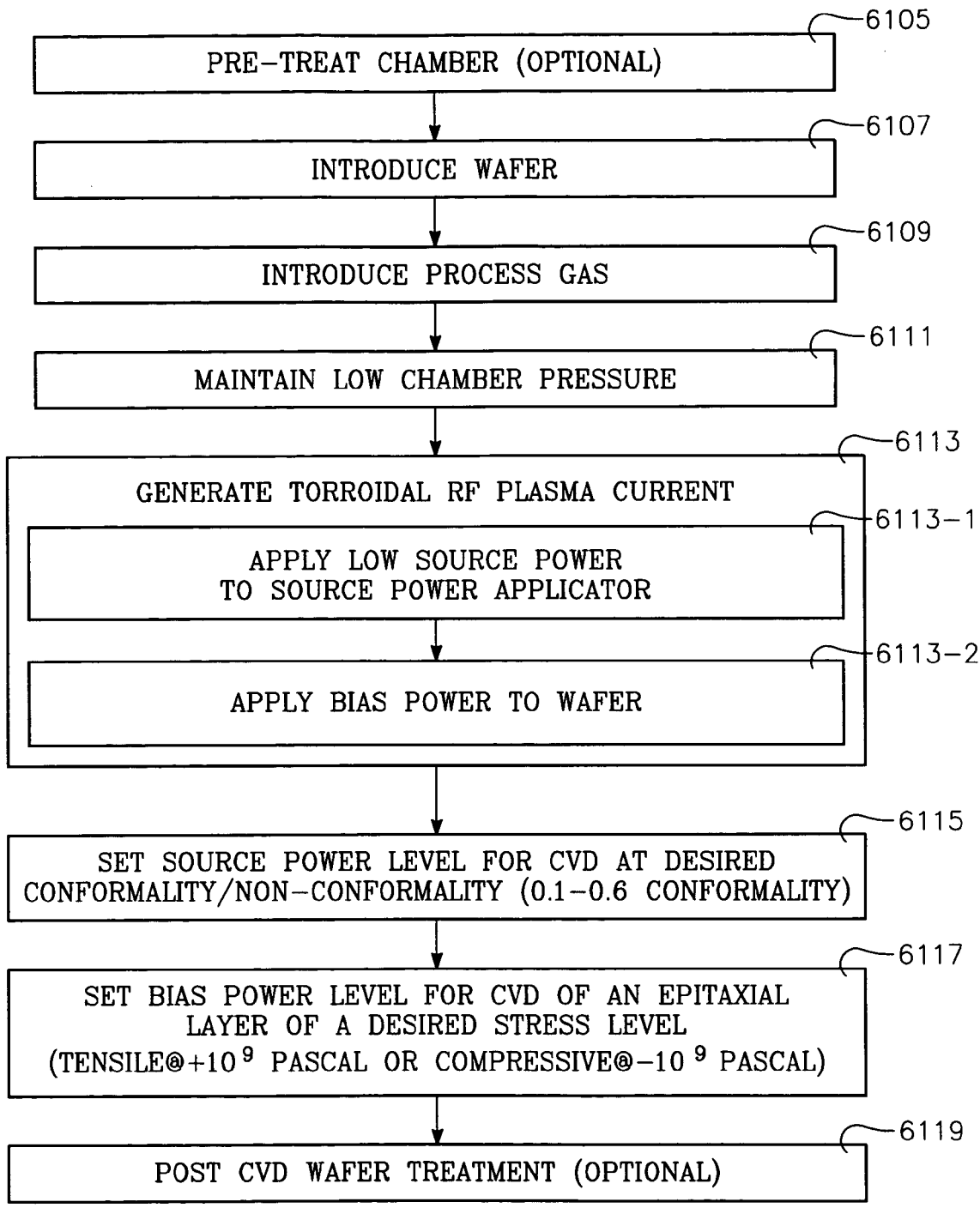
FIG. 10 is a block diagram depicting a general low temperature CVD process performed in the reactor of FIG. 9.

A low temperature plasma CVD process employing the toroidal reactor of FIG. 9 is illustrated in FIG. 10. In this process a carbon or carbon-containing layer is deposited in a toroidal plasma chemical vapor deposition process. The deposited layer may have some of the attributes of an amorphous carbon material, a polymer carbon material, or a graphitic carbon material, for example, and a wide range of electrical and optical properties, depending upon how the process is carried out. In a later portion of this specification, process control of the properties of the deposited material will be described. A first step (block 6105 of FIG. 10), which is optional, is to coat the interior surfaces of the chamber with a passivation layer to prevent or minimize metal contamination on the wafer. The passivation layer may, for example, be of the same material as the CVD film that is to be deposited (e.g., a material containing carbon). The passivation coating on the chamber interior surfaces is carried out by introducing a suitable process gas mixture (e.g., a carbon-containing gas such as propylene), and applying plasma source power to generate a toroidal RF plasma current, as in the above-described embodiments. This step is carried out until a suitable thickness of the passivation material has been deposited on interior chamber surfaces. Then, a production workpiece or semiconductor wafer is placed on the wafer support pedestal (block 6107 of FIG. 10). Process gases are introduced (block 6109) containing carbon and (optionally) other species such as hydrogen, or nitrogen, for example. The chamber pressure is maintained at a low or modest level, e.g., from about 5 to about 200 mTorr (block 6111 of FIG. 10). A reentrant toroidal plasma current is generated in the toroidal source reactor (block 6113). The toroidal plasma current is produced by coupling RF plasma source power (e.g., 100 Watts to 5 kW) (block 6113-1 of FIG. 10) into each re-entrant external conduit 22, 22', and applying RF plasma bias power between 0 and 10 kWatts (block 6113-2 of FIG. 10). The source power is preferably at an HF frequency on the order of 10 MHz (e.g., such as 13.56 MHz), which is very efficient for producing plasma ions. The bias power is preferably at an LF frequency on the order of a MHz (e.g., such as 2 MHz), which is very effective for producing a relatively large plasma sheath voltage for a given amount of bias power. The magnitude of the source power delivered by the RF generators 180 is adjusted to deposit by chemical vapor deposition a film on the wafer with the desired conformality (block 6115). The magnitude of the bias power or voltage delivered by the RF generator 162 is adjusted so that the deposited film has the desired stress, compressive or tensile (block 6117 of FIG. 10). The foregoing process is carried out until the desired deposited film thickness is reached. Thereafter, certain optional post-CVD ion implant processes may be performed (block 6119 of FIG. 10).

Figure 11A:
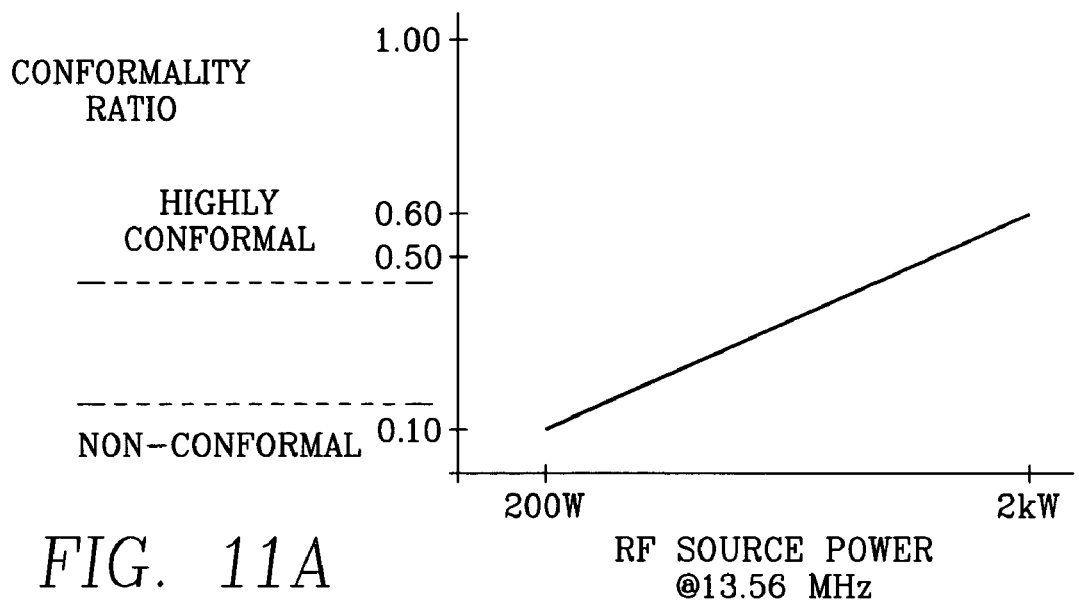
FIG. 11A is a graph illustrating conformality of the layer deposited in the low temperature process of FIG. 10 as a function of source power.
Figure 11B:
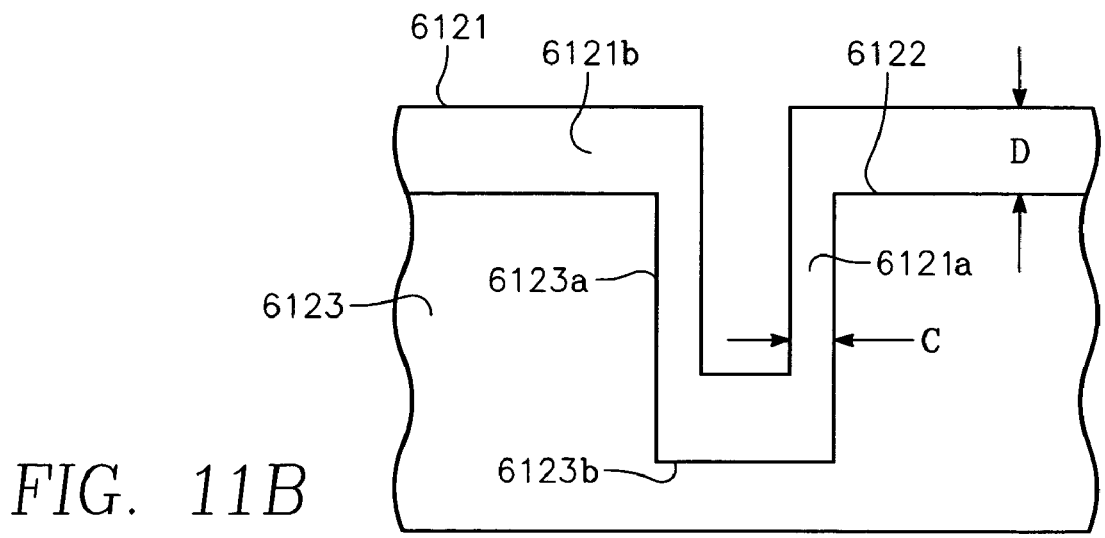
FIG. 11B is a cross-sectional view of a high aspect ratio opening and deposited layer that illustrates the definition of conformality.
Figure 12:
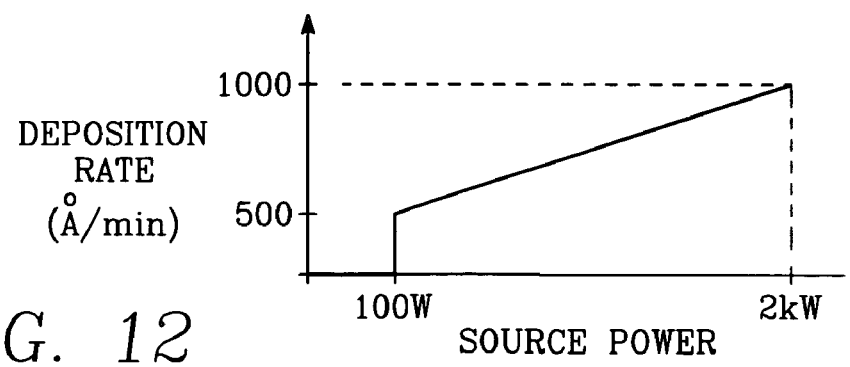
FIG. 12 is a graph depicting CVD deposition rate as a function of plasma source power.

FIG. 11A is a graph of conformality ratio of the deposited layer (vertical axis) as a function of the applied RF source power (horizontal axis). As shown in FIG. 11B, the conformality ratio of a layer 6121 deposited by a CVD process on a base layer or substrate 6123 is the ratio C/D of the thickness C of a vertical section 6121a of the layer 6121 (deposited on a vertical face 6123a of the base layer 6123) to the thickness D of a horizontal section 6121b of the layer 6121 (deposited on a horizontal section 6123b of the base layer 6123). A conformality ratio exceeding 0.5 indicates a highly conformal CVD-deposited film. A conformality ratio of about 0.1 indicates a non-conformal CVD-deposited film. FIG. 11A illustrates how the wide source power window of the toroidal source reactor of FIG. 9 spans the conformality ratio range from non-conformal (at about 100 Watts source power) to highly conformal (at about 1 kW source power). FIG. 11A shows that the same toroidal source reactor can be used for plasma CVD deposition of both conformal and non-conformal films. FIG. 12 is a graph illustrating the CVD deposition rate (vertical axis) as a function of applied source power (horizontal axis). From zero up to 100 Watts of RF source power, no plasma is ignited in the toroidal source reactor of FIG. 9, and the deposition rate is zero. Starting at about 100 Watts of source power at about 13.56 MHz with a constant bias voltage of about 5 kV at about 2 MHz, the deposition rate starts at about 500 Angstroms per minute (at 100 Watts source power) and reaches about 1000 Angstroms per minute (at about 2 kW of source power). The advantage is that the deposition rate is sufficiently low so that a high quality defect-free CVD film is formed without requiring any heating or annealing to cure defects that would otherwise form at high deposition rates (e.g., 5,000 Angstroms per minute). Therefore, the source power of the toroidal plasma reactor (FIG. 9) can be varied anywhere within the range required to switch the conformality ratio between non-conformal and conformal (i.e., from 200 Watts to 2 kW) without requiring heating of the wafer, so that the wafer can remain at a low processing temperature, i.e., below 200 or even 100 degrees C. The fact that the toroidal plasma reactor source power may be so increased (to attain a high degree of conformality) without causing excessive CVD deposition rates follows from the structure of the toroidal source reactor which avoids excessive increases in ion density in the process region overlying the wafer 120. Such excessive ion density is avoided in part because each plasma source power applicator (i.e., each core 26, 26' surrounding a respective reentrant conduit 22, 22' and the corresponding primary winding 28, 28') applies plasma source power to a section of the reentrant conduit 22, 22' that is external of the reactor chamber defined by the side wall 10 and ceiling 12, and is remote from the process region 42 overlying the wafer 40. Fortunately, the low and therefore highly controllable increase in plasma ion density with source power of the toroidal plasma reactor of FIG. 9 is accompanied by a very low minimal source power for plasma ignition (e.g., only 100 Watts), which results in the wide source power window spanning the entire conformality range. This minimal source power level for plasma ignition is a result of the efficient manner in which the toroidal source reactor of FIG. 9 generates the toroidal RF plasma current at HF frequencies such as 13.65 MHz.

Figure 13:
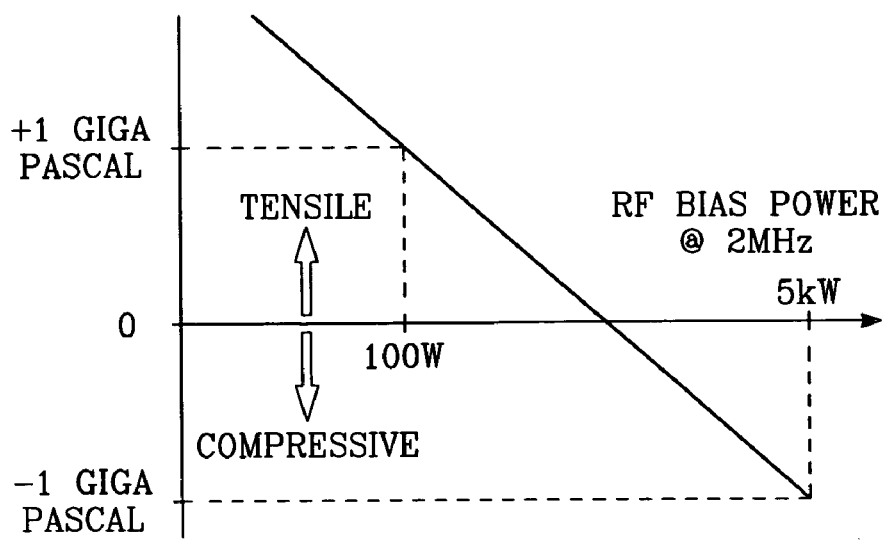
FIG. 13 is a graph illustrating the stress of the deposited layer as a function of bias power level.

Another feature of the toroidal plasma reactor of FIG. 9 is the wide range of RF plasma bias (sheath) voltage with which the reactor may be operated (e.g., from zero to 10 kV). One aspect of this feature is illustrated in the graph of FIG. 13: the bias voltage operating range (horizontal axis of FIG. 13) spans the range of stress in the CVD deposited film (vertical axis in the graph of FIG. 13), from tensile stress (+1 gigapascal) to compressive stress (−1 gigapascal). Such post-CVD ion implantation treatments will be described later in this specification. The large range in RF plasma bias (sheath) voltage is attained by using a low frequency (LF) plasma bias source, such as a 2 MHz RF source. Such a low frequency translates to a high impedance across the plasma sheath over the surface of the wafer, with a proportionately higher sheath voltage. Thus, a relatively small amount of plasma bias power (5 kW) can produce a very large sheath voltage (10 kV) at the wafer surface. Such a relatively low bias power level reduces the heating load on the wafer and reduces the heat and electric field load on the wafer support pedestal. Of course, the toroidal source reactor of FIG. 9 does not require such a large sheath voltage in order to ignite or sustain a plasma, and the bias power can be reduced well below 5 kW, to zero, if desired, without extinguishing the plasma. The conformality selection (between non-conformal and highly conformal) illustrated in FIG. 11A and the stress selection (between tensile and compressive) illustrated in FIG. 13 are performed independently using the very wide source power and bias power operating windows of the toroidal source reactor of FIG. 9. As a result, the toroidal source reactor of FIG. 9 performs a low temperature CVD process of FIG. 10 in which different layers may be deposited with different selections of stress (tensile, zero, or compressive) and different selections of conformality ratio (non-conformal or highly conformal).

Figure 14:
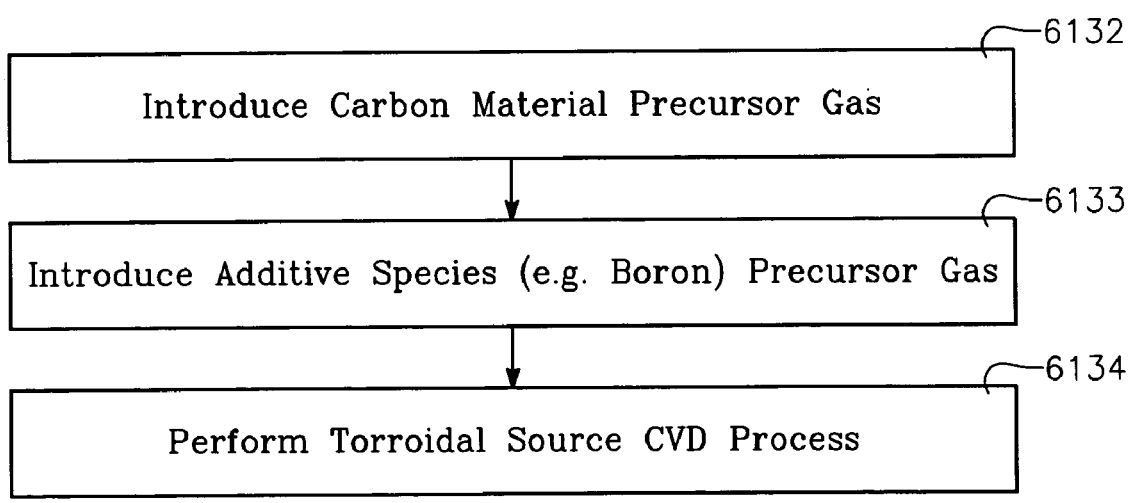
FIG. 14 is a block diagram illustrating an embodiment of the process of FIG. 10.
Figure 15:
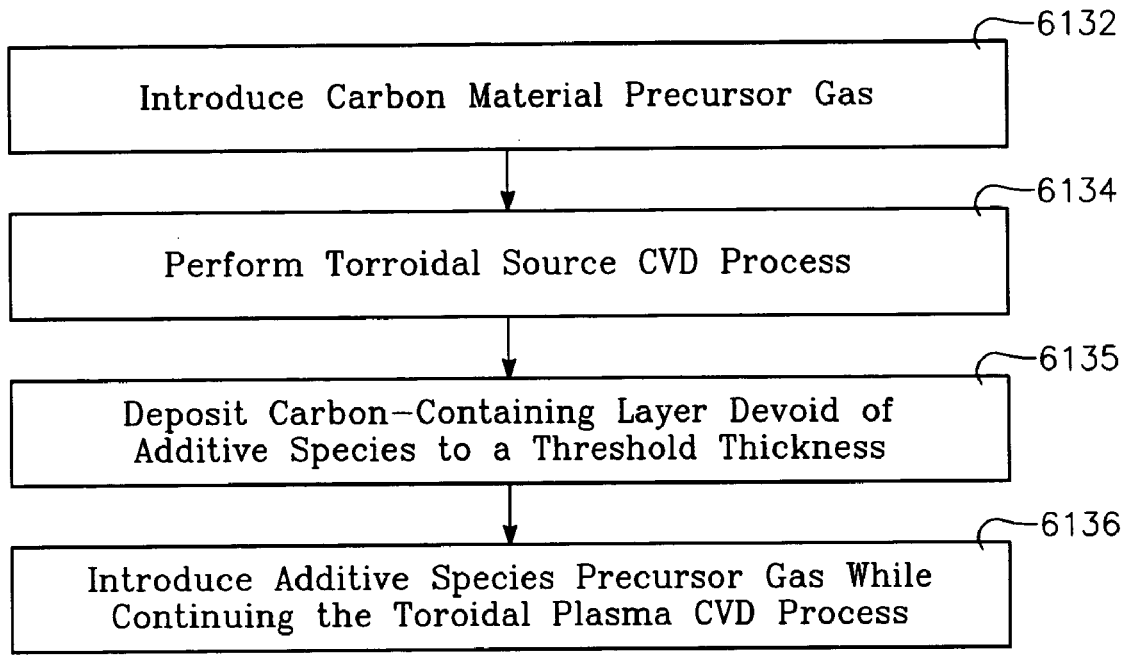
FIG. 15 is a block diagram illustrating another embodiment of the process of FIG. 10.

FIG. 14 depicts a variation of the process of FIG. 10 in which an additive species is included in the deposited layer by including its precursor gas in the process gas. The first step is to introduce into the chamber the carbon material precursor gas (e.g., a hydrocarbon or fluorocarbon or fluorohydrocarbon or other carbon-containing gas)-(block 6132 of FIG. 14). This process gas may also include species that enhance the toroidal plasma CVD process without necessarily being added into the deposited (carbon) layer, such as an inert gas, for example. A precursor gas of the desired additive species (to be included in the CVD deposited carbon layer) is introduced into the chamber (block 6133 of FIG. 14). The additive species may, for example, be a precursor of boron (B2H6), or nitrogen or hydrogen or sulfur (H2S) or another desired species. Also, the additive species precursor gas may contain precursor gases for two (or more) different additive species, for their inclusion in the CVD deposited carbon layer. Then, the toroidal plasma CVD process is carried out in the chamber (block 6134) by performing steps 6111, 6113, and (optionally) 6115, 6117 of FIG. 10. The relative gas flow rates of the carbon precursor process gas and the additive (e.g., boron) precursor gas will determine the proportion of the additive species in the CVD deposited carbon layer. FIG. 15 illustrates a variation of the process of FIG. 14, in which only the carbon material precursor gas is first introduced (block 6132) before the toroidal plasma CVD process is begun (block 6135). The toroidal plasma CVD process is carried out without the additive species precursor gas for a sufficient time to deposit a carbon layer devoid of the additive species to a desired threshold thickness (block 6135). At this point in the process, the additive species precursor gas is introduced into the chamber while continuing the toroidal source CVD process (block 6136) so that the remaining (upper) portion of the deposited carbon-containing layer includes the additive species.

Figure 16:
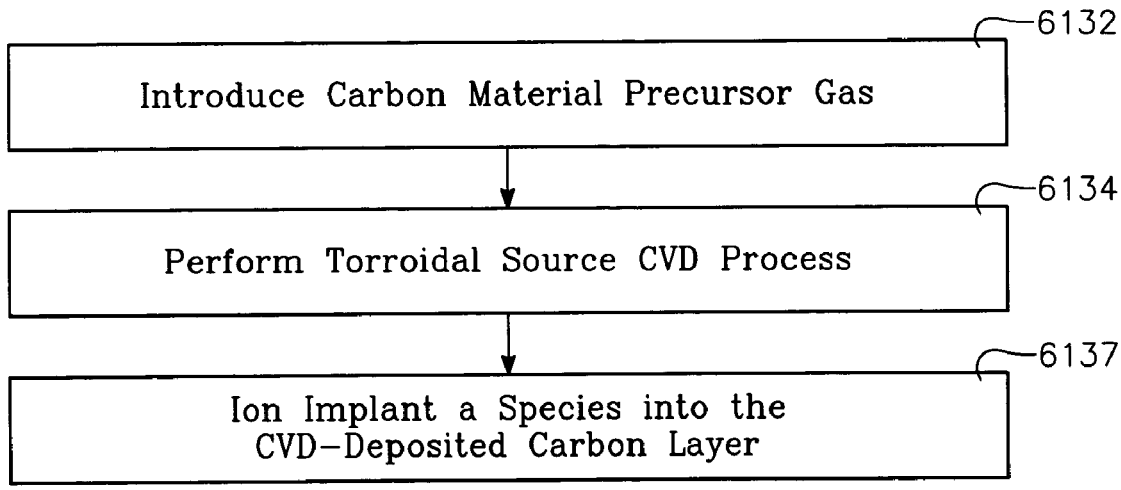
FIG. 16 is a block diagram of yet another embodiment of the process of FIG. 10.
Figure 17:
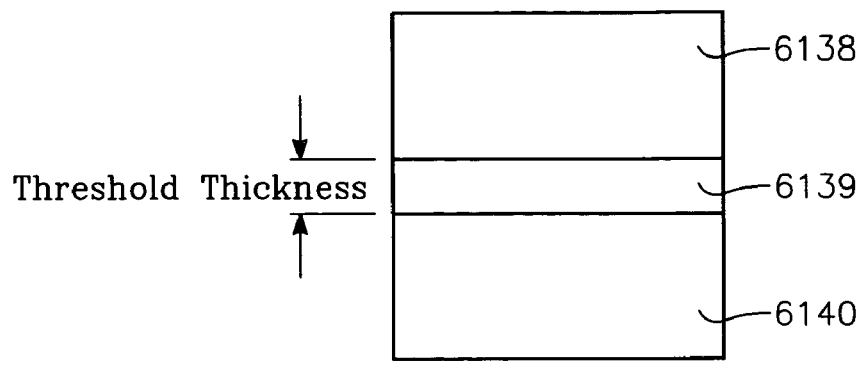
FIG. 17 is a cross-sectional view of a thin film structure formed by the process of either FIG. 15 or FIG. 16.
Figure 18:
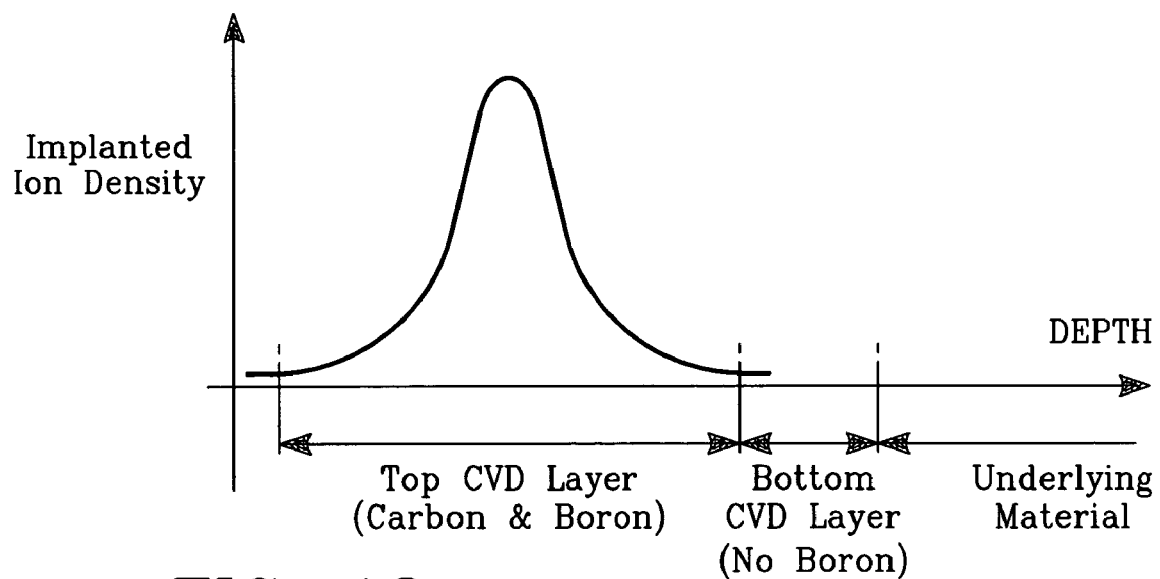
FIG. 18 is a graph depicting the implanted ion density as a function of depth below the wafer surface in the process of either FIG. 15 or FIG. 16.

FIG. 16 illustrates another variation of the process of FIG. 10 in which the post-CVD wafer treatment step of block 6119 is an ion implantation step. In the process of FIG. 16, the carbon material precursor process gas is introduced into the chamber (block 6132) and the toroidal plasma CVD process is carried out on the wafer. Thereafter, an ion implantation process is performed on the wafer (block 6137) in which a desired species is implanted into the CVD deposited carbon-containing layer. The desired species may be the additive species (one or more) which (like boron) is chemically active to produce certain desired properties in the CVD deposited carbon-containing layer. The desired species may be an ion bombardment species (such as an inert species) that changes the properties of the CVD deposited carbon-containing layer by ion bombardment damage. In any case, the ion implantation depth profile of the implanted species is set to confine the implanted species within the CVD deposited carbon-containing layer. For example, the ion implantation depth profile or distribution may have its peak value set at or near an intermediate (e.g., middle) depth in the CVD deposited carbon-containing layer. Or, if it is desired to have an additive-free layer of carbon contacting the base layer (or silicon wafer surface) with an overlying carbon layer containing the additive species, then the ion implantation depth profile may be centered at an upper depth in the CVD carbon-containing layer so that little or no ion implantation occurs below the threshold depth. The result of this latter option is illustrated in FIG. 17, which depicts an underlying layer 6140, a bottom carbon-containing layer 6139 devoid of the additive species and having a threshold thickness, and an overlying carbon-containing layer 6138 that includes the additive species. The layered structure of FIG. 17 is also realized in the two-phase toroidal plasma CVD process of FIG. 15. FIG. 18 depicts the ion implantation depth profile for the step of block 6137 of FIG. 16. Essentially, the ion implantation is confined to depths well-above the underlying (e.g., wafer) surface. This may be accomplished (optionally) by leaving un-implanted a bottom carbon-containing layer (the layer 6139 of FIG. 17) by shifting the ion distribution peak away from the bottom surface, as shown in FIG. 18.

Figure 19:
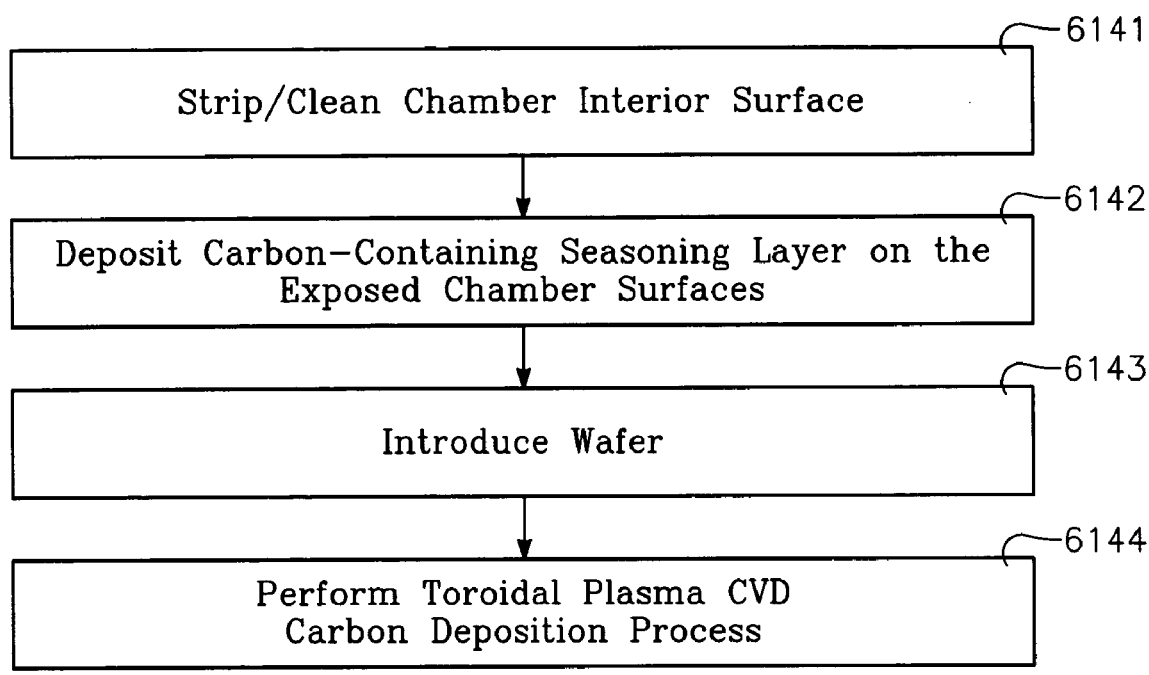
FIG. 19 is a block diagram illustrating a yet further embodiment of the process of FIG. 10.

FIG. 19 depicts how any of the processes of FIGS. 14, 15 or 16 may be modified by incorporating a chamber strip or clean step 6141 and a chamber seasoning CVD deposition step 6142, which may be performed either before or after the toroidal plasma CVD process of FIG. 14, 15, or 16. In FIG. 19, the strip and seasoning steps are depicted as being performed prior to the toroidal plasma CVD process. First, prior to introduction of the wafer into the reactor chamber of FIG. 9, a process gas is introduced into the chamber containing species capable of stripping deposited films from the exposed chamber interior surfaces (block 6141 of FIG. 19). In the processes of FIGS. 14, 15 and 16 the materials deposited on the interior chamber surfaces consists mainly of carbon, so that the cleaning or strip process gas used in the step of block 6141 may consist mainly of oxygen, for example. Other or additional cleaning gas species may include fluorine, for example. Thereafter, the strip or cleaning process gas is removed from the chamber, and a seasoning layer is deposited on the exposed interior chamber surfaces of the reactor of FIG. 9 (block 6142 of FIG. 19).

The step of block 6142 is carried out using the same toroidal plasma CVD process described above. Specifically, a carbon precursor gas is introduced as a seasoning layer precursor gas into the chamber and a toroidal plasma is generated in the chamber. This produces a CVD deposited carbon-containing seasoning layer on the exposed chamber interior surfaces. If it is desired to enhance the hardness or durability of this seasoning layer, then fluorine may be included as a species of the seasoning layer precursor gas. For example, the seasoning layer precursor gas may include a fluorocarbon gas or a fluoro-hydrocarbon gas. The major component of the seasoning layer precursor gas may be a hydrocarbon gas. After the seasoning layer has reached a desired thickness on the interior chamber surfaces, the wafer is introduced into the chamber (block 6143 of FIG. 19) and the toroidal plasma CVD process of FIGS. 10, 14, 15 or 16 is carried out (block 6144 of FIG. 19).

Deposition of a Carbon Film by the Toroidal Source CVD Process:

The present invention is useful for depositing films such as carbon-based films of particular optical properties (at UV, infrared and visible wavelengths, i.e., "optical" wavelengths) or of particular electrical properties (e.g., in applications where optical properties are not of particular interest) such as conductivity or complex permittivity. Both electrical and optical properties of such films are adjusted to meet the particular need. The present invention is also useful for depositing films such as carbon-based films where subsequent strippability of the deposited carbon-based film layers is required with selectivity with respect to silicon or other underlying layer. The present invention is also useful for depositing films such as carbon-based films where conformality control is required, for void-free gap fill applications. The present invention is also useful for depositing films such as carbon-based films where stress control is required.

Hydrogen-Carbon films:

Carbon films of different electrical and optical properties may be deposited on wafers using the toroidal plasma source reactor of FIG. 1. The process gas is introduced through the gas distribution plate 18 (or through side nozzles 20) of FIG. 1. The process gas may be a hydrocarbon gas selected from one (or more) of the hydrogen-carbon gases listed earlier in this specification. The RF toroidal plasma current generated in the chamber from such a gas causes a hydrogen-containing carbon material to be deposited on the surface of the wafer. The film may be essentially pure carbon with only a negligible amount of hydrogen atoms. Generally, however, the proportion of bonded hydrogen atoms is significant, so that the deposited material is hydrogenated carbon. The electrical conductivity of the deposited film may be set within a range between insulative and semiconductive. The optical properties of the deposited layer for a selected wavelength band may be set within a range between highly absorptive and transparent. The permittivity may be selected to be "real" (i.e., having a small "imaginary" component relative to "real" component) with a magnitude within a low to high range. The permittivity may be selected to have a significant "imaginary" component relative to the "real" component with a magnitude within a low to high range. These electrical and optical properties may be controlled by any one or a combination of some or all of the following actions:

(1) adjusting the ion bombardment energy at the wafer surface,
(2) adjusting the wafer temperature,
(3) selecting the hydrogen-carbon gas species of the process gas (selecting the hydrogen-carbon ratio of the gas),
(4) diluting the process gas with hydrogen,
(5) diluting the process gas with an inert gas such as helium, neon, argon or xenon,
(6) adjusting the flux of energetic ions (carbon-containing or other) at the wafer surface relative to the flux of carbon-containing radical species to the wafer surface,
(7) adding to the process gas a precursor additive gas of one of: (a) a semi-conductivity-enhancing species, (b) a resistivity-enhancing species;
(8) implanting in the deposited carbon layer one of: (a) a semiconductivity-enhancing species, (b) a resistivity-enhancing species.

Adjustment of the ion bombardment energy at the wafer surface may be done by adjusting RF bias power, RF bias voltage or wafer voltage, and/or chamber pressure, while adjustment of the flux of energetic ions at the wafer surface may be done by adjusting RF plasma source power and/or chamber pressure and/or dilution gas flow.

Energetic ion flux adjustment: at constant bias voltage and constant pressure, increasing the RF plasma source power increases the flux of energetic ions at the wafer surface. Radical flux at the wafer surface also increases with source power. However, at lower to moderate pressure (i.e., mtorr pressure to several hundred mtorr), the ratio of energetic ion flux relative to radical flux at the wafer still typically increases (but is still much less than unity). Increasing RF plasma source power at constant bias voltage, while decreasing pressure, further increases the ratio of energetic ion flux relative to radical flux at the wafer. At constant source power and bias voltage, diluting the process gas with argon or xenon tends to increase the flux of energetic ions at the wafer surface, while diluting with helium or neon tends to decrease the flux of energetic ions at the wafer surface. The effect is intensified as ratio of dilution gas flow rate with respect to process gas flow rate is increased. At lower to moderate pressure (i.e., mtorr pressure to several hundred mtorr), increasing pressure at constant RF plasma source power and bias voltage increases the flux of energetic ions at the wafer surface.

Ion energy adjustment: at constant RF plasma source power, increasing RF bias power or voltage increases ion bombardment energy at the wafer surface. At constant RF plasma source power and RF bias voltage and at lower to moderate pressure (i.e., mtorr pressure to several hundred mtorr), increasing the pressure decreases ion energy, though the effect is not necessarily large. At constant RF plasma source power and RF bias power and at lower to moderate pressure (i.e., mtorr pressure to several hundred mtorr), increasing the pressure decreases ion energy with larger effect, as the bias voltage (at constant bias power) is reduced due to the loading effect of the higher plasma ion and electron density.

Selecting the hydrogen-carbon gas species of the process gas (selecting the hydrogen-carbon ratio of the gas) affects the optical and electrical properties of the deposited material. Decreasing the hydrogen-carbon ratio of the gas typically decreases the C:H bonding and increases the C:C bonding, which increases the optical absorption (decreases transparency) and increases electrical conductivity. It also tends to increase the "imaginary" component of permittivity relative to "real" component. For example, $C_3H_6$ may produce a deposited layer with greater optical absorption and/or electrical conductivity than $CH_4$, and $C_4H_6$ may provide a deposited layer with greater optical absorption and/or electrical conductivity than C3H6. Diluting the process gas(es) with hydrogen affects the optical and electrical properties of the deposited material. Decreasing the hydrogen dilution typically decreases the C:H bonding and increases the C:C bonding, which increases the optical absorption (decreases transparency) and increases electrical conductivity. It also tends to increase the "imaginary" component of permittivity relative to "real" component. In addition to the foregoing steps for adjusting the optical absorption of the deposited carbon material, optical absorption may be enhanced by including certain additive materials in the deposited material such as boron, nitrogen or sulfur. Any of these materials may be added by including precursor gases such as B2H6, N2 or H2S, respectively, in the process gases. Adding material such as boron, nitrogen or sulfur to the process gases also substantially improves the thermal stability of the deposited carbon material, allowing it to be rapidly heated to high temperature (>1400 degree C.) without failure.

Material additions can enhance optical absorption, thermal stability, and/or electrical conductivity and/or permittivity of the deposited material. The ratio of hydrogen to boron, nitrogen or sulfur in the additive gas affects the properties of the deposited layer. Typically decreasing the hydrogen-to-other-element ratio of the gas typically decreases the C:H bonding and increases the C:C bonding, which increases the optical absorption (decreases transparency) and increases electrical conductivity. It also tends to increase the "imaginary" component of permittivity relative to "real" component. For higher optical absorption or electrical conductivity, B5H9 (as compared to B2H6) or N2 (as compared to NH3) may increase absorption or conductivity to a greater degree. B2H6 typically must be diluted (in the gas bottle) due to its higher reactivity for safety reasons, and is commercially available diluted with helium, argon, hydrogen or nitrogen. Hydrogen-diluted-B2H6 typically provides greater enhancement of optical absorption and electrical conductivity than does helium-diluted-B2H6. Argon-diluted-B2H6 may provide even greater enhancement of optical absorption and electrical conductivity than does helium- or hydrogen-diluted B2H6. Nitrogen-diluted-B2H6 can also provide greater enhancement of optical absorption and electrical conductivity than does helium- or hydrogen-diluted-B2H6, and can provide a synergistic benefit as described below. B5H9 does not require dilution, and has a higher B-to-H ratio than B2H6, so may provide a greater enhancement of optical absorption and electrical conductivity than does helium- or hydrogen-diluted-B2H6. The factors mentioned above which increase conductivity also tend to increase the "imaginary" component of permittivity relative to "real" component. Alternatively, the post-CVD ion implantation step described above may be performed with one of the absorption-enhancement species (B, N or S) by implanting that species into the deposited carbon layer. If this post-CVD implantation step is carried out by plasma immersion ion implantation using the toroidal plasma source reactor of FIG. 1 for example, then the same process gas may be employed as above (e.g., B2H6, N2 or H2S).

There is a synergistic benefit of adding (a) boron (i.e., B2H6) plus (b) N2 or other form of nitrogen to the basic amorphous carbon precursor hydrocarbon gas (i.e., C3H6). Thermal stability (i.e., the thermal properties) of the deposited carbon layer is improved at 450 degrees C. and especially higher temperatures. Specifically, the deposited amorphous carbon layer may be laser heated at least to the melting point of silicon without delamination of the deposited layer, or peeling, etc. This feature (of adding boron and nitrogen) actually reduces the threshold wafer voltage or threshold ion energy typically required to avoid delamination or peeling. The foregoing feature, for improving the deposited layer thermal properties, of combining boron and nitrogen additives in the hydrocarbon gas may be employed when depositing an amorphous carbon layer having particular electrical properties controlled in the manner described above. It may also be employed for depositing a carbon layer that is not an optical absorber. It is believed that adjustment of the properties of the deposited carbon layer is based upon: (1) adjustment of the proportion of bound hydrogen atoms in the carbon layer, that is, proportion of C:H bonds out of the total atomic bonds in the deposited carbon layer and (2) the length of the C:C chains and (3) the bonding hybridization of the carbon atoms and the relative concentration of the different bonds, i.e., $sp^3:s^2p:sp^1$. It is further believed that increasing the ion energy at the wafer surface and increasing the energetic ion flux at the wafer surface and increasing the wafer temperature can have the effect of (1) breaking more C:C chains (to produce shorter ones) and (2) breaking more C:H bonds (to reduce their presence) and forming more C:C bonds and (3) changing the bonding hybridization of the carbon atoms and the relative concentration of the different bonds, i.e., $sp^3:sp^2:sp^1$. By reducing the hydrogen content in the process gases in the reactor chamber, the number of C:H bonds formed in the deposited carbon layer is reduced.

Reduction in the length of the C:C chains changes the state of the deposited material from a soft polymer to a hard amorphous carbon. With a reduction in the number of C:H bonds in the deposited carbon layer, the electrical conductivity changes from relatively insulative to semiconductive, while the optical properties change from relatively transparent to relatively opaque. Thus, the electrical conductivity of the deposited carbon layer may be set anywhere within a range between insulative and semiconductive, while its optical properties may be set anywhere within a range between transparent and opaque, in the toroidal plasma CVD process.

The reduction or breaking of C:C bonds and/or C:H bonds by ion bombardment may require very high ion energies (e.g., on the order of 100 eV to 1 keV). Polymer carbon (with long polymer chains) tends to be formed at low (less than 100 degrees C.) wafer temperatures. The length of the polymer chains is reduced by ion bombardment, even at the low wafer temperature. Alternatively, the wafer temperature may be increased during the toroidal plasma CVD process (e.g., to 400 degrees C.) to keep the C:C chain length short. The very high ion energy required to modify the optical and electrical properties of the deposited carbon layer (requiring high RF bias power) has the effect of enhancing adhesion of the carbon layer to the underlying wafer or thin film structures previously formed on the wafer, by forming high quality atomic bonds between the deposited carbon layer and the underlying material. It also enhances the resistance of the deposited film to mechanical failure or separation induced by thermal stress (e.g., very high temperatures), by generating compressive stress in the deposited carbon layer. It also increases the mechanical hardness of the film. Applying high bias voltage (i.e., >1 kV) substantially improves the thermal stability of the deposited carbon material, allowing it to be rapidly heated to high temperature (>1400 degrees C.) without failure. In addition to heating the wafer during the toroidal plasma CVD process, an additional method for enhancing the optical absorption of the deposited carbon layer is to heat the wafer to about 400 degrees C. after completion of the CVD process. It is believed that this step enhances optical absorption by the same mechanism of breaking up C:H bonds and forming more C:C bonds in the deposited carbon layer and changing the bonding hybridization of the carbon atoms and the relative concentration of the different bonds, i.e., $sp^3:sp^2:sp^1$.

Adding an inert dilution gas to the hydrogen-carbon precursor gas may modify the electrical and optical properties of the film. Adding helium or neon, for example, makes the film more transparent (and more insulating), while adding argon or xenon makes the film more opaque (and more semiconducting). It is believed, for a constant RF source power and RF bias voltage, that the helium addition decreases the ion flux while adding argon or xenon increases the ion flux. Increasing the energetic ion flux tends to decrease the optical transparency and electrical resistivity of the film. The factors mentioned above which increase conductivity also tend to increase the "imaginary" component of permittivity relative to "real" component. Increasing the RF bias voltage at constant RF source power increases the ion energy of ions impinging on the wafer surface, which tends to decrease the optical transparency and electrical resistivity of the film. It also tends to increase the "imaginary" component of permittivity relative to "real" component. Increasing the RF source power at constant RF bias voltage increases the energetic ion flux to the wafer surface, which tends to decrease the optical transparency and electrical resistivity of the film. It also tends to increase the "imaginary" component of permittivity relative to "real" component. Increasing the gas pressure at constant RF source power and RF bias voltage increases the energetic ion flux to the wafer surface, which tends to decrease the optical transparency and electrical resistivity of the film. It also tends to increase the "imaginary" component of permittivity relative to "real" component.

The conformality of the deposited carbon layer is adjusted by adjusting the RF plasma source power. Adjusting deposited layer conformality by adjusting source power is described above in this specification. The stress of the deposited carbon layer is adjusted by adjusting the RF plasma bias power. Adjusting deposited layer stress by adjusting bias power is described above in this specification.

Fluoro-Carbon Films:

A fluoro-carbon process gas, selected from one of the fluoro-carbon gases listed earlier in this specification, may be employed as the CVD process gas, instead of a hydrogen-carbon gas, to deposit a fluorine-containing carbon layer on the wafer. Such a layer tends to be transparent across a wide band of wavelengths. A fluorine-containing carbon layer is useful where a very low-dielectric constant is desired in the deposited carbon layer. It is also useful where a transparent carbon layer is desired. It is also useful where a highly insulating carbon film is desired. It is also useful where a lower permittivity, having a small "imaginary" component relative to "real" component, is desired. For fluorocarbon film, preferred fluorcarbon gases are C4F6 or C3F6. Other fluorocarbon gases include C2F4, C2F6, C3F8, C4F8 and C5F8. The process may be used to deposit fluoro-hydrocarbon films. For fluoro-hydrocarbon films, fluoro-hydrocarbon gases such as CH2F2 may be used. Alternatively, the process may be used to deposit a film which is a combination of hydrocarbon and fluorocarbon materials, in which case combinations of suitable hydrocarbon and fluorocarbon gases may be employed as the process gas. Such fluorine-containing films may be amorphous or polymer. Such fluorine-containing films tend to be transparent, depending upon the fluorine content. Such films may have a very low dielectric constant, depending upon fluorine content. Films containing both fluorocarbons (or fluoro-hydrocarbons) and hydrocarbons may vary between transparent and absorbing depending upon the relative hydrogen and fluorine content.

The properties of the fluorine-containing carbon layer may be controlled in a manner similar to that described above for hydrogen-containing carbon layers, by controlling the length of carbon-carbon chains and by controlling the proportion and type of F:C bonds in the carbon film. The properties may be controlled by any one or a combination of some or all of the following actions:

(1) adjusting the ion bombardment energy at the wafer surface,
(2) adjusting the wafer temperature,
(3) selecting the fluorine-carbon gas species of the process gas (selecting the fluorine-carbon ratio of the gas),
(4) diluting the process gas with fluorine,
(5) diluting the process gas with an inert gas such as helium, neon, argon or xenon,
(6) adjusting the flux of energetic ions (carbon-containing or other) at the wafer surface relative to the flux of carbon-containing radical species to the wafer surface,
(7) adding to the process gas a precursor additive gas of one of: (a) a semi-conductivity-enhancing species, (b) a resistivity-enhancing species;
(8) implanting in the deposited carbon layer one of: (a) a semiconductivity-enhancing species, (b) a resistivity-enhancing species.

Adjustment of the ion bombardment energy at the wafer surface may be done by adjusting RF bias power, wafer voltage and/or chamber pressure, while adjustment of the flux of energetic ions at the wafer surface may be done by adjusting RF plasma source power and/or chamber pressure and/or dilution gas flow.

Energetic ion flux adjustment: at constant bias voltage and constant pressure, increasing the RF plasma source power increases the flux of energetic ions at the wafer surface. Radical flux at the wafer surface also increases with source power. However, at lower to moderate pressure (i.e., mtorr pressure to several hundred mtorr), the ratio of energetic ion flux relative to radical flux at the wafer still typically increases (but is still much less than unity). Increasing RF plasma source power at constant bias voltage, while decreasing pressure, further increases the ratio of energetic ion flux relative to radical flux at the wafer. At constant source power and bias voltage, diluting the process gas with argon or xenon tends to increase the flux of energetic ions at the wafer surface, while diluting with helium or neon tends to decrease the flux of energetic ions at the wafer surface. The effect is intensified as ratio of dilution gas flow rate with respect to process gas flow rate is increased. At lower to moderate pressure (i.e., mtorr pressure to several hundred mtorr), increasing pressure at constant RF plasma source power and bias voltage increases the flux of energetic ions at the wafer surface.

Ion energy adjustment: at constant RF plasma source power, increasing RF bias power or voltage increases ion bombardment energy at the wafer surface. At constant RF plasma source power and RF bias voltage and at lower to moderate pressure (i.e., mtorr pressure to several hundred mtorr), increasing pressure decreases ion energy, though the effect is not necessarily large. At constant RF plasma source power and RF bias power and at lower to moderate pressure (i.e., mtorr pressure to several hundred mtorr), increasing pressure decreases ion energy with larger effect, as the bias voltage (at constant bias power) is reduced due to the loading effect of the higher plasma ion and electron density. The conformality of the deposited fluoro-carbon layer is adjusted by adjusting the RF plasma source power. Adjusting deposited layer conformality by adjusting source power is described above in this specification. The stress of the deposited fluoro-carbon layer is adjusted by adjusting the RF plasma bias power. Adjusting deposited layer stress by adjusting bias power is described above in this specification.

A combination of a fluoro-carbon gas and a hydrogen-carbon gas may be used as the process gas to form a carbon layer containing both fluorine and hydrogen in a desired proportion. This proportion may be used to realize a desired conductivity or absorption in the deposited carbon layer. The same methods described immediately above for regulating the proportion of C:H and C:F bonds in the individual C:F and C:H deposited materials may be used to control the proportion of C:H and C:F bonds in the combination C:F+C:H deposited carbon material. A carbon layer containing both hydrogen and fluorine may also be formed by adding a non-fluorocarbon gas containing fluorine to a hydrocarbon gas in a plasma process using the toroidal source. For example, F2 or BF3 or SiF4 or NF3 may be added to a hydrocarbon gas. Conversely, a carbon layer containing both hydrogen and fluorine may also be formed by adding a non-hydrocarbon gas that contains hydrogen to a fluorocarbon gas in a plasma process using the toroidal source. For example, H2 or B2H6 or SiH4 or NH3 may be added to a fluorocarbon gas.

Low Temperature Deposition of an Optical Absorber Layer:

An optical absorber layer (OAL), which may be an amorphous carbon layer (ACL), is deposited using the toroidal plasma source low temperature CVD process described above. The process gas that is introduced into the chamber is a carbon-precursor gas if the OAL is an ACL. We have discovered that absorption in the amorphous carbon material at the wavelength of interest (e.g., 810 nm) can be enhanced by adding impurity materials to the carbon. One example of such an impurity material that renders amorphous carbon opaque at 810 nm is boron. In such a case, the process gas consists of a carbon precursor gas such as propylene (for example) and a boron precursor gas (such as B2H6) and a diluent gas for the B2H6, such as hydrogen. Although helium could be used as the diluent gas, we have found that optical qualities of the amorphous carbon layer are enhanced best in the presence of hydrogen.

Figure 20:
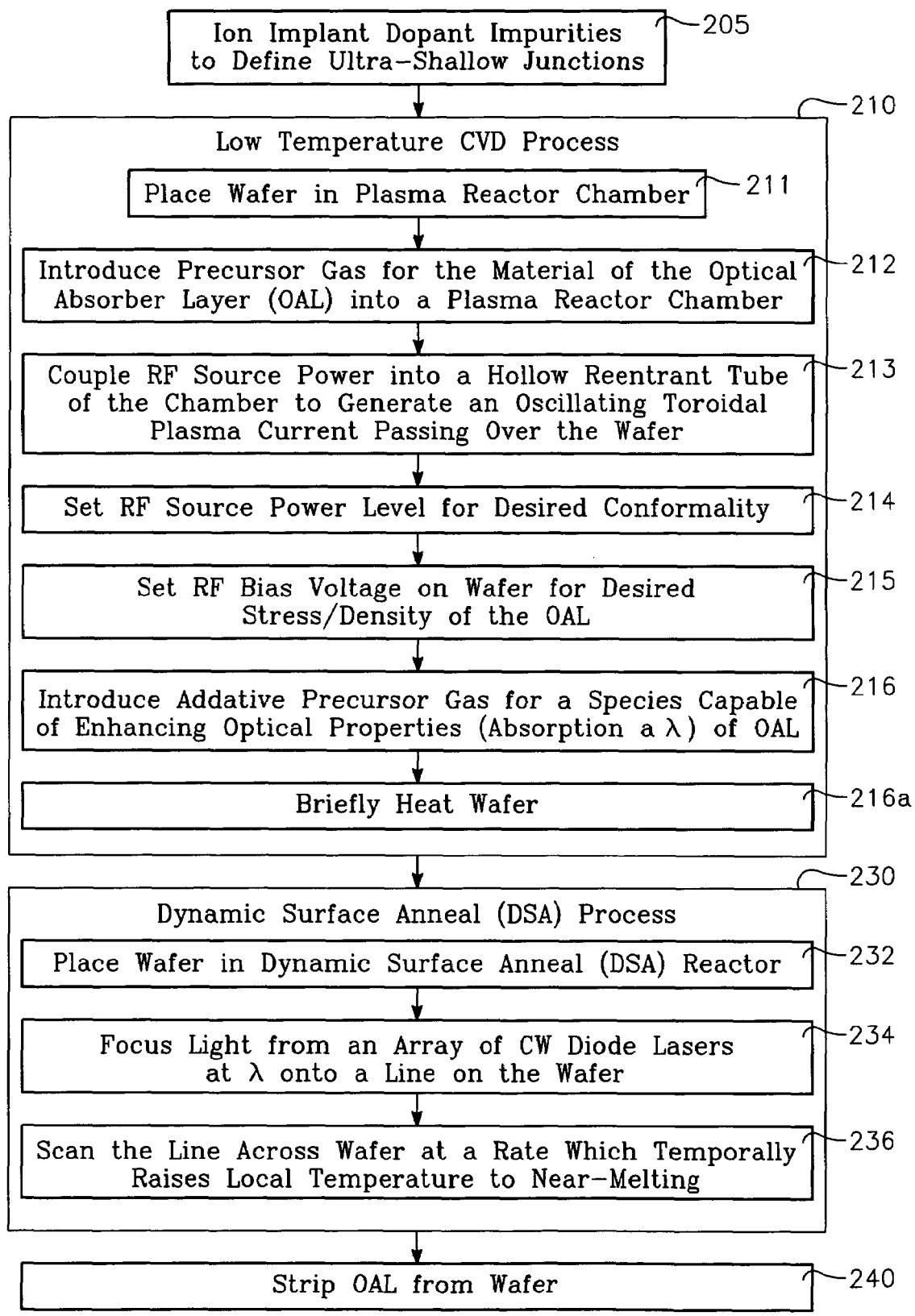
FIG. 20 is a block diagram of a process for forming ultra-shallow junctions.

FIG. 20 is a block diagram of a junction formation process including the low temperature CVD step of the toroidal plasma source reactor of FIG. 9 for forming the optical absorber layer (OAL) followed by a high speed optical anneal step such as the dynamic surface anneal (DSA) process of the light source of FIGS. 1-8. The first step (block 205 of FIG. 20) is to ion implant dopant impurities into a semiconductor material, such as crystalline silicon. For device geometries smaller than 65 nm, this dopant ion implantation step defines ultra-shallow junctions in which the dopant-implanted regions extend no further than a few hundred Angstroms. The dopant implant step 205 may be carried out with a conventional beam line implanter or, more preferably, using a plasma immersion ion implantation (P3i) process employing the type of toroidal source reactor depicted in FIG. 9, as described in United States Patent Application Publication No. 2004/0200417 by Hiroji Hanawa et al., published Oct. 14, 2004. The next step (block 210 of FIG. 20) is to carry out a low temperature chemical vapor deposition process in the toroidal plasma source reactor of FIG. 9 to form an optical absorber layer over the wafer. The CVD process of block 201 consists of the following steps. First, the wafer is placed on the electrostatic chuck of the reactor of FIG. 9 (block 211). A process gas is introduced into the reactor chamber (block 212). The process gas consists of a precursor for the material of the OAL. For example, if the OAL is to be amorphous carbon, then the process gas is (or includes) a precursor for carbon. Such carbon precursor gases have been discussed earlier in this specification, and can be any one of (or combination of) the carbon-containing gases listed earlier herein, including methane, acetylene, ethylene, ethane, propylene, propane, ethyl-acetylene, 1,3-butadiene, 1-butene, n-butane, pentane, hexane, toluene, methyl benzene or 1-butyne, or other suitable carbon precursors. In the next step (block 213), RF plasma source power is applied by the RF generators 30, 30' to generate toroidal plasma currents in the reentrant tubes 22, 22' of FIG. 9. Chucking voltage is applied to the electrostatic chuck to clamp the wafer, providing tight electrical and thermal coupling between wafer and electrostatic chuck. The RF source power levels of the generators 30, 30' are set to realize a desired degree of conformality in the deposited film (block 214). An RF bias voltage may be applied by the RF generator 44 to the wafer, and its power or voltage level is adjusted to realize the desired stress level in the deposited layer (block 215 of FIG. 20). In this step, the density of the deposited layer may be increased by increasing the compressive stress in the deposited layer. This requires an increase in the bias power or voltage, as described earlier in this specification with reference to FIG. 13. Preferably, an additive gas is introduced into the chamber which is a precursor for a species that, when included in the deposited OAL, enhances an optical property of the OAL (block 216). Typically, this optical property is absorption or opacity at the wavelength of the DSA light source (e.g., 810 nm). If the OAL is amorphous carbon, then the enhancing species may be boron, for example, or nitrogen, hydrogen or other examples referred to earlier in this specification. After the deposition process step is complete, the wafer is dechucked, typically by setting the chucking voltage to zero or to a dehucking voltage, then the lift pins raise the wafer from the electrostatic chuck, and then the RF source and/or bias power is turned off.

The absorption-enhancing step of block 216 may consist of heating the wafer very briefly (for a matter of seconds or fraction of a minute) to a moderately hot temperature (e.g., 450 degrees C.) (block 216a). This heating step, which may be carried out in a separate reactor after deposition of the OAL, may increase the optical k value (extinction coefficient) from about 0.3 to 0.36 in some process examples. The OAL may be deposited to a thickness between about 0.25 micron and about 1 micron. Upon completion of the OAL deposition process of block 210, the dynamic surface annealing (DSA) process is performed (block 230 of FIG. 20). The wafer is placed in a DSA chamber (block 232), and light from the array of CW diode lasers is focused to a thin line on the wafer by the light source of FIGS. 1-8 at a particular wavelength (e.g., 810 nm) (block 234). This line of light is scanned transversely across the entire wafer (block 236). The rapid heating of the wafer in this step has been previously described in this specification. Upon completion of the DSA step of block 230, the OAL is stripped from the wafer (block 240). This step may employ a conventional strip chamber consisting of a heated wafer support and an oxygen gas (radical) source. Preferably, however, the strip chamber is a toroidal source plasma reactor of the type illustrated in FIG. 9, in which the process gas consists of oxygen and/or nitrogen gas is introduced and a plasma is generated with plasma source power. The wafer may also be heated (with heated wafer chuck or plasma-heated) and/or be biased to improve removal of the OAL or amorphous carbon layer.

Figure 21:
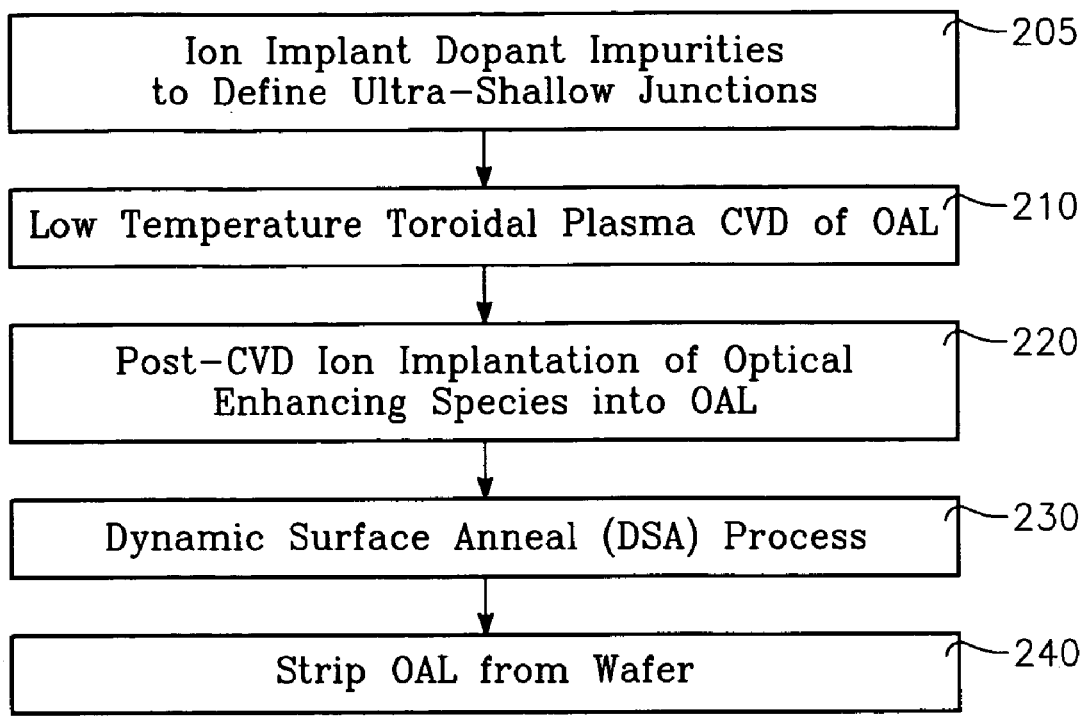
FIG. 21 is block diagram of an alternative embodiment of the process of FIG. 20.
Figure 22:
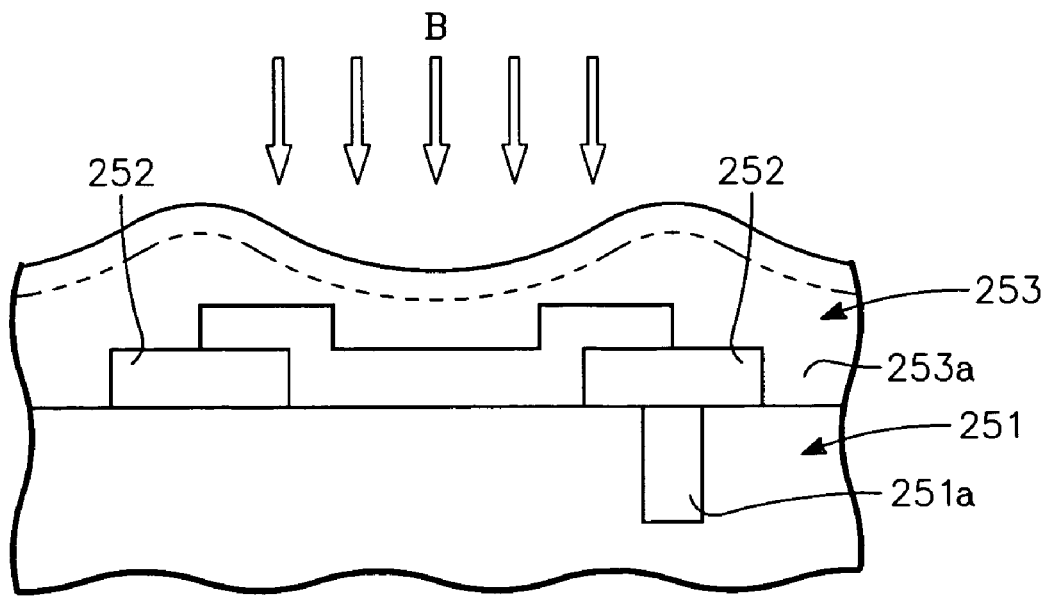
FIG. 22 is a cross-sectional view of a thin film structure formed in the process of FIG. 21.

The optical absorption-enhancing species may be put into the OAL by post-CVD ion implantation step, as distinguished from the step of block 216 in which they are put into the OAL during the CVD deposition process by including them in the process gas. In such a case, the process of FIG. 20 is modified as shown in FIG. 21, in which, after completion of the low temperature OAL CVD step of block 210 and before the DSA step of block 230, a post-CVD ion implantation step 220 is performed in which an optical absorption-enhancing species (such as Boron) is implanted into the OAL. For this purpose, a convention beam line ion implanter may be used, or, preferably, a P3i toroidal source plasma reactor (FIG. 9) is employed in the manner described in the above-reference published application by Hanawa et al. This step is depicted in FIG. 22, in which a wafer 251 has an overlying thin film structure 252 that includes dopant-implanted regions. The wafer 251 and thin film structure 252 are covered by an amorphous carbon OAL 253 formed in the step of block 210. The post-CVD ion implant step of block 220 is carried out by accelerating ions (e.g., boron ions) into the OAL 253, as indicated in FIG. 22. In order to avoid introducing boron into the previously-formed ultra-shallow junctions, it is necessary for the ion implantation depth profile of the boron to be well-above the bottom of the OAL 253. FIG. 23A depicts the semiconductor (silicon) layer or wafer 251 having a dopant-implanted region 251a, the thin film structure 252 and the OAL 253. FIG. 23B depicts the ion implantation concentration depth profile of the optical absorption enhancing species within the OAL 253. The implanted ion (boron) concentration ramps downwardly with depth and reaches nearly zero above the bottom of the OAL 253, leaving a bottom OAL layer 253a un-implanted. This feature can have two advantages. One is that contamination of the underlying semiconductor layer 251 by the ion implanted absorption-enhancing species is prevented by the presence of the non-implanted bottom OAL layer 253a. Another is that leaving the bottom OAL layer 253a pure may enhance the quality or strength of the adhesion or bonding between the OAL and the underlying material. While FIG. 23B depicts an implantation profile that is sloped or ramped, the ion implantation profile may be made to be sharper, so that the entire implanted (upper) region of the OAL 253 can have a nearly uniform (rather than ramped) distribution of implanted species as a function of depth.

Figure 24:
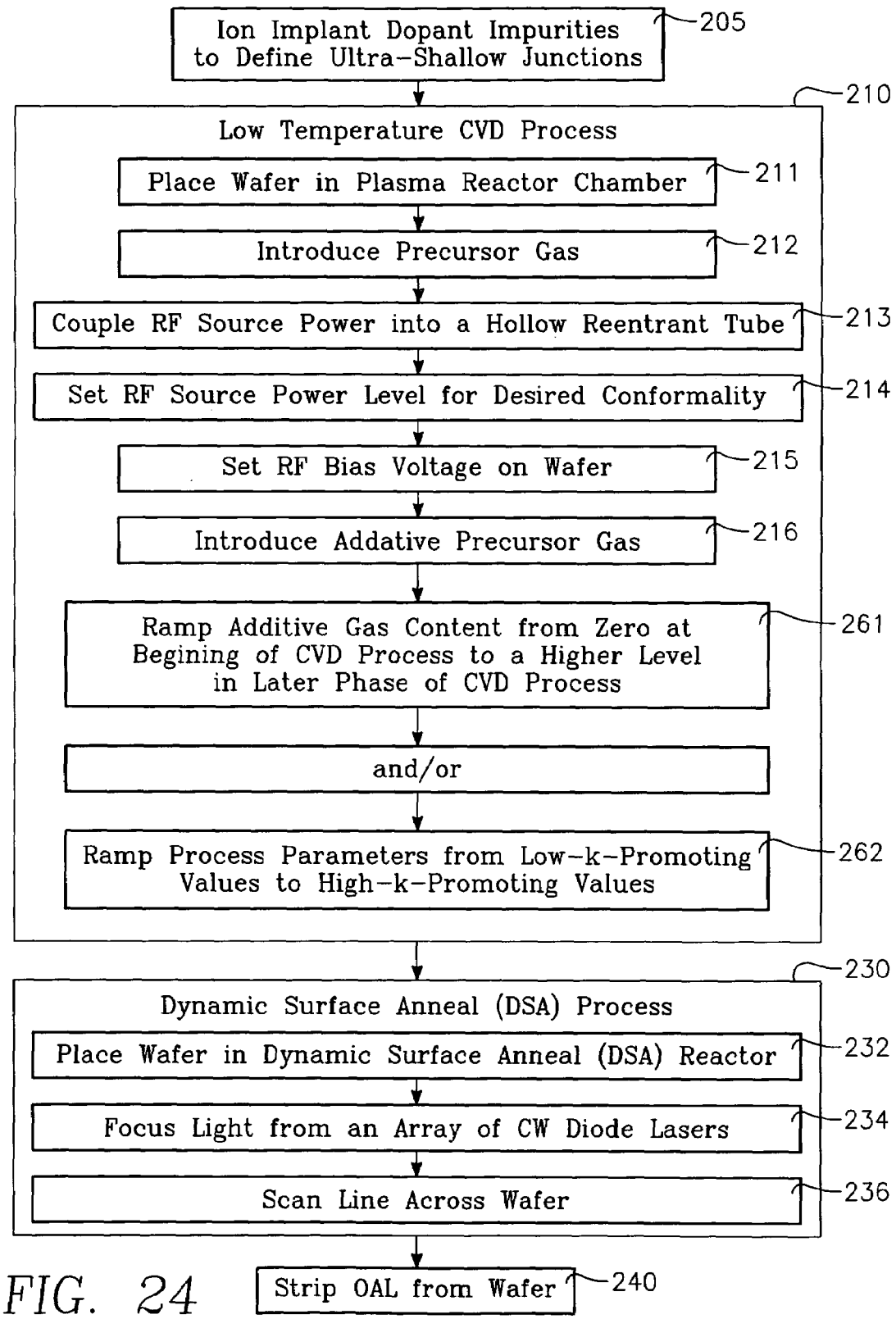
FIG. 24 is a block diagram of an alternative embodiment of the process of FIG. 20.
Figure 25:
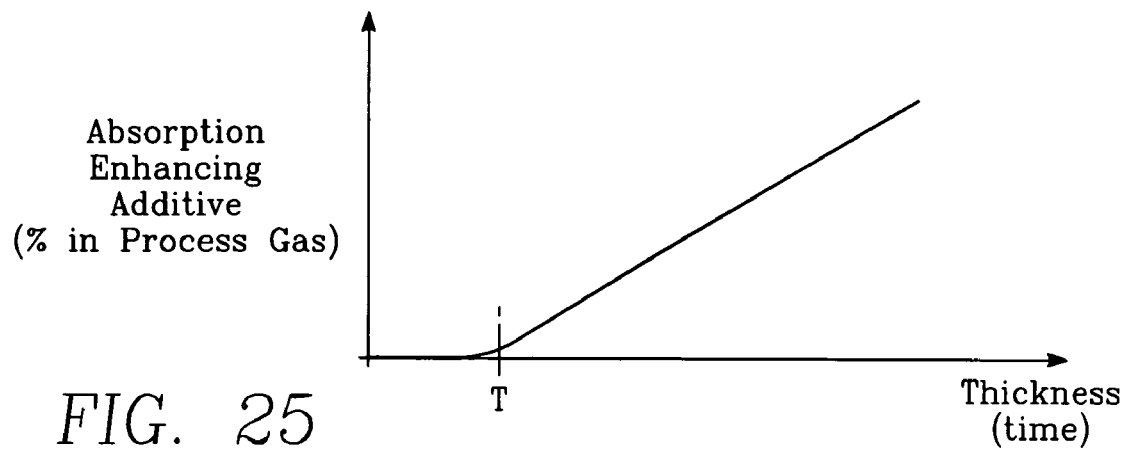
FIG. 25 is a graph of the additive gas flow rate as a function of time in the process of FIG. 24.
Figure 26:
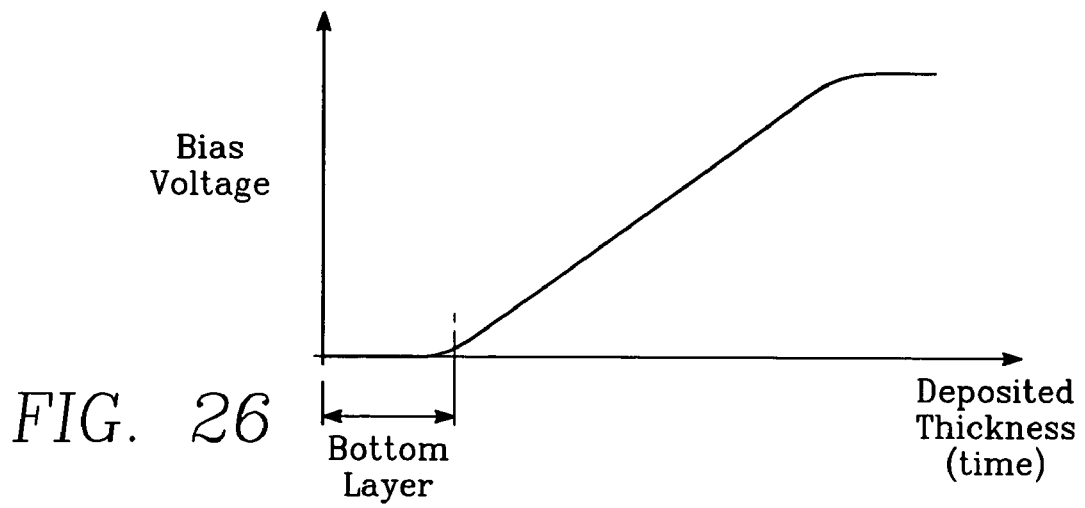
FIG. 26 is a graph of the RF wafer bias voltage as a function of time in the process of FIG. 24.
Figure 27:
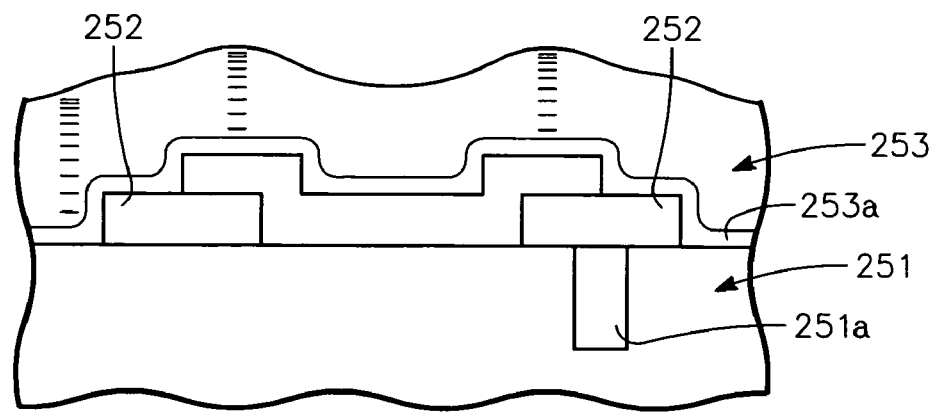
FIG. 27 is a cross-sectional view of a thin film structure formed by the process of FIG. 24.

The extinction coefficient or imaginary part of the index of refraction may be ramped without resorting to ion implantation of the absorption-enhancing species. For example, the concentration depth profile of the absorber-enhancing species added to the OAL during the CVD deposition step may be ramped. This is done by modifying the process of FIG. 20 to include a step in which the proportion of the absorber-enhancing species added in the step of block 216 is ramped or stepped over time during the CVD deposition step. Alternatively, certain process parameters (e.g., bias power) may be ramped or stepped over time during the CVD deposition step. These modifications are depicted in FIG. 24, in which the CVD deposition process of block 210 concludes with either one (or both) of two steps. The first step (block 261 of FIG. 24) is to ramp over time the gas flow rate into the chamber of the absorption-enhancing gas precursor species (e.g., B2H6) during the CVD deposition step of block 210. The other step (block 262 of FIG. 24) is to ramp over time certain process parameters (such as bias power or voltage) during the CVD deposition step of block 210. Ramping of the bias power or voltage will create a ramped depth distribution of compressive stress and therefore of density in the OAL 253. The density affects the absorption and therefore ramping the bias voltage will tend ramp the absorption characteristic of the OAL as a function of depth within the OAL. FIG. 25 is a graph illustrating how the fraction of the absorption-enhancing species precursor gas in the process gas is ramped upwardly over time (or CVD layer thickness), starting at a minimum thickness T of the bottom OAL layer. FIG. 26 is a graph illustrating how the wafer bias voltage may be increased over time during the CVD deposition process of block 210. The bias voltage is not applied until a minimum layer thickness T has been reached. This latter feature has two advantages. First, unintended implantation of impurities into the underlying semiconductor layer is avoided by removing wafer bias voltage at the beginning of deposition when the underlying layer is exposed and unprotected. Secondly, lack of bias voltage on the bottom OAL layer minimizes stress at the OAL/wafer interface, which may help the bond across this interface and can avoid leaving a history of stress on the underlying layer after removal of the OAL. FIG. 27 depicts an elevational view of the OAL 253 and the underlying layers 251, 252. The OAL 253 includes a pure and unstressed bottom layer 253a, and an upper portion having a compressive stress and an impurity concentration that increases with height.

Figure 28:
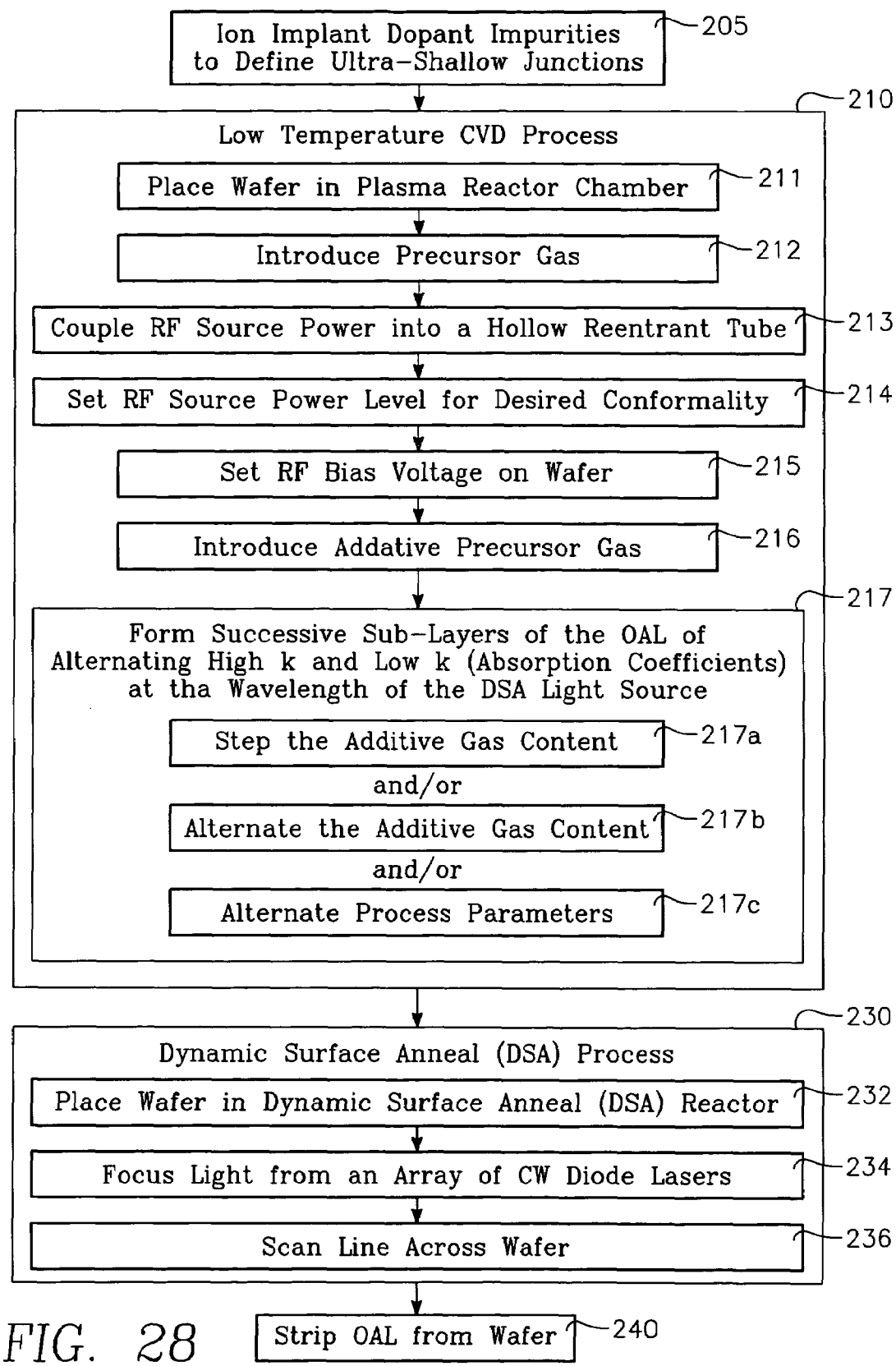
FIG. 28 is a block diagram of another alternative embodiment of the process of FIG. 20.

The process of FIG. 20 may be modified so as to enhance optical absorption by forming an antireflection coating within the OAL 253. This feature may be employed in combination with or in lieu of any of the foregoing absorption-enhancing process steps. This modification is illustrated in FIG. 28, in which the CVD process 210 concludes with the step of block 217 of forming successive sub-layers in the OAL of alternating high-k (opaque) and low-k (transparent) values. The term "k" refers to the extinction coefficient, the imaginary part of the index of refraction at the wavelength of the DSA light source (e.g., 810 nm). In FIG. 28, the OAL deposition step of block 210 includes the step of block 217 of forming successive sub-layers of the OAL of alternating high and low values of k at the wavelength of the DSA light source of FIGS. 1-8. This step may include any one of the following steps: (a) step (turn on and off) the absorption-enhancing additive gas flow to the chamber (block 217a of FIG. 28), (b) alternate the additive gas content between an absorption-enhancing additive gas species (e.g., a boron-containing gas) and a transparency-enhancing additive gas species (e.g., a fluorine-containing additive gas) (block 217b of FIG. 28), (c) alternate the CVD process parameters between values that promote formation of a high k-material and values that promote formation of a low-k material (block 217c of FIG. 28).

Figure 29A:
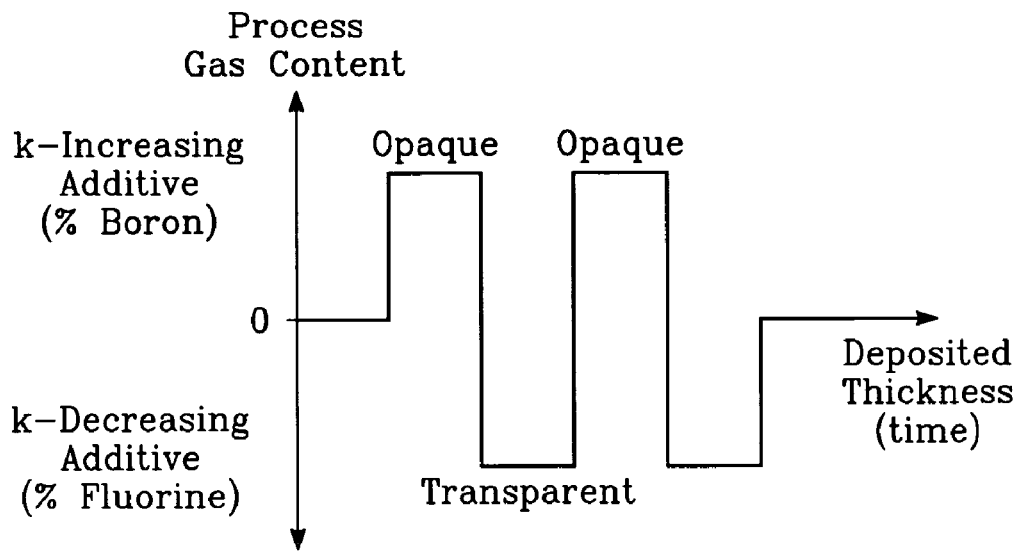
FIG. 29A is graph illustrating the proportion of two different additive gases as a function of time in the process of FIG. 24.
Figure 29B:
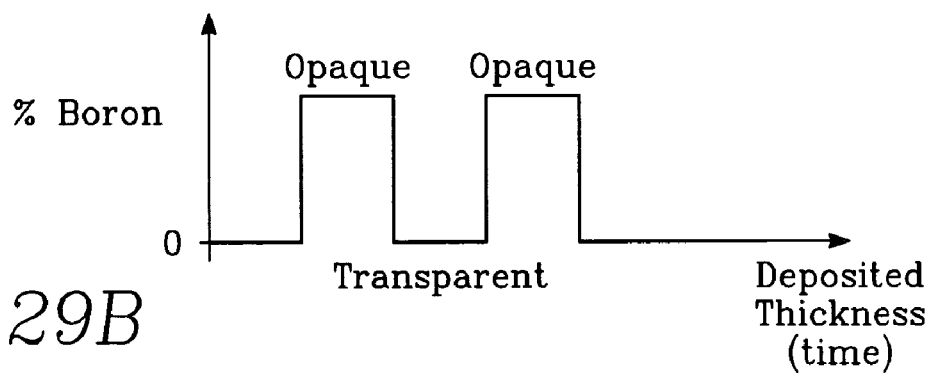
FIG. 29B is a graph illustrating the proportion of a single additive gas in another version of the process of FIG. 24.
Figure 29C:
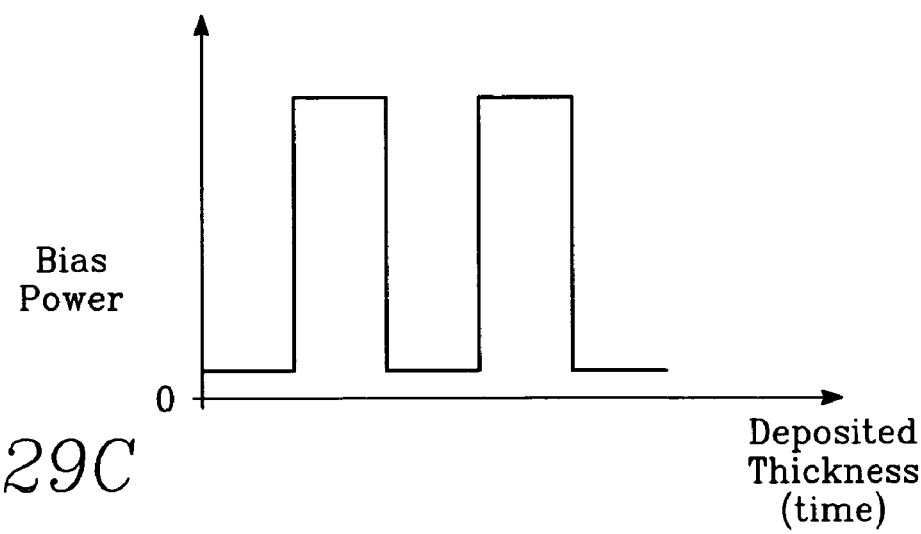
FIG. 29C illustrates the wafer RF bias power as a function of time in-yet another version of the process of FIG. 24.

FIG. 29A is a graph illustrating the (additive) absorption-enhancing species precursor gas fractional composition of the total process gas in the reactor chamber as a function of time, which is stepped or pulsed up and down over time in accordance with the step of block 217a of FIG. 28. This is done by pulsing the additive gas flow rate, with an "on" time duration that defines the thickness of the opaque layer(s) and an "off" time that defines the thickness of the less opaque (or nearly transparent) layer(s). The number of pulses determines the number of alternating opaque and non-opaque layers in the anti-reflection coating. Their optical thickness may generally correspond to a quarter wavelength of the DSA light source. FIG. 29B is a graph illustrating the additive gas fractional composition of the total process gas in the reactor chamber as a function of time, which alternates between an absorption-enhancing species precursor (e.g., a boron-containing gas) and a transparency-enhancing species precursor (e.g., a fluorine-containing gas) in accordance with the step of block 217b of FIG. 28. The on-time of the absorption-enhancing additive gas flow determines the thickness of the opaque layers of the anti-reflection section of the OAL, while the on-time of the transparency-enhancing additive gas flow determines the thickness of the transparent layers in the anti-reflection section of the OAL. FIG. 29C is a graph illustrating the value of a selected process parameter (such as RF bias power) affecting absorption of the deposited material as a function of time. In FIG. 29C, the process parameter value is pulsed between a low and a high value in accordance with the step of block 217c of FIG. 28. This step may be combined with the step of either block 217a or 217b. In the case of bias power, a high value produces more compressive stress in the deposited material, making it denser and thereby enhancing its absorption or extinction coefficient k, while the lower value forms a sub-layer with a smaller k. Other process parameters tending to affect optical absorption characteristics of the deposited material also may be pulsed in a similar manner to enhance the effect. Such additional process parameters may include chamber pressure, wafer temperature, source power, gas flow rate of the basic deposition material precursor gas (e.g., the carbon-containing gas in the case of an amorphous carbon OAL).

Figure 30:
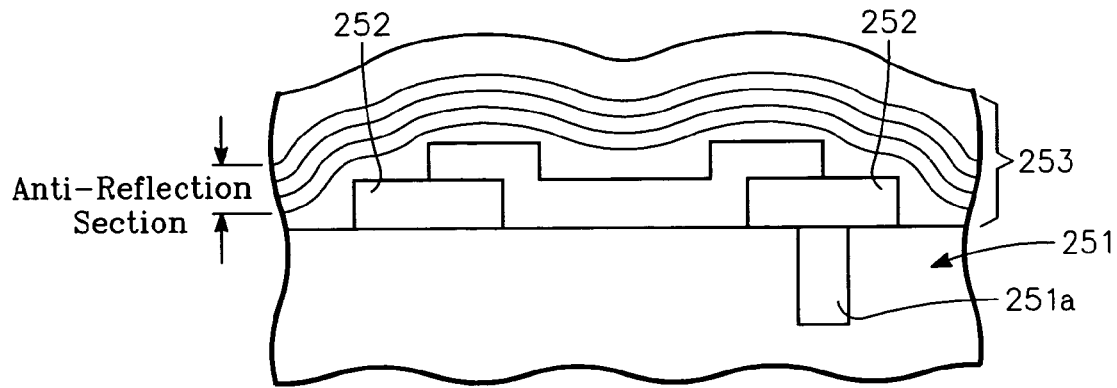
FIG. 30 depicts a thin film structure having a multi-layered deposited coating formed by the process of FIG. 24.

An OAL including an anti-reflection section formed by any of the foregoing steps is depicted in FIG. 30. The OAL, which may be an amorphous carbon layer, is formed over the wafer 251 and its thin film structure 252 by the low-temperature CVD process. The step of block 217 of FIG. 28 is carried out during at least a portion of the CVD process, so that a section 253a of the OAL 253 consists of alternating opaque and non-opaque layers 253a-1, 253a-2, 253a-3, 253a-4. If the alternating layers 253a-1 through 253a-4 are of the appropriate thickness (e.g., a quarter wavelength of the DSA light source), then the section 253 is an anti-reflection coating within the OAL. Alternatively, the anti-reflection section 253a, which is shown in FIG. 30 as an internal component of the OAL 253, may instead be a coating on the top of the remainder of the OAL 253.

While the foregoing examples concern an OAL in which the optical absorption is maximized, the low-temperature CVD process described above may be used to form an OAL or amorphous carbon layer having low optical absorption at the wavelength of the light source. This may be accomplished, for example, by refraining from including or adding boron or other absorption-enhancing impurities in the OAL. In the case of a pure amorphous carbon OAL, the low-temperature CVD process forms a relatively transparent layer at the wavelength (810 nm) of the GaAs diode laser array 32 of FIG. 3. If even greater transparency (or less opacity/absorption) is desired, then transparency-enhancing impurities (such as fluorine) may be added to the OAL either by including an appropriate precursor (e.g., fluorine-containing) gas in the CVD process or by a post-CVD ion implantation step.

Figure 31:
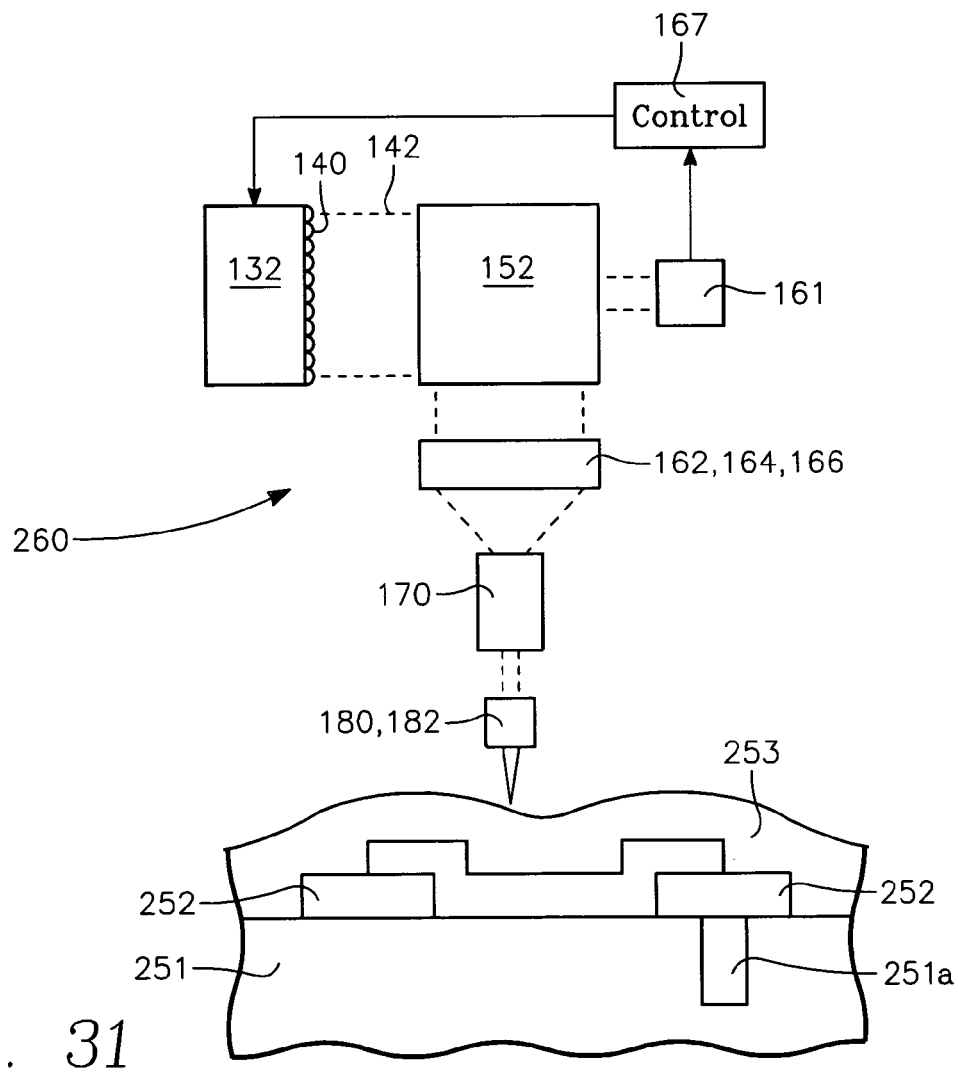
FIG. 31 illustrates an operation for annealing ultra-shallow junctions in the semiconductor wafer.

FIG. 31 depicts the semiconductor wafer 40 and DSA light source 260 (of FIGS. 1-8) performing the DSA process on the wafer to carry out the step of block 230 of any one of FIGS. 20, 21, 24 or 28. As shown in FIG. 31, the wafer 40 is coated with the OAL layer 253 that was deposited in the low-temperature CVD process described above. The OAL 253 has any one or many or all of the features described above, such as, for example, an amorphous carbon basic material and absorption-enhancing features such as absorption enhancing impurities introduced during CVD processing or during a post-CVD ion implantation process, an anti-reflection section or coating, and/or an enhanced density. The DSA light source of FIG. 31 includes the array of laser bars 132, the array of micro-lenslets 140, an optional interleaver 142, an optional polarization multiplexer 152, a series of lenses 162, 164, 166, a homogenizing light pipe 170 and the fast axis focusing optics 180, 182, and a pyrometer 161, all described earlier with reference to FIGS. 1-8. The view of FIG. 31 is along the light source fast axis. The beam moves relative to the wafer 40 along the light source slow axis (transverse or perpendicular to the fast axis).

Figure 32:
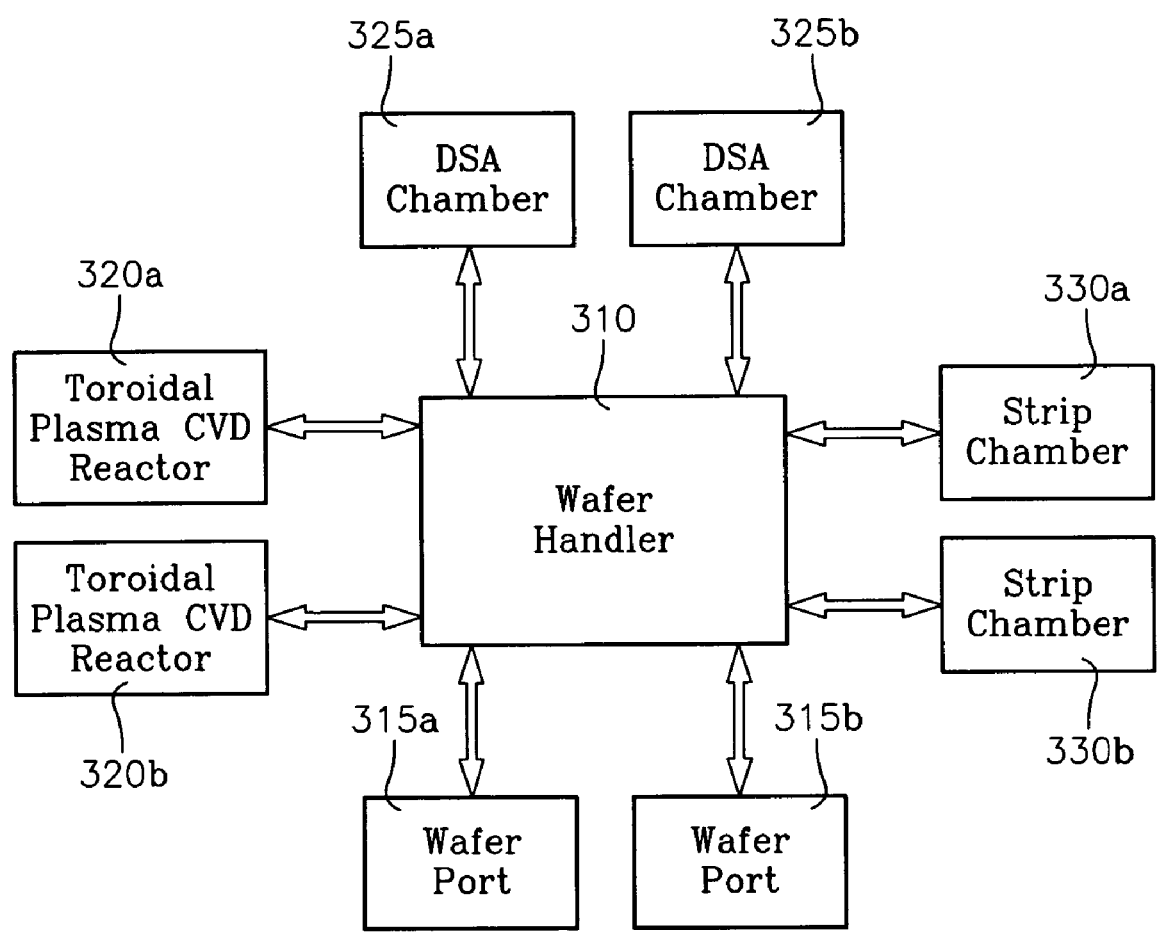
FIG. 32 illustrates an integrated system for treating a wafer in accordance with the invention.
Figure 33:
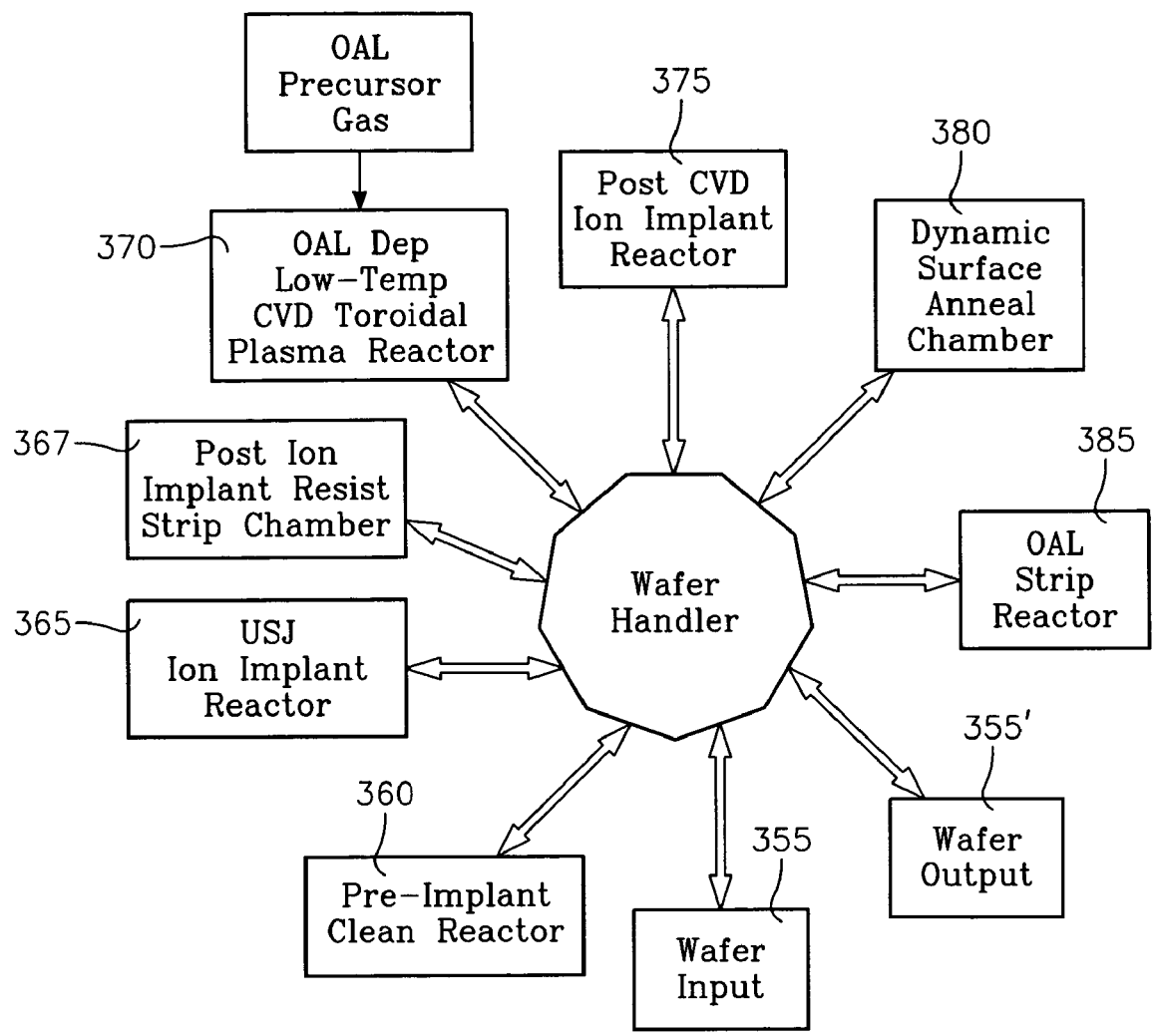
FIG. 33 illustrates an integrated system for performing all the steps entailed in forming ultra-shallow junctions in the surface of a wafer.

FIG. 32 illustrates one embodiment of an integrated system for annealing semiconductor junctions (ultra shallow junctions) in the wafer. The integrated system of FIG. 32 is in a "twin" configuration on a single platform having a common wafer handling robot or mechanism 310 on which pairs of different tools are integrated. Specifically, the robot wafer handler 310 interfaces with a pair of input/output wafer ports 315a, 315b, a pair of toroidal plasma source low-temperature CVD reactor chambers 320a, 320b of the type described above with reference to FIG. 9, a pair of DSA chambers 325a, 325b each including a complete light source of the type described above with reference to FIGS. 1-8, and a pair of optical absorber layer strip chambers 330a, 330b. FIG. 33 illustrates another embodiment of an integrated system for forming and annealing semiconductor junctions and which is capable of performing all the steps and processes described above with reference to FIGS. 20-29. The integrated system of FIG. 33 has a wafer handler 350 with wafer input/output ports or factory interfaces 355, 355'. The following tools or reactor chambers are coupled to the wafer handler 350: a pre-ion implant wafer cleaning chamber 360, an ultra-shallow junction dopant ion implantation reactor 365, a post-ion implant resist strip chamber 367, a toroidal plasma source reactor 370 of the type illustrated in FIG. 9 for carrying out the low-temperature CVD formation of the optical absorber layer, a post-CVD ion implantation reactor 375 for implanting optical absorption-enhancing impurities or additives into the OAL deposited on the wafer in the reactor 370, a DSA chamber 380 that includes the DSA light source 260 of FIG. 31, and an OAL strip chamber 385 for performing a post-DSA OAL removal process. A wet clean chamber may be used after the post-ion implant resist strip chamber 367 or the OAL strip chamber 385.

The pre-implant wafer cleaning reactor 360 may be a conventional cleaning reactor, but may be another toroidal source plasma reactor of the type illustrated in FIG. 9 in which cleaning gases (e.g., hydrogen-containing or oxygen-containing or fluorine-containing gases or nitrogen-containing gases, or an inert gas such as helium, neon, argon or xenon) are introduced while a plasma is generated. The dopant ion implantation reactor 365 may be a conventional ion beam implanter or may be a P3i reactor. Such a P3i reactor may be a toroidal source reactor of the type illustrated in FIG. 9 for carrying out P3i junction formation processes discussed earlier in this specification with reference to the published application by Hiroji Hanawa et al. referred to earlier herein. The post-CVD ion implantation reactor 375 may be a conventional ion beam implanter or may be a P3i reactor. Such a P3i reactor may be a toroidal source reactor of the type illustrated in FIG. 9 for carrying out P3i processes discussed earlier in this specification with reference to the published application by Hiroji Hanawa et al., referred to earlier herein. In this case, however, the implanted species is an optical absorption-enhancing species precursor gas, such as a boron-containing gas, for example.

The OAL strip reactor 385 may be a conventional reactor for removing the OAL material from the wafer. If the OAL is amorphous carbon, then the strip chamber 385 employs oxygen and/or nitrogen gas and may heat the wafer and/or bias the wafer to expedite the removal process. However, the OAL strip reactor 385 may be a toroidal plasma source reactor of the type illustrated in FIG. 9, in which oxygen and/or nitrogen-containing gas, hydrogen-containing gas, or fluorine-containing gas is introduced and a plasma is generated with plasma source power. The wafer may also be heated (with heated wafer chuck or plasma-heated) and/or be biased to improve removal of the OAL or amorphous carbon layer. For example, in a toroidal plasma source strip reactor, the wafer is placed on a heated electrostatic chuck at a temperature of 250 degree C. In the first step, a gas mixture of O2, H2, N2 and NF3 flows into a toroidal plasma source reactor. RF toroidal source power of 2 kW is applied to each of 2 toroidal plasma sources. RF bias voltage of 500V is applied to the electrostatic chuck. After partially stripping the amorphous carbon layer, in the second step, a gas mixture of O2, H2, N2 flows into the toroidal plasma source reactor. RF toroidal source power of 1 kW is applied to each of 2 toroidal plasma sources. RF bias voltage of 50V is applied to the electrostatic chuck. The second step is carried out until the amorphous carbon layer has been removed. Optionally, an optical emission line endpoint signal corresponding to the presence or absence of carbon (or of the underlying material) in the plasma may be monitored and may optionally trigger the strip process to end. For example, an emission line of excited CO may be used to indicate the presence of a carbon by-product in the plasma. When the CO emission line signal disappears, the carbon layer has been removed. The strip process described above for removing the OAL layer may also be employed as a chamber cleaning process in the OAL deposition reactor (the reactor employed to deposit the carbon OAL layer) to remove carbon and other materials deposited on chamber surfaces after the wafer has been removed or before the wafer is introduced into the chamber. More generally, for a toroidal plasma reactor used to deposit any carbon-containing layer (whether or not it has certain optical or electrical characteristics), the above-described two-step carbon strip process may be employed as a chamber cleaning process before wafer introduction or after wafer removal from the chamber. For example, this carbon strip process may be employed as the chamber cleaning step of block 6141 of FIG. 19 described above.

PROCESS EXAMPLES

The following is a partial list of carbon precursors for the optical absorber layer deposition:

|  | C | H |  |
|---|---|---|---|
| Methane | 1 | 4 |  |
| Acetylene | 2 | 2 |  |
| Ethylene | 2 | 4 |  |
| Ethane | 2 | 6 |  |
| Propylene | 3 | 6 |  |
| Propane | 3 | 8 |  |
| Ethyl acetylene | 4 | 6 | 1-BUTYNE |
| 1,3-butadiene | 4 | 6 |  |
| 1-butene | 4 | 8 |  |
| n-butane | 4 | 10 |  |
| Pentane | 5 | 12 |  |
| Hexane | 6 | 14 |  |

-continued

|  | C | H |  |
|---|---|---|---|
| Toluene | 7 | 8 | Methyl benzene ($C_6H_5CH_3$) |

Other precursors such as fluorocarbons may be used but tend to have poorer absorption (i.e., extinction coefficient or imaginary part of the complex refractive index) at the wavelength of radiation of the laser light beam as compared with hydrocarbons. Fluorocarbons may therefore be useful where it is desired to deposit a layer, or a portion of a layer, that is more transparent or less absorbing/opaque. Preferred fluorocarbon gases are C4F6 or C3F6. Other fluorocarbon gases include C2F4, C2F6, C3F8, C4F8 and C5F8. Impurity examples to further enhance optical properties are B2H6, BF3, B5H9, PH3, PF3, AsH3, AsF5, SiH4, SiF4, GeH4, GeF4, with the hydrides generally providing better absorption than the dopant-fluorides. In one example, on a 300 mm silicon wafer, C3H6 is used as a C-precursor gas at a flow rate of 600 sccm, with B-precursor B2H6 at a flow rate of 20 sccm, H2 at 180 sccm, and dilution gas Ar 200 sccm at a process chamber pressure of 15 mtorr. RF toroidal source power of 2 KW (at frequency of approximately 12-14 MHz) for each of two reentrant tubes in a crossed-toroidal configuration is applied. RF bias voltage (at frequency of 1-3 MHz) is ramped up to 7 KV peak-to-peak from zero after several seconds, requiring about 8 KW RF bias power. The electrostatic wafer chuck is maintained in a range −20 to +40 C, and the wafer temperature is about 80 degrees to 140 degrees C.). For a 1-minute process time, film thickness is about 0.25 micron and "k" value is about 0.36 at laser wavelength of about 800 nm. Film thickness is linear with deposition time, yielding about 0.75 micron in 3 minutes. B-precursor B2H6 (max 10-20%) is commonly available diluted with H2, He, Ar or N2, as its high reactivity precludes availability at 100%. While the H2 or He dilution is most preferred, Ar or N2 dilution may also be used. Other boron precursors may also be used. Without boron, the above example conditions yield a film with a "k" value of about 0.18 at laser wavelength of about 800 nm. N2 may be added instead of boron: With N2 and without boron, the above example conditions yield a film with a "k" value of about 0.25 at laser wavelength of about 800 nm. If lower "k" value films are desired for some other applications, H2 may be added. With 200-400 sccm added H2 and without boron or N2, the above example conditions yield a film with a "k" value of about 0.04 at laser wavelength of about 800 nm. Alternatively or additionally, fluorine-containing gas may be added to yield a low "k" film.

Amorphous carbon films may be deposited with control of the "k" value (absorption or extinction coefficient or imaginary part of the complex refractive index) over a wide range, while providing good step coverage over topography, free of voids, and control of film stress to improve thermal properties and avoid cracking or peeling, even when subjected to laser annealing or conventional annealing. Chuck or wafer temperature may be lower to increase deposition rate without sacrificing "k" value or other film properties. Curing at 450 C for several seconds increases "k" value to about 0.36. The layer allows efficient absorption of the laser, allowing the doped-silicon to be activated while the integrity of the absorber layer is maintained. The wafer surface may be taken to the melting temperature without failure of the absorber layer. Then after anneal, the absorber layer may be stripped and cleaned in a conventional manner (as photoresist strip/clean process). Alternatively, the strip process may also be carried out back in the same or a different plasma chamber having the above-described toroidal plasma source, using oxygen or oxygen/nitrogen mixtures.

The deposition process may be multi-step (as discussed above with reference to FIGS. 24 and 28). In the above example of the foregoing paragraph, the boron-precursor may be deliberately delayed in introduction until after an initial boron-free layer is deposition, to avoid potentially doping the wafer. A delay of 3 seconds, for example, yields a boron-free layer thickness of about 100-150 angstroms. The bias voltage may be deliberately delayed in introduction until after an initial source-power-only deposition process. The can be used to prevent implantation of deposition precursors into the wafer surface. These may be used separately or together. In one embodiment, boron-precursor introduction and bias-voltage-on are delayed 3 seconds, then boron-precursor is added, then after an additional 3 second delay, bias voltage is ramped up or stepped on. This reduces probability of deposited or implanted boron or carbon. Alternatively, N2 is added (instead of boron) after an initial delay of 3 seconds, bias-voltage is stepped on after an additional 3 second delay. In yet another embodiment, N2 is added (instead of boron) after an initial delay of 3 seconds, bias-voltage is stepped on after an additional 3 second delay, then after 60 seconds, boron-precursor is turned on (with or without N2) for the remainder of the process. In the low temperature toroidal plasma CVD process for depositing the amorphous carbon film as an optical absorber at some wavelength of interest (e.g., 810 nm), there is a synergistic benefit of adding (1) boron (i.e., B2H6) plus (2) N2 or other form of nitrogen to the basic amorphous carbon precursor hydrocarbon gas (i.e., C3H6). Thermal stability of the deposited carbon layer is improved at 450 degrees C. and especially higher temperatures. Specifically, the deposited amorphous carbon layer may be laser heated to or above melting point of silicon without delamination of the deposited layer, or peeling, etc. This feature actually reduces the threshold wafer voltage or threshold ion energy typically required to avoid delamination or peeling. The foregoing feature of combining boron and nitrogen additives in the hydrocarbon gas may be employed when depositing an optically-absorbing amorphous carbon layer, and may also be employed for depositing a carbon layer that is not an optical absorber. In another example, on a 300 mm silicon wafer, Ar is introduced by itself at a flow rate of 800 sccm and pressure of 30 mtorr to initiate the plasma with the application of RF toroidal source power of 1 KW (at frequency of approximately 12-14 MHz) for each of two reentrant tubes in a crossed-toroidal configuration. Following the plasma initiation step, the throttle valve is adjusted to reduce the chamber pressure to 15 mtorr and this is maintained through the remainder of the deposition process. Then, the Ar flow is reduced to 200 sccm and C3H6 is introduced as a C-precursor gas at a flow rate of 600 sccm, and the toroidal source power level is increased to 2 kW per tube for a period of 3 seconds to deposit an initial interface layer. (Toroidal source power level is maintained at 2 kW per tube for the remainder of the deposition process.) Then N2 is introduced at a flow rate of 333 sccm and RF bias voltage (at frequency of 1-3 MHz) is ramped up to 7 KV peak-to-peak from zero or a low initial value after several seconds, requiring about 8 KW RF bias power. After about 40 seconds, B2H6 is introduced at a flow rate of 20 sccm with a hydrogen dilution gas at a flow rate of 180 sccm and the N2 flow is (optionally) discontinued. This step is carried out for 140 seconds. During the entire run, the electrostatic wafer chuck is maintained in a range −20 to +40 C, and the wafer temperature is about 80 degrees to 140 degrees C.). For the approximately 3-minute total process time, film thickness is about 0.75 micron and "k" value is about 0.36 at laser wavelength of about 800 nm. The film has excellent thermal stability and conformality, and has minimum implantation damage of the underlying wafer surface. And, it is strippable (with or without anneal) in either the toroidal strip chamber previously described earlier, or in a conventional downstream radical strip process chamber at a wafer temperature of 250 degrees C., using a mixture of nitrogen and oxygen with less that 10% CF4. The CF4 or alternative fluorine source may be stopped after the initial top boron-containing layer has been stripped (fluorine or alternatively hydrogen helps remove the boron), after which conventional nitrogen and oxygen are effective in removing the remaining film thickness with minimum damage to the underlying wafer surface.

Copper Annealing:

The invention may be employed to solve problems in copper conductor deposition in high aspect ratio openings. Such problems include poor vertical sidewall coverage within the high aspect ratio opening.

A first problem can arise in the deposition of the TaN/Ta barrier layer prior to copper deposition, in which the barrier layer coverage inside the high aspect ratio opening sidewall is uneven. The top corner edge of the metal (Ta) portion of the barrier layer is susceptible to being sputtered during its plasma deposition, taking material away from the top corner edge and depositing it on a facing surface of the sidewall, forming a neck protrusion on the sidewall which can restrict deposition below the neck protrusion in the bottom of the opening to very thin coverage. This first problem is solved by annealing the metal (Ta) portion of the barrier layer using the dynamic surface anneal (DSA) laser light source of FIGS. 1-8. Such an anneal step causes the metal (Ta) material on the high aspect ratio opening sidewall to reflow, thereby at least nearly eliminating non-uniformities such as the sidewall neck protrusion of Ta material and supplementing thin Ta deposition below the neck protrusion. Surface tension during the reflow process tends to force the Ta material to redistribute itself more uniformly over the sidewall surface.

A second problem, similar to the first problem, arises during deposition of the copper seed layer over the barrier layer in the high aspect ratio opening, in which the copper seed layer coverage inside the high aspect ratio opening sidewall is uneven. The top corner edge of the copper seed layer is susceptible to being sputtered during its plasma deposition, taking copper material away from the top corner edge and depositing it on a facing surface of the sidewall, forming a copper neck protrusion on the sidewall which can restrict copper deposition below the neck protrusion in the bottom of the opening to very thin coverage. This second problem is solved by annealing the copper seed layer using the dynamic surface anneal (DSA) laser light source of FIGS. 1-8. Such an anneal step causes the copper material on the high aspect ratio opening sidewall to reflow, thereby at least eliminating non-uniformities such as the sidewall neck protrusion of copper and supplementing the thin copper deposition below the neck protrusion. Surface tension during the reflow process tends to force the copper material to redistribute itself more uniformly over the sidewall surface, producing a much more uniform copper seed layer.

A third problem is that the electroplated copper conductor layer that fills the remainder of the high aspect ratio opening tends to have an extremely wide variation in copper crystal grain size throughout its bulk, which can grain sizes as small as 5 nm and as large as 200 nm. Such a large variation in grain size within the copper conductor layer gives rise to a number of problems including agglomeration of voids and additives collecting at grain boundaries. Such problems can cause copper electromigration during current flow through the copper conductor, which tends to break down the copper conductor. This problem is solved by annealing the electroplated copper conductor layer using an amorphous carbon absorber layer deposited by the toroidal source CVD process including features described above with reference to FIGS. 9-19 and an optical anneal step such as one employing the DSA laser light source of FIGS. 1-8. A chemical mechanical polishing step to form copper conductor damascene structures may or may not preceed deposition of amorphous carbon layer deposition. An anneal process renders the grain size distribution very narrow and centered at about 100 nm for via line widths on the order of 100 nm, for example. Such uniform grain size throughout the electroplated copper conductor layer solves the copper electromigration problem by maintaining the current density within the cross-sections of copper metal interconnect lines to below electromigration failure threshold current densities.

Figure 34A:
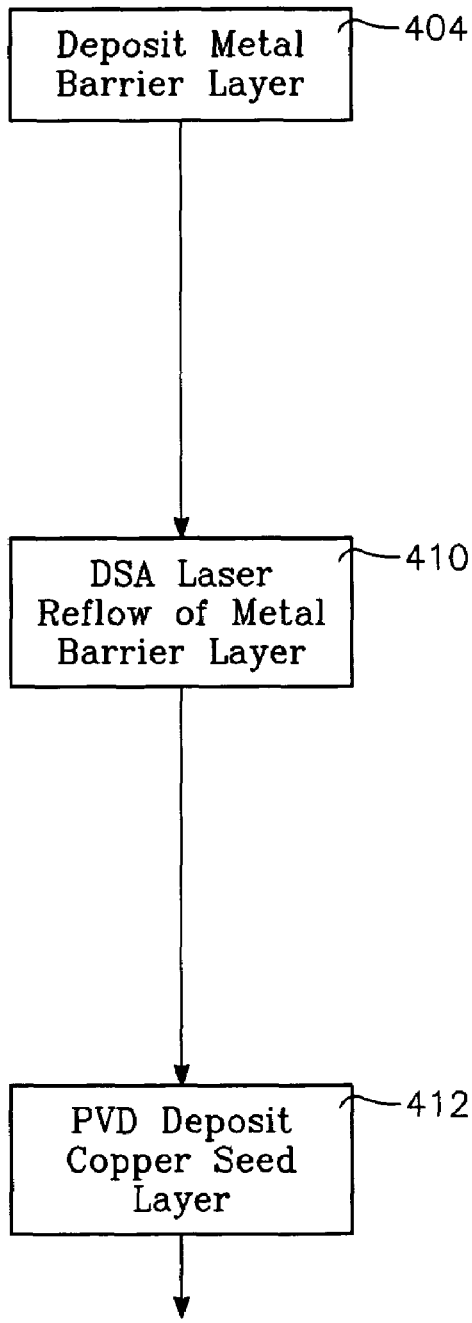
FIGS. 34A through 34C depict a process flow for forming barrier, seed and copper conductor layers on a semiconductor thin film structure.
Figure 35A:
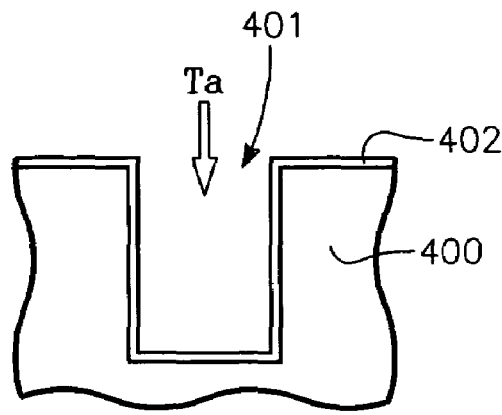
FIGS. 35A through 35I illustrate successive changes in the thin film structure during the process of FIGS. 34A through 34C.
Figure 35B:
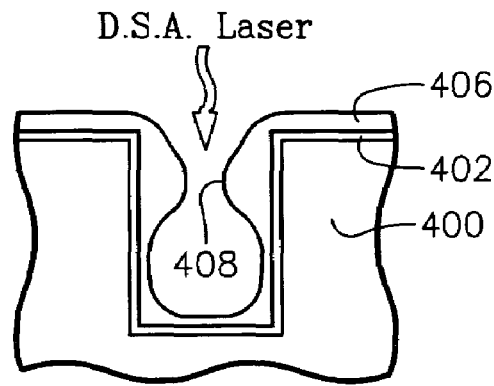
Figure 35C:
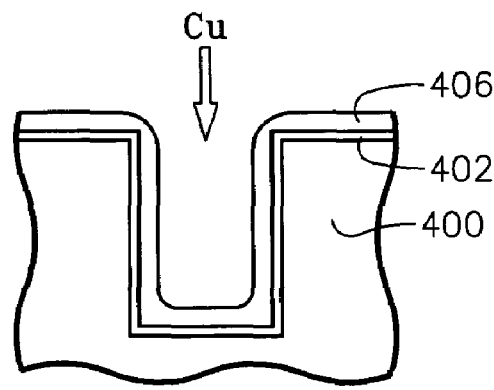
Figure 34B:
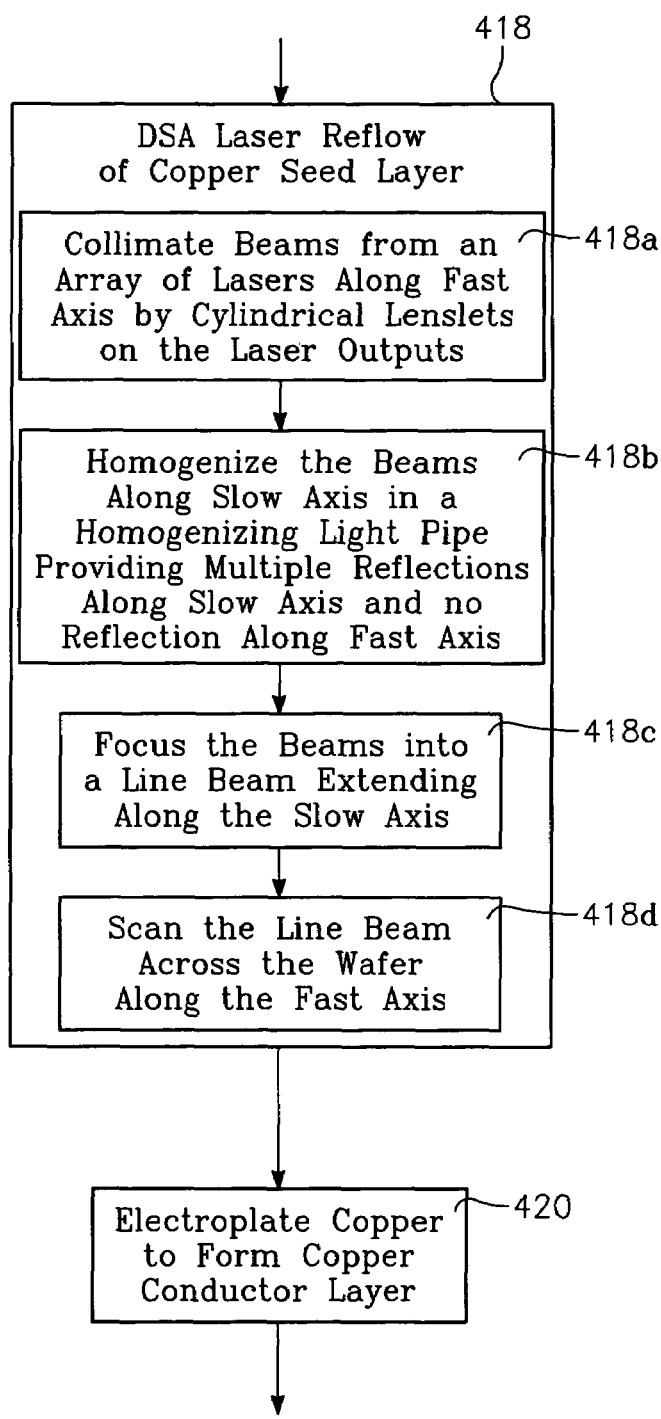
Figure 34C:
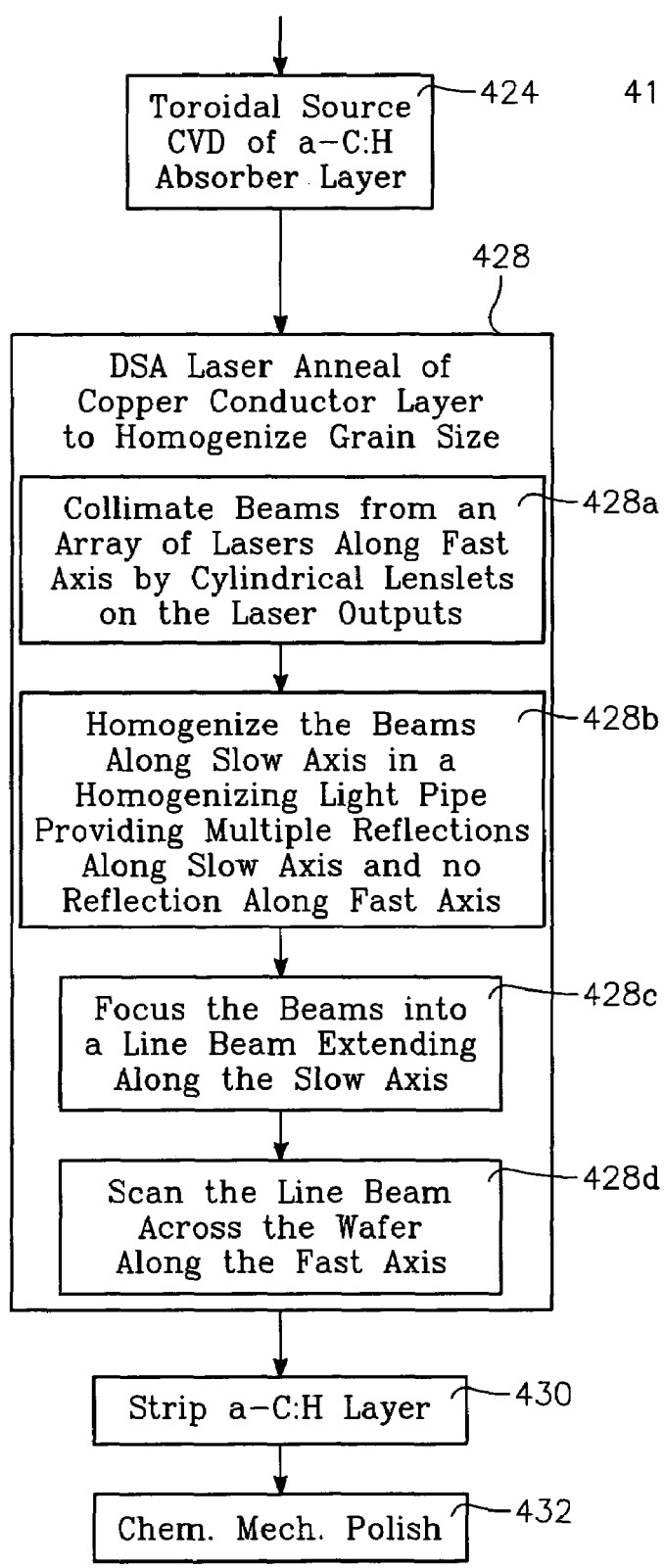

FIGS. 34A, 34B, 34C represent a block flow diagram of a process for forming a barrier layer, a copper seed layer and a copper bulk conductor layer in accordance with different aspects of the invention. The process of FIGS. 34A-34C begins with the thin film structure illustrated in FIG. 35A in which a dielectric layer 400 has a narrow aspect ratio opening 401 formed in it (such as a via) over which a dielectric (TaN) portion 402 of a barrier layer has been deposited. A metal (Ta) deposition step (block 404 of FIG. 34A) is carried out to form an upper metallic portion 406 (shown in FIG. 35B) of the barrier layer. Together, the TaN lower portion 402 and the Ta upper portion 406 form a complete barrier layer capable of preventing copper migration into the dielectric layer 400. Sputtering characteristic of the plasma enhanced physical vapor deposition process of the step of block 404 removes material from the top corner edge of the Ta metal layer 406 (rendering it relatively thin) and transports that material to the facing portion of the sidewall of the opening 401 to form a neck protrusion 408. The protrusion 408 cuts off Ta deposition on the sidewall portion below it, rendering Ta coverage near the bottom of the opening 401 relatively thin. This highly non-uniform distribution of Ta thickness is transformed to a uniform thickness by an anneal step employing an optical source such as the DSA light source of FIGS. 1-8 (block 410 of FIG. 34A). The anneal step of block 410 heats the Ta layer 406 to the melting point of tantalum, enabling the Ta material in the Ta layer 406 to reflow to a more even distribution of thickness, thereby reducing or eliminating the protrusion 408 and increasing the thickness of the bottom portion of the layer 406, as illustrated in FIG. 35C.

In an alternative embodiment, the optical anneal step of block 410 includes a preliminary step of first depositing an amorphous carbon-containing optical absorber layer. For this purpose, an amorphous carbon absorber layer is first deposited over the Ta metal layer 406. This is accomplished by carrying out the toroidal source chemical vapor deposition process of FIG. 10 using the toroidal plasma source reactor of FIG. 9. This step forms an amorphous carbon optical absorber layer over the Ta metal layer 406. The optical and mechanical properties of the optical absorber layer may be adjusted as described above with reference to FIGS. 11-28.

Figure 35D:
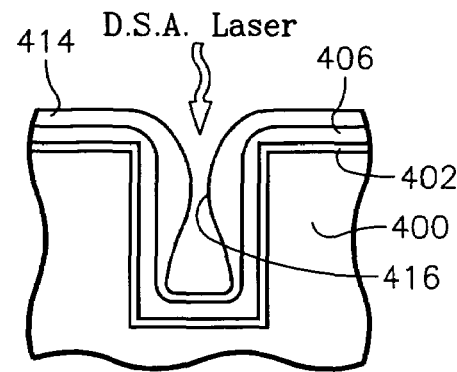
Figure 35E:
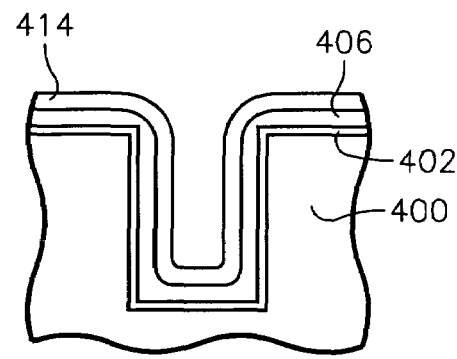

The next step (block 412 of FIG. 34A) is to deposit copper, preferably in a plasma enhanced physical vapor deposition process, to form a copper seed layer 414 shown in FIG. 35D. Sputtering characteristic of the plasma enhance PVD process creates a neck protrusion 416 in the copper seed layer. This problem is solved by carrying out an anneal step (block 418 of FIG. 34B) employing an optical source such as the DSA laser light source of FIGS. 1-8 to heat the copper seed layer 414 to the melting point of copper (e.g., about 1082 degrees C.). The copper material of the seed layer 414 reflows during this step, thereby eliminating the copper neck protrusion 416 and forming a more uniformly thick copper seed layer, as illustrated in FIG. 35E.

In an alternative embodiment, the optical anneal step of block 418 includes a preliminary step of first depositing an amorphous carbon-containing optical absorber layer. For this purpose, an amorphous carbon absorber layer is first deposited over the copper seed layer 414. This is accomplished by carrying out the toroidal source chemical vapor deposition process of FIG. 10 using the toroidal plasma source reactor of FIG. 9. This step forms an amorphous carbon optical absorber layer over the copper seed layer 414. The optical and mechanical properties of the optical absorber layer may be adjusted as described above with reference to FIGS. 11-28.

In using the DSA laser light source of FIGS. 1-8, the step of block 418 is carried out as follows. A plurality (e.g., 14) parallel laser bars 134 each consisting of plural (e.g., 49) laser emitter arranged linearly (FIG. 4) are aligned along the slow axis of the scanning apparatus of FIG. 1. Preferably, the lasers are CW lasers, such as GaAs lasers, for example. Light from the laser bars 134 is collimated along the fast scan axis of the apparatus of FIG. 1 by cylindrical lenslets 140 resting (or bonded) on the respective laser bars 134 (block 418a of FIG. 34B). The fast-axis collimated beams from the cylindrical lenslets 140 are then homogenized along the slow axis in the light pipe homogenizer 170 of FIG. 5 providing multiple reflections along the slow axis and no reflections along the fast axis (block 418b of FIG. 34B). The light beam output from the homogenizer 170 is then focused into a thin straight line extending along the slow axis (block 418c of FIG. 34B). This line beam is scanned across the wafer in the direction of the fast axis (block 418d of FIG. 34).

Figure 35F:
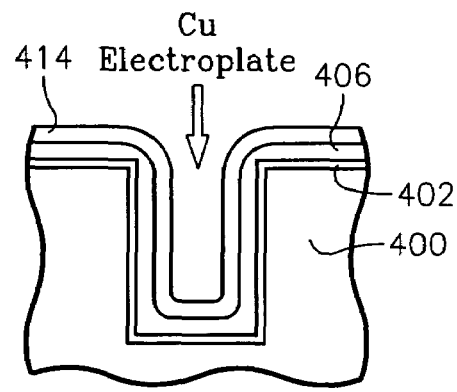
Figure 35G:
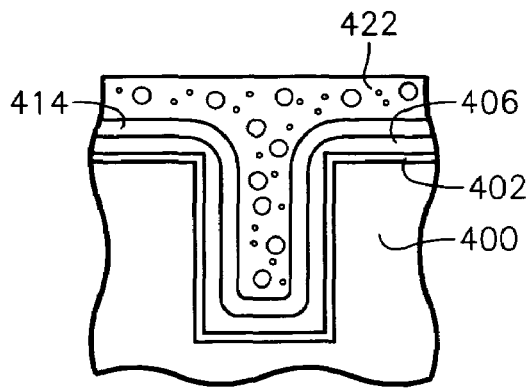
Figure 35H:
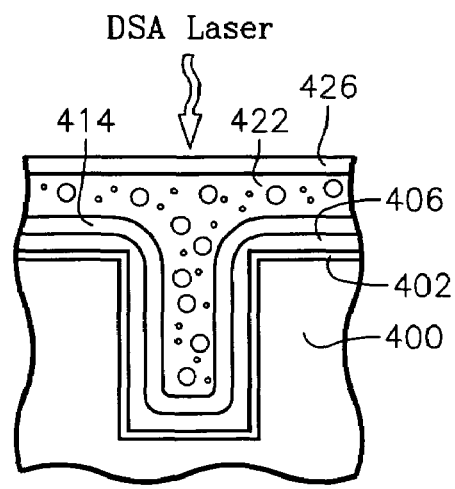

The next step in the process for forming a copper conductor is illustrated in FIG. 35F and consists of depositing copper over the copper seed layer to fill the via 401 (block 420 of FIG. 34B). This step may be carried out by electroplating copper. The result is illustrated in FIG. 35G, in which the electroplating step has formed a bulk copper layer 422 that fills the portion of the via 401 above the seed layer 414. As indicated symbolically in FIG. 35G, the copper layer 422 consists of crystalline copper grains having a wide range of grain sizes, extending from 5 nm for the smallest grains to 200 nm for the largest grains. As described above, such a wide disparity in grain size leads to electromigration in the copper conductor layer 422. This problem is solved by optically annealing the copper layer 422 using an amorphous carbon absorber layer. Heat from the annealing step briefly raises the material close to its melting temperature (1070 degrees C.), causing the structure of the copper layer 422 to reform into one consisting of uniformly sized copper grains. For this purpose, an amorphous carbon absorber layer is first deposited over the copper layer 422 of FIG. 35G (block 424 of FIG. 34C). This is accomplished by carrying out the toroidal source chemical vapor deposition process of FIG. 10 using the toroidal plasma source reactor of FIG. 9. This step forms an amorphous carbon optical absorber layer 426 over the copper conductor layer 422, as illustrated in FIG. 35H. The optical and mechanical properties of the optical absorber layer 426 may be adjusted as described above with reference to FIGS. 11-28. An optical anneal step (block 428 of FIG. 34C) is then performed. This step may be carried out in the same manner as the optical anneal step of block 418 described above by using the DSA laser light source of FIGS. 1-8. In such a case, the optical anneal step of block 428 is carried out by the following steps:

A plurality (e.g., 14) parallel laser bars 134 each consisting of plural (e.g., 49) laser emitter arranged linearly (FIG. 4) are aligned along the slow axis of the scanning apparatus of FIG. 1. Preferably, the lasers are CW lasers, such as GaAs lasers, for example. Light from the laser bars 134 is collimated along the fast scan axis of the apparatus of FIG. 1 by cylindrical lenslets 140 resting (or bonded) on the respective laser bars 134 (block 428a of FIG. 34C). The fast-axis collimated beams from the cylindrical lenslets 140 are then homogenized along the slow axis in the light pipe homogenizer 170 of FIG. 5 providing multiple reflections along the slow axis and no reflections along the fast axis (block 428b of FIG. 34C). The light beam output from the homogenizer 170 is then focused into a thin straight line extending along the slow axis (block 428c of FIG. 34C). This line beam is scanned across the wafer in the direction of the fast axis (block 428d of FIG. 34C).

Figure 35I:
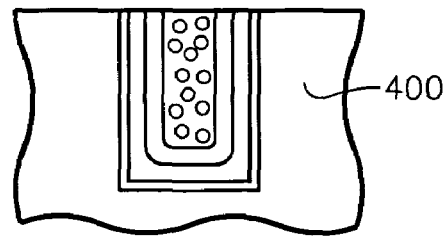

Following the optical annealing of the copper layer 422, the amorphous carbon optical absorber layer 426 is stripped (block 430 of FIG. 34C), preferably employing the optical absorber layer strip processes described above in this specification. Then, the wafer is chemically mechanically polished (block 432 of FIG. 34C) to produce the planar structure depicted in FIG. 35I.

Figure 37A:
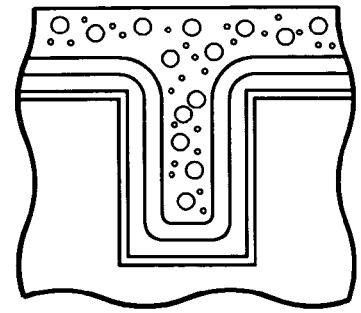
FIGS. 37A through 37E illustrate successive changes in the thin film structure during the process of FIG. 36.
Figure 37B:
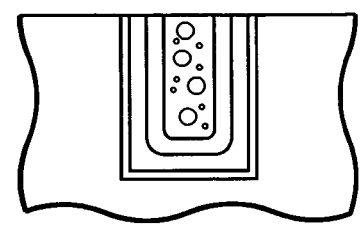
Figure 37C:
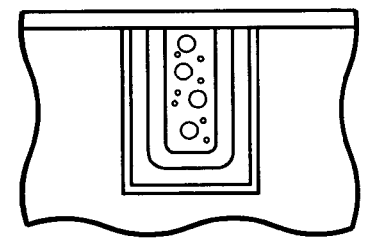
Figure 37D:
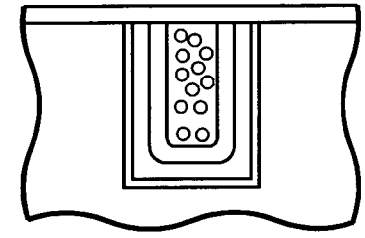
Figure 37E:
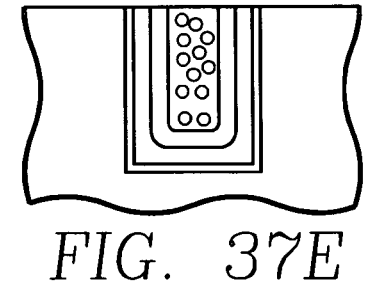
Figure 36:
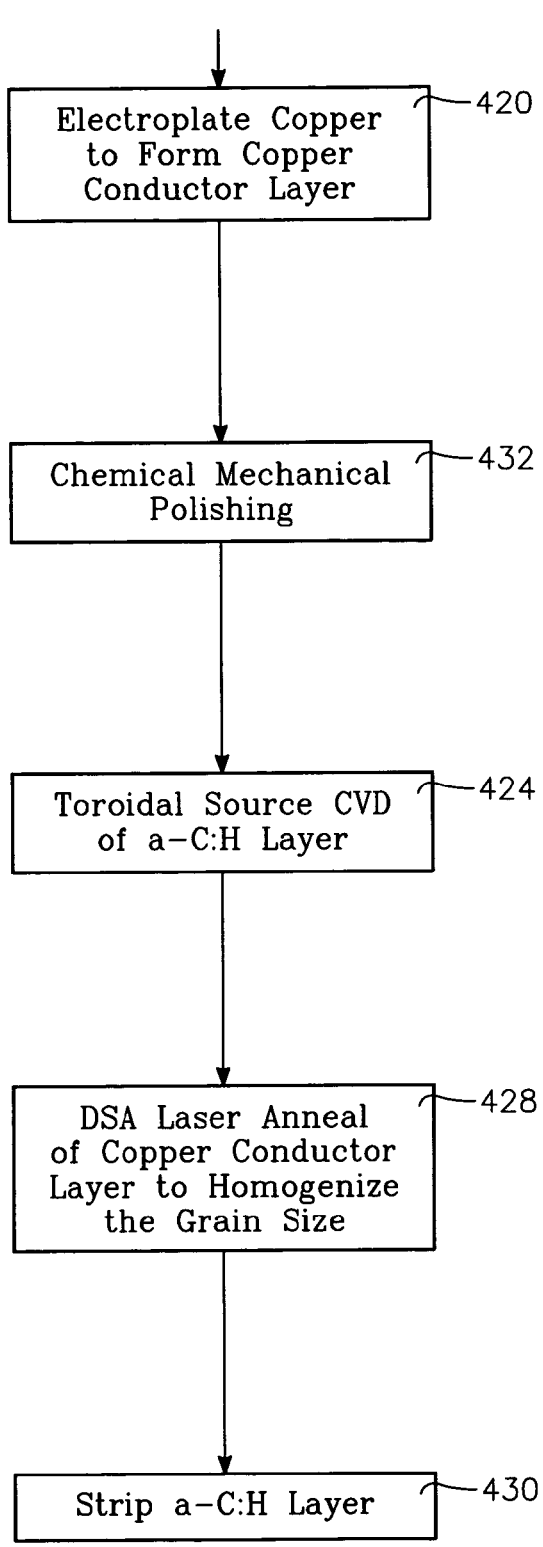
FIG. 36 depicts an alternate process for forming the copper conductor layer.

Referring to FIG. 36, the chemical mechanical polishing step of block 432 may be performed immediately after the copper electroplating step of block 420 and before the amorphous carbon optical absorber layer deposition step of block 424. In this case, the chemical mechanical polishing step of block 432 transforms the structure of FIG. 37A, having a copper layer and a barrier layer extending above the top of the via 401, to the planar structure illustrated in FIG. 37B. The amorphous carbon layer formed in the step of block 424 lies on a planar surface, as shown in FIG. 37C. The optical anneal step of block 428 transforms the grain structure of the copper material as indicated in FIG. 37D. The carbon layer removal step of block 430 produces the exposed conductor structure of FIG. 37E and removal chemistry is chosen so as not to damage the exposed copper surface.

Laser-Writable Carbon Mask:

Features for controlling the optical characteristic of the amorphous carbon layer have been described earlier in this specification with reference to FIGS. 14-19, for example. Such features can be exploited to produce an optically writable amorphous carbon mask to control the exposure of photoresist or to control exposure of a wafer to light in an optical annealing step.

Figure 38B:
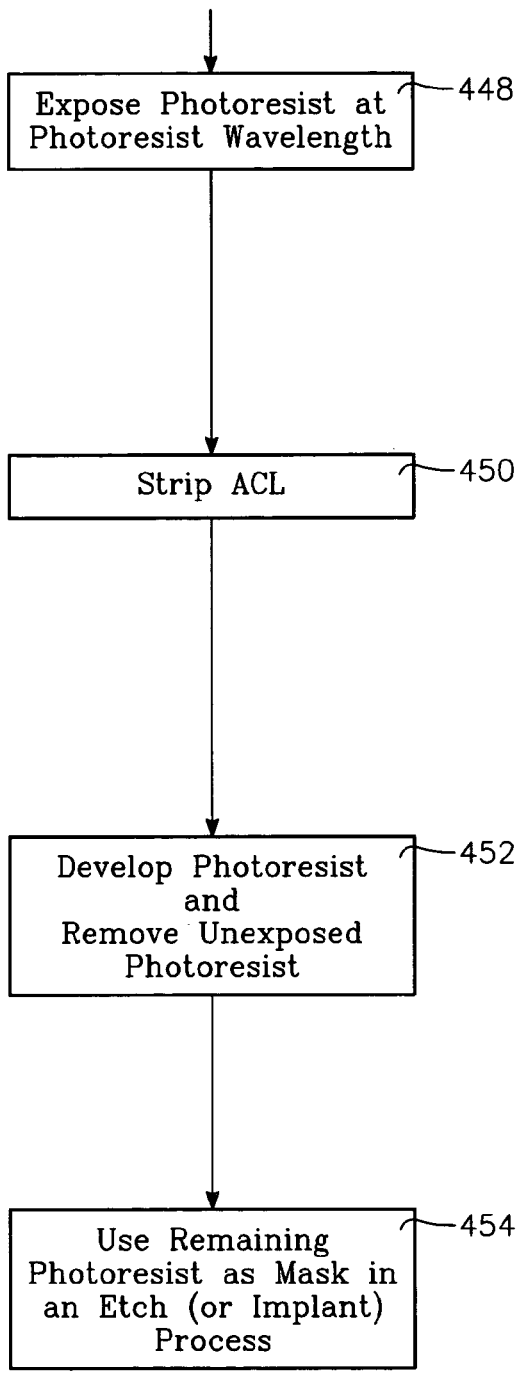

FIGS. 38A and 38B represent a process sequence for exploiting an optically writable amorphous carbon mask over photoresist. A thin film structure 436 is depicted in FIG. 39A having an underlayer 436a and an overlayer 436b which is to be etched in accordance with a desired pattern.

The overlayer 436b may be polysilicon, metal or a dielectric material, for example. A photoresist layer 438 is deposited on the overlayer 436b as shown in FIG. 39B (block 440 of FIG. 38A). A toroidal plasma chemical vapor deposition process of the type described above with reference to FIG. 10 is carried out (block 442 of FIG. 38B) to deposit an amorphous carbon layer 444 (FIG. 39C) of the desired optical properties. For example, the carbon layer 444 may be transparent, requiring the use of fluorine in the deposition process, for example.

Figure 39D:
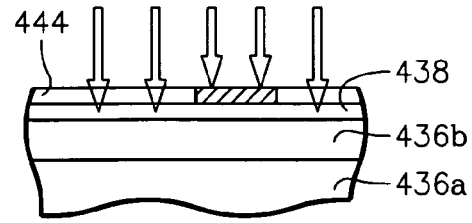
Figure 39E:
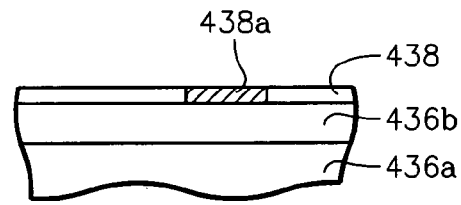
Figure 39F:
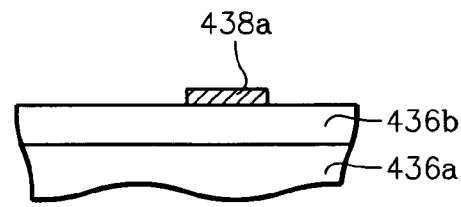
Figure 39G:
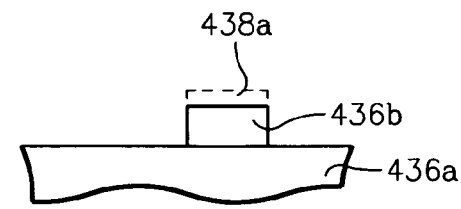

An optical pattern is written into the carbon layer using, for example, a laser beam (block 446 of FIG. 38A). The wavelength and/or power of the laser is such that the amorphous carbon layer 444 responds by turning opaque in those regions illuminated by the laser beam, as indicated in FIG. 39C. The wavelength may, for example, be 810 nm, depending upon the species (hydrogen, fluorine, boron, etc.) included in the chemical vapor deposition of the carbon layer 444 and species added to the carbon layer 444. In one embodiment, the laser beam is raster-scanned in accordance with a desired photomask pattern. This transforms the amorphous carbon layer 444 into a photomask. Then the thin film structure of FIG. 39C is exposed to light of a wavelength (e.g., U.V.) at which the photoresist is sensitive (block 448 of FIG. 38B). As indicated in FIG. 39D, the opaque regions in the carbon layer 444 block the light from the photoresist 438, while the transparent regions of the carbon layer 444 admit light to the photoresist. The amorphous carbon layer is stripped (block 450 of FIG. 38B) to produce the thin film structure of FIG. 39E. The photoresist layer 438 includes a region 438a that was not exposed to the U.V. light. The photoresist 438 is treated with a developer chemical and a solvent (block 452 of FIG. 38B) which selectively removes the exposed regions of the photoresist leaving only unexposed region 438a in the case of negative photoresist in the present example, as illustrated in FIG. 39F. (Alternatively, positive photoresist may be employed to obtain the opposite result.) The structure of FIG. 39F is then subject to an etch process (block 454 of FIG. 38B) in which the photoresist region 438a masks a portion of the overlayer 436b from the etchant, resulting in the thin film structure of FIG. 39G. The resist 438a is then removed, completing the process.

A laser-writable amorphous carbon mask may be employed to define selective exposure of different regions of a thin film structure or semiconductor layer to light in an optical annealing process such as rapid thermal processing anneal. This facilitates selective annealing in which only selected areas of a semiconductor wafer or thin film layer are annealed at a particular time. The first step (block 460 of FIG. 40) is to perform the toroidal plasma source CVD process of FIG. 10 to deposit a transparent amorphous carbon layer 462 on an underlayer or semiconductor base 464 depicted in FIG. 41A. In a preferred embodiment, the amorphous carbon layer contains species other than carbon (e.g., fluorine, hydrogen, and the like) in proportions that render the amorphous carbon layer transparent. As described earlier in this specification, such species may be included in the amorphous carbon layer because they constituted a part of the process gas for the plasma CVD process or by post CVD ion implantation. Then, a laser beam is raster-scanned across the amorphous carbon layer 462 (block 466 of FIG. 40). The wavelength and/or power of the laser beam is such that those portions of the amorphous carbon layer exposed to the beam are transformed from transparent to opaque material, as indicated in FIG. 41B. The wavelength may be 810 nm, for example, depending upon the composition of the amorphous carbon layer. This step transforms the amorphous carbon layer into an optical mask bearing the pattern established by the raster-scanning of the laser beam. The wafer is then optically annealed (block 468). If, for example, the optical anneal process is a rapid thermal process (RTP), then high intensity lamps are employed. As depicted in FIG. 41C, the light heats only those regions of the underlayer 464 underlying transparent regions of the carbon mask 462, the remaining areas being shield by absorption of the light in the opaque regions of the carbon mask 464. The carbon mask is then removed (block 470 of FIG. 40) to complete the process, leaving a selectively annealed layer having defined or discrete annealed zones as indicated in FIG. 41D.

Amorphous Carbon Hardmask for Trench or Gate Etch:

The toroidal plasma CVD processes of FIGS. 10-19 may be employed to form an amorphous carbon hardmask for etching processes for forming high aspect ratio openings (a via or a trench) or for defining a feature such as a polysilicon or metal conductor or gate. FIGS. 42A and 42B depict the steps in a process for etching a high aspect ratio opening using an amorphous carbon hardmask formed in the toroidal plasma source CVD process. First the toroidal plasma source CVD process of the type discussed above with reference FIGS. 10-19 is employed to deposit an amorphous carbon layer (block 474 of FIG. 42A). This forms the thin film structure of FIG. 43A consisting of a base layer (such as crystalline silicon) 476. This step produces the thin film structure of FIG. 43A that includes an underlayer 478 and an overlying amorphous carbon film 480. An anti-reflection coating 482 (FIG. 43B) is deposited over the amorphous carbon layer 476 (block 484 of FIG. 42A). A photoresist layer 486 (FIG. 43C) is deposited over the anti-reflection coating 482 (block 488 of FIG. 42A). A photo mask 490 having a desired pattern is placed over the photoresist 486 and the photoresist is exposed (e.g., to U.V. light) as depicted in FIG. 43D (block 492 of FIG. 42A). The photo mask 490 is removed and the photoresist is developed, resulting in the removal of the exposed photoresist (block 494 of FIG. 42A) as depicted in FIG. 43E. The anti-reflective coating 482 is then etched using the resist as an etch mask and the resist is then removed by ashing (block 496 of FIG. 42B). This produces the thin film structure of FIG. 43F in which the anti-reflection coating 482 is patterned after the resist that was previously removed. The amorphous carbon layer is then etched using the patterned anti-reflection coating 482 as the mask (block 498 of FIG. 42B) to produce the thin film structure of FIG. 43G in which the carbon layer 480 carries the pattern of the original photo mask 486 as indicated in FIG. 43G. This step removes the anti-reflection coating 482. Finally, the underlayer 478 is etched using the carbon layer 480 as the mask (block 500 of FIG. 42B) to form the high aspect ratio openings aligned with the openings in the carbon mask 480 depicted in FIG. 43H.

A similar process illustrated in FIGS. 44A and 44B may be applied to photolithographically define a feature deposited on an underlayer, such as a polysilicon conductor line deposited on a dielectric layer or a polysilicon or metal gate electrode deposited on a thin gate oxide layer. Referring to FIG. 45A, an overlying layer 505, such as a conductor material consisting or aluminum or polysilicon for example, is deposited on an underlayer 510, such as a dielectric material consisting of silicon dioxide for example (block 515 of FIG. 44A). Then, a toroidal plasma CVD process of the type described above with reference to FIG. 10, is performed to deposit an amorphous carbon layer 520 over the conductor layer 510 as depicted in FIG. 45B (block 525 of FIG. 44A). The amorphous carbon layer preferably has a composition that renders it less susceptible to etchants that tend to etch the conductive overlayer 505. For example, the amorphous carbon layer 520 may contain hydrogen so that the amorphous carbon material may be a hydrocarbon. Other suitable additive species may be included or added to the amorphous carbon layer 520 during the deposition process or immediately afterward, as described above in this specification. An anti-reflection coating 530 and an overlying photoresist layer 535 depicted in FIG. 45C are deposited over the amorphous carbon layer 520 (blocks 540 and 545 of FIG. 44A). As depicted in FIG. 45D, a circuit pattern is printed on the photoresist 535 using a photomask or reticle 550, which is exposed to light of a wavelength (e.g., U.V) at which the photoresist is responsive (block 555 of FIG. 44A). The resist is developed (block 560 of FIG. 44B) which removes the unexposed portions of the resist as depicted in FIG. 4E. The anti-reflection coating 530 is etched with the photoresist layer 535 acting as an etch mask, and the resist layer 535 is removed (block 565 of FIG. 44B), as depicted in FIG. 45F. The amorphous carbon layer 520 is etched with the anti-reflection coating acting as an etch mask (block 570 of FIG. 44B). The etchant employed in this step is preferably selective for amorphous carbon and is non-selective to the material of the anti-reflection coating. This step removes the anti-reflection coating and leaves a pattern of amorphous carbon corresponding to the original photoresist pattern, as depicted in FIG. 45G. This step transforms the amorphous carbon layer 520 into a hardmask. The deposited conductor layer 505 is then etched with the amorphous carbon layer 520 acting as an etch mask (block 575 of FIG. 44B). This last step forms a pattern in the deposited conductor layer 505 replicating the pattern of the original photoresist, as indicated in FIG. 45H.

While the invention has been described in detail by specific reference to preferred embodiments, it is understood that variations and modifications thereof may be made without departing from the true spirit and scope of the invention.

What is claimed is:

1. A method of forming a conductor in a thin film structure on a semiconductor substrate, said method comprising:

forming high aspect ratio openings in a base layer having vertical side walls;

depositing a dielectric barrier layer comprising a dielectric compound of a barrier metal on the surfaces of said high aspect ratio openings including said vertical side walls;

depositing a metal barrier layer comprising said barrier metal on said first barrier layer;

depositing a main conductor species seed layer on on the metal barrier layer;

depositing a main conductor layer; and annealing said main conductor layer by:

(a) directing light from an array of continuous wave lasers into a line of light extending at least partially across said thin film structure, (b) translating said line of light relative to said thin film structure in a direction transverse to said line of light.

2. The method of claim 1 further comprising, prior to the annealing step, depositing an amorphous carbon optical absorber layer on said main conductor layer.

3. The method of claim 2 wherein the step of depositing an amorphous carbon optical absorber layer comprises:

introducing a carbon-containing process gas into a reactor chamber containing said substrate in a process zone of the reactor;

applying RF source power to an external reentrant conduit of the reactor to generate a reentrant toroidal RF plasma current passing through said process zone; and applying a bias voltage to the substrate.

4. The method of claim 2 further comprising, prior to the step of depositing the amorphous carbon optical absorber layer, chemical mechanical polishing a top surface of the main conductor layer.

5. The method of claim 1 wherein said barrier metal comprises tantalum nitride and said main conductor species comprises copper.

6. The method of claim 1 wherein the step of annealing said main conductor layer comprises heating at least a surface portion of said main conductor layer to the melting temperature of copper.

7. The method of claim 1 wherein the step of depositing a main conductor layer forms metallic grains having a wide grain size variation of about an order of magnitude, and wherein the step of annealing the main conductor layer reduces the grain size variation so that grain size in the main conductor layer is generally uniform at a single grain size.

8. The method of claim 7 wherein said grain size variation is reduced in the annealing step from an initial range of about 2 nm to 200 nm to a generally uniform grain size of about 100 nm.

9. The method of claim 1 wherein:
said line of light lies parallel to a slow axis and the step of translating said line of light translates the line of light along a fast axis;
the step of directing light from an array of continuous wave lasers comprises:
(a) collimating light along said fast axis from respective rows of said laser at respective cylindrical lenslets on respective rows of lasers,
(b) homogenizing light along said slow axis from the respective cylindrical lenslets in a homogenizing light pipe providing plural reflections along said slow axis and minimal or no reflections along said fast axis.

10. The method of claim 1 further comprising:
depositing a metal seed layer of a main conductor metal species over said metal barrier layer;
reflowing said metal seed layer by:
(a) directing light from an array of continuous wave lasers into a line of light extending at least partially across said thin film structure,
(b) translating said line of light relative to said thin film structure in a direction transverse to said line of light.

11. The method of claim 3 wherein the step of introducing the carbon-containing process gas comprises introducing the process gas through a gas distribution plate overlying the workpiece and underlying the external portion of the reentrant path.

12. The method of claim 3 wherein said process gas comprises a hydrogen-carbon chemical species.

13. The method of claim 3 further comprising setting conductivity of the carbon layer between insulative and semiconductive by at least one of:

(1) adjusting the ion bombardment energy at the wafer surface,
(2) adjusting the workpiece temperature,
(3) selecting the hydrogen-carbon gas species of the process gas in accordance with a hydrogen-carbon ratio of the gas,
(4) diluting the process gas with hydrogen,
(5) diluting the process gas with an inert gas such as helium, neon, argon or xenon,
(6) adjusting the flux of energetic ions at the wafer surface relative to the flux of carbon-containing radical species to the wafer surface,
(7) adding to the process gas a precursor additive gas of one of: (a) a semi-conductivity-enhancing species, (b) a resistivity-enhancing species;
(8) implanting in the deposited carbon layer one of: (a) a semiconductivity-enhancing species, (b) a resistivity-enhancing species.

14. The method of claim 3 further comprising setting the transparency or opacity of the carbon layer by at least one of:
(1) adjusting the ion bombardment energy at the wafer surface,
(2) adjusting the workpiece temperature,
(3) selecting the hydrogen-carbon gas species of the process gas in accordance with a hydrogen-carbon ratio of the gas,
(4) diluting the process gas with hydrogen,
(5) diluting the process gas with an inert gas such as helium, neon, argon or xenon,
(6) adjusting the flux of energetic ions at the wafer surface relative to the flux of carbon-containing radical species to the wafer surface,
(7) adding to the process gas a precursor additive gas of one of: (a) an absorption-enhancing species, (b) a transparency-enhancing species;
(8) implanting in the deposited carbon layer one of: (a) an absorption-enhancing species, (b) a transparency-enhancing species.

15. The method of claim 14 wherein the absorption-enhancing species is one of boron, nitrogen, sulfur.

16. The method of claim 14 wherein the transparency-enhancing species is fluorine.

17. The method of claim 3 further comprising enhancing the adhesion of the deposited carbon layer to the underlying workpiece by setting the bias power or bias voltage to a sufficiently high level.

18. The method of claim 3 further comprising setting stress within the deposited carbon layer to one of compressive stress and tensile stress by adjusting the bias power or bias voltage.

19. The method of claim 3 further comprising increasing compressive stress in the deposited carbon layer by increasing said bias power or bias voltage.

20. The method of claim 3 further comprising controlling the conformality of the deposited carbon layer by setting the level of said RF plasma source power.

* * * * *